(12) United States Patent
Nakagawa et al.

(10) Patent No.: US 10,680,577 B2
(45) Date of Patent: Jun. 9, 2020

(54) ACOUSTIC WAVE DEVICE, MULTIPLEXER, HIGH-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventors: Ryo Nakagawa, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/561,244

(22) Filed: Sep. 5, 2019

(65) Prior Publication Data

US 2020/0007109 A1    Jan. 2, 2020

Related U.S. Application Data

(63) Continuation of application No. PCT/JP2018/008913, filed on Mar. 8, 2018.

(30) Foreign Application Priority Data

Mar. 9, 2017   (JP) .................. 2017-044689

(51) Int. Cl.
*H03H 9/02* (2006.01)
*H03F 3/20* (2006.01)
(Continued)

(52) U.S. Cl.
CPC .......... *H03H 9/02818* (2013.01); *H03F 3/20* (2013.01); *H03H 9/02559* (2013.01);
(Continued)

(58) Field of Classification Search
CPC .......... H03H 9/02818; H03H 9/02559; H03H 9/145; H03H 9/25; H03H 9/64; H03F 3/20; H03F 2200/451; H04B 1/04; H04B 2001/0408

See application file for complete search history.

(56) References Cited

U.S. PATENT DOCUMENTS

| 4,449,107 | A | 5/1984 | Asai et al. |
| 7,213,314 | B2 * | 5/2007 | Abbott ............ H03H 3/08 29/25.35 |

(Continued)

FOREIGN PATENT DOCUMENTS

| JP | 58-56513 A | 4/1983 |
| JP | 2004-343359 A | 12/2004 |

(Continued)

OTHER PUBLICATIONS

Official Communication issued in International Patent Application No. PCT/JP2018/008913 dated Apr. 10, 2018.

*Primary Examiner* — Dinh T Le
(74) *Attorney, Agent, or Firm* — Keating & Bennett, LLP

(57) ABSTRACT

An acoustic wave device includes a silicon oxide film, a piezoelectric body made of lithium tantalate, and interdigital transducer electrodes stacked on a supporting substrate made of silicon, in which the values of the wave length-normalized film thickness and the Euler angle of the piezoelectric body made of lithium tantalate, the wave length-normalized film thickness of the silicon oxide film, the wave length-normalized film thickness of the interdigital transducer electrodes in terms of aluminum thickness, the propagation direction of the supporting substrate, and the wave length-normalized film thickness of the supporting substrate are set such that represented by Formula (1) for at least one of responses of first, second, and third higher-order modes is more than about −2.4, and $T_{Si} > 20$.

20 Claims, 15 Drawing Sheets

(51) Int. Cl.
  *H03H 9/145* (2006.01)
  *H03H 9/25* (2006.01)
  *H03H 9/64* (2006.01)
  *H04B 1/04* (2006.01)

(52) U.S. Cl.
  CPC .............. *H03H 9/145* (2013.01); *H03H 9/25* (2013.01); *H03H 9/64* (2013.01); *H04B 1/04* (2013.01); *H03F 2200/451* (2013.01); *H04B 2001/0408* (2013.01)

(56) References Cited

U.S. PATENT DOCUMENTS

| | | | | |
|---|---|---|---|---|
| 7,589,452 | B2 * | 9/2009 | Hauser | H03H 3/10 |
| | | | | 310/313 R |
| 8,436,510 | B2 * | 5/2013 | Yamane | H03H 9/0222 |
| | | | | 310/313 R |
| 2004/0226162 | A1 | 11/2004 | Miura et al. | |
| 2010/0182101 | A1 | 7/2010 | Suzuki | |
| 2013/0285768 | A1 | 10/2013 | Watanabe et al. | |
| 2013/0300519 | A1 | 11/2013 | Tamasaki et al. | |
| 2015/0280689 | A1 | 10/2015 | Nakamura et al. | |
| 2018/0102755 | A1 | 4/2018 | Takamine | |

FOREIGN PATENT DOCUMENTS

| | | |
|---|---|---|
| JP | 2010-187373 A | 8/2010 |
| JP | 2014-068123 A | 4/2014 |
| JP | 2015-073331 A | 4/2015 |
| JP | 2015-111845 A | 6/2015 |
| JP | 2015-188123 A | 10/2015 |
| WO | 2016/208236 A1 | 12/2016 |

* cited by examiner

ACOUSTIC WAVE DEVICE, MULTIPLEXER, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-044689 filed on Mar. 9, 2017 and is a Continuation Application of PCT Application No. PCT/JP2018/008913 filed on Mar. 8, 2018. The entire contents of each application are hereby incorporated herein by reference.

BACKGROUND OF THE INVENTION

1. Field of the Invention

The present invention relates to an acoustic wave device, a multiplexer, a high-frequency front-end circuit, and a communication apparatus including a piezoelectric body made of lithium tantalate that is stacked on or above a supporting substrate made of silicon.

2. Description of the Related Art

Multiplexers have been widely used in high-frequency front-end circuits of cellular phones and smartphones. For example, a multiplexer defining and functioning as a splitter described in Japanese Unexamined Patent Application Publication No. 2014-68123 includes two or more band pass filters for different frequencies. Each of the band pass filters is formed of a surface acoustic wave filter chip. The surface acoustic wave filter chip includes multiple surface acoustic wave resonators.

Japanese Unexamined Patent Application Publication No. 2010-187373 discloses an acoustic wave device in which an insulating film made of silicon dioxide and a piezoelectric substrate made of lithium tantalate are stacked on a supporting substrate made of silicon. The heat resistance is increased by bonding the support substrate and the insulating film on a silicon (111) surface.

In the multiplexer as described in Japanese Unexamined Patent Application Publication No. 2014-68123, multiple acoustic wave filters for different frequencies are commonly connected on an antenna terminal side.

The inventors of preferred embodiments of the present invention have discovered that in the case where a structure in which a piezoelectric body made of lithium tantalate is stacked directly or indirectly on a supporting substrate made of silicon is included, multiple higher-order modes appear at higher frequencies than a main mode used. In the case where such an acoustic wave resonator is used for an acoustic wave filter associated with a lower frequency in a multiplexer, ripples due to the higher-order modes of the acoustic wave filter may appear in the pass band of another acoustic wave filter associated with a higher frequency in the multiplexer. That is, when a higher-order mode of the acoustic wave filter associated with a lower frequency in the multiplexer is located in the pass band of another acoustic wave filter associated with a higher frequency in the multiplexer, ripples occur in the pass band. This deteriorates the filter characteristics of another acoustic wave filter.

SUMMARY OF THE INVENTION

Preferred embodiments of the present invention provide acoustic wave devices, multiplexers, high-frequency front-end circuits including multiplexers, and communication apparatus in which ripples due to a higher-order mode are less likely to occur in another acoustic wave filter.

The inventors of preferred embodiments of the present invention have discovered that, as described below, in an acoustic wave device including a piezoelectric body made of lithium tantalate stacked directly or indirectly on a supporting substrate made of silicon, first to third higher-order modes described below appear at higher frequencies than the main mode.

The acoustic wave devices according to preferred embodiments of the present invention reduce or prevent at least one higher-order mode among the first, second, and third higher-order modes.

An acoustic wave device according to a preferred embodiment of the present invention includes a supporting substrate made of silicon, a silicon oxide film stacked on the supporting substrate, a piezoelectric body stacked on the silicon oxide film, the piezoelectric body being made of lithium tantalate, and interdigital transducer electrodes disposed on a main surface of the piezoelectric body, in which a wave length determined by the pitch of electrode fingers of the interdigital transducer electrodes is denoted by λ, the wave length-normalized film thickness of the piezoelectric body is denoted by $T_{LT}$, the Euler angle θ of the piezoelectric body is denoted by $\theta_{LT}$, the wave length-normalized film thickness of the silicon oxide film is denoted by $T_S$, the wave length-normalized film thickness of the interdigital transducer electrodes of the interdigital transducer electrodes in terms of aluminum thickness is denoted by $T_E$, a propagation direction in the supporting substrate is denoted by $\psi_{Si}$, and the wave length-normalized film thickness of the supporting substrate is denoted by $T_{Si}$, $T_{LT}$, $\theta_{LT}$, $T_S$, $T_E$, and $\psi_{Si}$ are set such that $I_h$ represented by Formula (1) for at least one of responses of a first higher-order mode, a second higher-order mode, and a third higher-order mode is more than about −2.4, and $T_{Si}$>about 20.

$$I_h = a^{(2)}_{T_{LT}}((T_{LT} - c_{T_{LT}})^2 - b^{(2)}_{T_{LT}}) + \quad \text{Formula (1)}$$

$$a^{(1)}_{T_{LT}}(T_{LT} - c_{T_{LT}}) + a^{(2)}_{T_S}((T_S - c_{T_S})^2 - b^{(2)}_{T_S}) +$$

$$a^{(1)}_{T_S}(T_S - c_{T_S}) + a^{(4)}_{T_E}((T_E - c_{T_E})^4 - b^{(4)}_{T_E}) +$$

$$a^{(3)}_{T_E}((T_E - c_{T_E})^3 - b^{(3)}_{T_E}) + a^{(2)}_{T_E}((T_E - c_{T_E})^2 - b^{(2)}_{T_E}) +$$

$$a^{(1)}_{T_E}(T_E - c_{T_E}) + a^{(6)}_{\psi_{Si}}((\psi_{Si} - c_{\psi_{Si}})^6 - b^{(6)}_{\psi_{Si}}) +$$

$$a^{(5)}_{\psi_{Si}}((\psi_{Si} - c_{\psi_{Si}})^2 - b^{(5)}_{\psi_{Si}}) + a^{(4)}_{\psi_{Si}}((\psi_{Si} - c_{\psi_{Si}})^2 - b^{(4)}_{\psi_{Si}}) +$$

$$a^{(3)}_{\psi_{Si}}((\psi_{Si} - c_{\psi_{Si}})^3 - b^{(3)}_{\psi_{Si}}) + a^{(2)}_{\psi_{Si}}((\psi_{Si} - c_{\psi_{Si}})^2 - b^{(2)}_{\psi_{Si}}) +$$

$$a^{(1)}_{\psi_{Si}}(\psi_{Si} - c_{\psi_{Si}}) + a^{(2)}_{\theta_{LT}}((\theta_{LT} - c_{\theta_{LT}})^2 - b^{(2)}_{\theta_{LT}}) +$$

$$a^{(1)}_{\theta_{LT}}(\theta_{LT} - c_{\theta_{LT}}) + d_{T_{LT}T_S}(T_{LT} - c_{T_{LT}})(T_S - c_{T_S}) +$$

$$d_{T_{LT}T_E}(T_{LT} - c_{T_{LT}})(T_E - c_{T_E}) +$$

$$d_{T_{LT}\psi_{Si}}(T_{LT} - c_{T_{LT}})(\psi_{Si} - c_{\psi_{Si}}) +$$

$$d_{T_{LT}\theta_{LT}}(T_{LT} - c_{T_{LT}})(\theta_{LT} - c_{\theta_{LT}}) +$$

$$d_{T_S T_E}(T_S - c_{T_S})(T_E - c_{T_E}) +$$

$$d_{T_S \psi_{Si}}(T_S - c_{T_S})(\psi_{Si} - c_{\psi_{Si}}) +$$

$$d_{T_S \theta_{LT}}(T_S - c_{T_S})(\theta_{LT} - c_{\theta_{LT}}) +$$

$$d_{T_E \psi_{Si}}(T_E - c_{T_E})(\psi_{Si} - c_{\psi_{Si}}) +$$

$$d_{T_E \theta_{LT}}(T_E - c_{T_E})(\theta_{LT} - c_{\theta_{LT}}) +$$

$$d_{\psi_{Si} \theta_{LT}}(\psi_{Si} - c_{\psi_{Si}})(\theta_{LT} - c_{\theta_{LT}}) + e$$

Coefficients a, b, c, d, and e in Formula (1) are values presented in Tables 1 to 36 below in accordance with ranges of orientation of the supporting substrate either of (100), (110), or (111), the type of higher-order mode, the wave length-normalized film thickness of the silicon oxide film, the wave length-normalized film thickness of the piezoelectric body, and the propagation direction in the supporting substrate. In the case where the orientation of the supporting substrate is (100), $\psi_{Si}$ is the angle between the propagation direction of an acoustic wave when viewed from the main surface side of the piezoelectric body on which the interdigital transducer electrodes are disposed and the Miller indices of silicon represented by a crystal direction of [100] when viewed from the above-written main surface side. In the case where the orientation of the supporting substrate is (110), $\psi_{Si}$ is the angle between the propagation direction of an acoustic wave when viewed from the main surface side of the piezoelectric body on which the interdigital transducer electrodes are disposed and Miller indices of the silicon represented by crystal direction of [1-10] when viewed from the above-written main surface side. In the case where the orientation of the supporting substrate is (111), $\psi_{Si}$ is the angle between the propagation direction of an acoustic wave when viewed from the main surface side of the piezoelectric body on which the interdigital transducer electrodes are disposed and Miller indices of the silicon represented by crystal direction of [1-10] when viewed from the above-written main surface side.

TABLE 1

| | Si(100) First higher-order mode $0 < T_{LT} < 0.2$ $0 \le T_S < 0.2$ | |
|---|---|---|
| | $0.05 \le T_E < 0.25$ | $0.25 \le T_E \le 0.45$ |
| $a_{TLT}^{(2)}$ | 0 | 0 |
| $a_{TLT}^{(1)}$ | 0 | 0 |
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | −5.857231176 | −5.857231176 |
| $b_{TS}^{(2)}$ | 0 | 0 |
| $c_{TS}$ | 0.148 | 0.148 |
| $a_{TE}^{(4)}$ | 0 | 0 |
| $a_{TE}^{(3)}$ | 0 | 0 |
| $a_{TE}^{(2)}$ | −19.75255913 | −19.75255913 |
| $a_{TE}^{(1)}$ | −2.877583447 | −2.877583447 |
| $b_{TE}^{(4)}$ | 0 | 0 |
| $b_{TE}^{(3)}$ | 0 | 0 |
| $b_{TE}^{(2)}$ | 0.022736 | 0.022736 |
| $c_{TE}$ | 0.242 | 0.242 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.004788767 | 0.004788767 |
| $a_{\psi Si}^{(1)}$ | 0.024306207 | 0.024306207 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 81.81 | 81.81 |
| $c_{\psi Si}$ | 8.7 | 8.7 |
| $a_{\theta LT}^{(2)}$ | −0.008235936 | −0.008235936 |
| $a_{\theta LT}^{(1)}$ | −0.021048278 | −0.021048278 |
| $b_{\theta LT}^{(2)}$ | 65.16 | 65.16 |
| $c_{\theta LT}$ | −52.2 | −52.2 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.786852571 | −0.786852571 |
| $d_{TE\psi Si}$ | 0 | 0 |
| $d_{TE\theta LT}$ | −0.237034335 | −0.237034335 |

TABLE 1-continued

| | Si(100) First higher-order mode $0 < T_{LT} < 0.2$ $0 \le T_S < 0.2$ | |
|---|---|---|
| | $0.05 \le T_E < 0.25$ | $0.25 \le T_E \le 0.45$ |
| $d_{\psi Si\theta LT}$ | 0 | 0 |
| $e$ | −1.499248378 | −1.499248378 |

TABLE 2

| | Si(100) First higher-order mode $0.2 \le T_{LT} \le 3.5$ $0 \le T_S < 0.2$ | |
|---|---|---|
| | $0.05 \le T_E < 0.25$ | $0.25 \le T_E \le 0.45$ |
| $a_{TLT}^{(2)}$ | 0 | 125.5342427 |
| $a_{TLT}^{(1)}$ | −13.43961051 | −7.643409732 |
| $b_{TLT}^{(2)}$ | 0 | 0.006076558 |
| $c_{TLT}$ | 0.329807692 | 0.321186441 |
| $a_{TS}^{(2)}$ | 0 | 0 |
| $a_{TS}^{(1)}$ | −11.80744788 | −10.05306878 |
| $b_{TS}^{(2)}$ | 0 | 0 |
| $c_{TS}$ | 0.158653846 | 0.153389831 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | −7.595099843 |
| $b_{TE}^{(4)}$ | 0 | 0 |
| $b_{TE}^{(3)}$ | 0 | 0 |
| $b_{TE}^{(2)}$ | 0 | 0.366101695 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.003335792 | 0 |
| $a_{\psi Si}^{(1)}$ | 0.039268266 | −0.013700762 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 191.7159763 | 0 |
| $c_{\psi Si}$ | 13.26923077 | 16.01694915 |
| $a_{\theta LT}^{(2)}$ | −0.007476194 | 0 |
| $a_{\theta LT}^{(1)}$ | −0.010867175 | −0.053997369 |
| $b_{\theta LT}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $d_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| $e$ | −2.071831837 | −3.228508418 |

TABLE 3

| | Si(100) First higher-order mode $0 < T_{LT} < 0.2$ $0.2 \le T_S \le 2.0$ | |
|---|---|---|
| | $0.05 \le T_E < 0.25$ | $0.25 \le T_E \le 0.45$ |
| $a_{TLT}^{(2)}$ | 0 | 0 |
| $a_{TLT}^{(1)}$ | −15.6141248 | −15.6141248 |
| $b_{TLT}^{(2)}$ | 0 | 0 |

TABLE 3-continued

Si(100)
First higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $c_{TLT}$ | 0.163309353 | 0.163309353 |
| $a_{TS}^{(2)}$ | 0 | 0 |
| $a_{TS}^{(1)}$ | −22.02440893 | −22.02440893 |
| $b_{TS}^{(2)}$ | 0 | 0 |
| $c_{TS}$ | 0.325179856 | 0.325179856 |
| $a_{TE}^{(4)}$ | 0 | 0 |
| $a_{TE}^{(3)}$ | −248.4374004 | −248.4374004 |
| $a_{TE}^{(2)}$ | −36.57127964 | −36.57127964 |
| $a_{TE}^{(1)}$ | 13.88180854 | 13.88180854 |
| $b_{TE}^{(4)}$ | 0 | 0 |
| $b_{TE}^{(3)}$ | 0.000480119 | 0.000480119 |
| $b_{TE}^{(2)}$ | 0.020416128 | 0.020416128 |
| $c_{TE}$ | 0.240647482 | 0.240647482 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002456326 | 0.002456326 |
| $a_{\psi Si}^{(1)}$ | 0.043553126 | 0.048553126 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 279.6050929 | 279.6050929 |
| $c_{\psi Si}$ | 22.3381295 | 22.3381295 |
| $a_{\theta LT}^{(2)}$ | 0 | 0 |
| $a_{\theta LT}^{(1)}$ | 0.005427275 | 0.005427275 |
| $b_{\theta LT}^{(2)}$ | 0 | 0 |
| $c_{\theta LT}$ | −50.35971223 | −50.35971223 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679 |

TABLE 4

Si(100)
First higher-order mode
$0.2 \leq T_{LT} \leq 3.5$
$0 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |
| $a_{TE}^{(3)}$ | 0 | 0 |
| $a_{TE}^{(2)}$ | 110.8304316 | 0 |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |

TABLE 4-continued

Si(100)
First higher-order mode
$0.2 \leq T_{LT} \leq 3.5$
$0 \leq T_S \leq 2.0$

| | $0.05 \leq T_E < 0.25$ | $0.25 \leq T_E \leq 0.45$ |
|---|---|---|
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | 0 |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $d_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513 |

TABLE 5

Si(100)
Second higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −5.687707928 | −5.687707928 |
| $b_{TLT}^{(2)}$ | 0 | 0 |
| $c_{TLT}$ | 0.139506173 | 0.139506173 |
| $a_{TS}^{(2)}$ | 0 | 0 |
| $a_{TS}^{(1)}$ | 5.653643283 | 5.653643283 |
| $b_{TS}^{(2)}$ | 0 | 0 |
| $c_{TS}$ | 0.148148148 | 0.148148148 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.004369706 | −1.004369706 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.255555556 | 0.255555556 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000197083 | −0.000197083 |
| $a_{\psi Si}^{(2)}$ | −0.003376583 | −0.003376583 |
| $a_{\psi Si}^{(1)}$ | 0.118081927 | 0.118081927 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −379.4708632 | −379.4708632 |
| $b_{\psi Si}^{(2)}$ | 278.0521262 | 278.0521262 |
| $c_{\psi Si}$ | 23.14814815 | 23.14814815 |
| $a_{\theta LT}^{(2)}$ | 0 | 0 |
| $a_{\theta LT}^{(1)}$ | 0.128631041 | 0.128631041 |
| $b_{\theta LT}^{(2)}$ | 0 | 0 |
| $c_{\theta LT}$ | −49.32098765 | −49.32098765 |
| $d_{TLTTS}$ | 0 | 0 |
| $d_{TLTTE}$ | 72.43278274 | 72.43278274 |
| $d_{TLT\psi Si}$ | 0.604747502 | 0.604747502 |
| $d_{TLT\theta LT}$ | −1.743618251 | −1.743618251 |
| $d_{TSTE}$ | 0 | 0 |

TABLE 5-continued

Si(100)
Second higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $d_{TS\psi Si}$ | 0 | 0 |
| $d_{TS\theta LT}$ | 0.994157261 | 0.994157261 |
| $d_{TE\psi Si}$ | 0 | 0 |
| $d_{TE\theta LT}$ | 0.280889881 | 0.280889881 |
| $d_{\psi Si\theta LT}$ | 0.003095822 | 0.003095822 |
| e | −5.638096455 | −5.638096455 |

TABLE 6

Si(100)
Second higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | 7.809960834 | 4.249755245 |
| $b_{TLT}^{(2)}$ | 0 | 0 |
| $c_{TLT}$ | 0.30962963 | 0.302857143 |
| $a_{TS}^{(2)}$ | 0 | 0 |
| $a_{TS}^{(1)}$ | 0 | −0.800874586 |
| $b_{TS}^{(2)}$ | 0 | 0 |
| $c_{TS}$ | 0 | 0.150714286 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.563479635 | 9.07053135 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148518519 | 0.353571429 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000160979 | 0 |
| $a_{\psi Si}^{(2)}$ | −0.000757552 | 0.001332545 |
| $a_{\psi Si}^{(1)}$ | 0.095765615 | 0.003836714 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 384.7407407 | 0 |
| $b_{\psi Si}^{(2)}$ | 278.2222222 | 285.0956633 |
| $c_{\psi Si}$ | 21.33333333 | 20.89285714 |
| $a_{\theta LT}^{(2)}$ | 0 | 0 |
| $a_{\theta LT}^{(1)}$ | 0.043185248 | 0.033521037 |
| $b_{\theta LT}^{(2)}$ | 0 | 0 |
| $c_{\theta LT}$ | −50 | −50.92857143 |
| $d_{TLTTS}$ | 0 | 0 |
| $d_{TLTTE}$ | 0 | 0 |
| $d_{TLT\psi Si}$ | −0.383208698 | −0.220029295 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0.974673109 |
| $d_{TE\psi Si}$ | 0 | 0 |
| $d_{TE\theta LT}$ | 1.01389349 | −1.078939399 |
| $d_{\psi Si\theta LT}$ | 0 | 0.002899732 |
| e | −5.569590226 | −5.29442278 |

TABLE 7

Si(100)
Second higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | −1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408 |

TABLE 8

Si(100)
Second higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 035631068 |
| $a_{\psi Si}^{(6)}$ | 0 | 0 |

TABLE 8-continued

Si(100)
Second higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811 |

TABLE 9

Si(100)
Third higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −16.39135605 | −16.39135605 |
| $b_{TLT}^{(2)}$ | 0 | 0 |
| $c_{TLT}$ | 0.196774194 | 0.196774194 |
| $a_{TS}^{(2)}$ | 0 | 0 |
| $a_{TS}^{(1)}$ | −4.824831305 | −4.824831305 |
| $b_{TS}^{(2)}$ | 0 | 0 |
| $c_{TS}$ | 0.170967742 | 0.170967742 |
| $a_{TE}^{(4)}$ | 0 | 0 |
| $a_{TE}^{(3)}$ | 0 | 0 |
| $a_{TE}^{(2)}$ | −45.57608817 | −45.57608817 |
| $a_{TE}^{(1)}$ | −10.80005563 | −10.80005563 |
| $b_{TE}^{(4)}$ | 0 | 0 |
| $b_{TE}^{(3)}$ | 0 | 0 |
| $b_{TE}^{(2)}$ | 0.018296046 | 0.018296046 |
| $c_{TE}$ | 0.303225806 | 0.303225806 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000172048 | 0.000172048 |
| $a_{\psi Si}^{(2)}$ | −0.00384923 | −0.00384923 |
| $a_{\psi Si}^{(1)}$ | −0.009826773 | −0.009826773 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 143.0843208 | 143.0843208 |
| $b_{\psi Si}^{(2)}$ | 215.8688866 | 215.8688866 |
| $c_{\psi Si}$ | 22.25806452 | 22.25806452 |
| $a_{\theta LT}^{(2)}$ | 0 | 0 |
| $a_{\theta LT}^{(1)}$ | 0.066799879 | 0.066799879 |
| $b_{\theta LT}^{(2)}$ | 0 | 0 |
| $c_{\theta LT}$ | −50.16129032 | −50.16129032 |
| $d_{TLTTS}$ | 0 | 0 |
| $d_{TLTTE}$ | −112.847682 | −112.847682 |

TABLE 9-continued

Si(100)
Third higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | −1.750763196 | −1.750763196 |
| $d_{TS\theta LT}$ | 0 | 0 |
| $d_{TE\psi Si}$ | 0 | 0 |
| $d_{TE\theta LT}$ | 0.466692151 | 0.466692151 |
| $d_{\psi Si\theta LT}$ | 0 | 0 |
| e | −2.904746788 | −2.904746788 |

TABLE 10

Si(100)
Third higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −8.135537689 | −8.135537689 |
| $b_{TLT}^{(2)}$ | 0 | 0 |
| $c_{TLT}$ | 0.311659193 | 0.311659193 |
| $a_{TS}^{(2)}$ | 0 | 0 |
| $a_{TS}^{(1)}$ | −20.38200282 | −20.38200282 |
| $b_{TS}^{(2)}$ | 0 | 0 |
| $c_{TS}$ | 0.149327354 | 0.149327354 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.460675692 | −3.460675692 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.267488789 | 0.267488789 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.003759233 | −0.003759233 |
| $a_{\psi Si}^{(1)}$ | 0.015931998 | 0.015931998 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 239.0395946 | 239.0395946 |
| $c_{\psi Si}$ | 18.90134529 | 18.90134529 |
| $a_{\theta LT}^{(2)}$ | 0 | 0 |
| $a_{\theta LT}^{(1)}$ | 0.017576249 | 0.017576249 |
| $b_{\theta LT}^{(2)}$ | 0 | 0 |
| $c_{\theta LT}$ | −49.9103139 | −49.9103139 |
| $d_{TLTTS}$ | −152.1817236 | −152.1817236 |
| $d_{TLTTE}$ | 0 | 0 |
| $d_{TLT\psi Si}$ | −0.359387178 | −0.359387178 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0.911415415 | 0.911415415 |
| $d_{TE\psi Si}$ | 0 | 0 |
| $d_{TE\theta LT}$ | 0.275815872 | 0.275815872 |
| $d_{\psi Si\theta LT}$ | 0 | 0 |
| e | −3.952626598 | −3.952626598 |

TABLE 11

Si(100)
Third higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |
| $c_{\theta LT}$ | −48.97435897 | −48.97435897 |
| $d_{TLTTS}$ | 0 | 0 |
| $d_{TLTTE}$ | 0 | 0 |
| $d_{TLT\psi Si}$ | −0.816828716 | −0.816828716 |
| $d_{TLT\theta LT}$ | 0.865519967 | 0.865519967 |
| $d_{TSTE}$ | 0 | 0 |
| $d_{TS\psi Si}$ | −0.538336559 | −0.538336559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202 |

TABLE 12

Si(100)
Third higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| e | −4.940340284 | −4.940340284 |

TABLE 13

Si(110)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −16.69742899 | −16.69742899 | −33.56520202 | 0 |
| $b_{TLT}^{(2)}$ | 0 | 0 | 0 | 0 |
| $c_{TLT}$ | 0.1675 | 0.1675 | 0.192857143 | 0 |
| $a_{TS}^{(2)}$ | 0 | 0 | 0 | 0 |
| $a_{TS}^{(1)}$ | 15.90196012 | 15.90196012 | 0 | 0 |
| $b_{TS}^{(2)}$ | 0 | 0 | 0 | 0 |
| $c_{TS}$ | 0.1525 | 0.1525 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 26.3030303 | 0 |
| $a_{TE}^{(1)}$ | 0 | 0 | −6.181053391 | 0 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006326531 | 0 |

TABLE 13-continued

Si(110)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $c_{TE}$ | 0 | 0 | 0.378571429 | 0 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | −0.000183963 | −0.000183963 | 0 | −0.000177142 |
| $a_{\psi Si}^{(2)}$ | −0.003236307 | −0.003236307 | 0 | 0.002186084 |
| $a_{\psi Si}^{(1)}$ | 0.071460688 | 0.071460688 | 0.085067773 | 0.13561432 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | −5768.71875 | −5768.71875 | 0 | 2642.857143 |
| $b_{\psi Si}^{(2)}$ | 399.9375 | 399.9375 | 0 | 500 |
| $c_{\psi Si}$ | 65.25 | 65.25 | 34.28571429 | 55 |
| $a_{\theta LT}^{(2)}$ | 0 | 0 | 0 | −0.005336622 |
| $a_{\theta LT}^{(1)}$ | 0 | 0 | 0.070255628 | 0.032718563 |
| $b_{\theta LT}^{(2)}$ | 0 | 0 | 0 | 65.75963719 |
| $c_{\theta LT}$ | −90 | −90 | −51.42857143 | −50.95238095 |
| $d_{TLTTS}$ | 0 | 0 | 0 | 0 |
| $d_{TLTTE}$ | 0 | 0 | 0 | 0 |
| $d_{TLT\psi Si}$ | 1.873870705 | 1.873870705 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0.716151515 | 0 |
| $d_{\psi Si\theta LT}$ | 0 | 0 | −0.00729303 | 0.002110378 |
| e | −0.957101918 | −0.957101918 | −1.634922542 | −1.290881853 |

TABLE 14

Si(110)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −23.96596978 | −4.695531045 | −7.344438725 | −5.603099398 |
| $b_{TLT}^{(2)}$ | 0 | 0 | 0 | 0 |
| $c_{TLT}$ | 0.34 | 0.3296875 | 0.338983051 | 0.306666667 |
| $a_{TS}^{(2)}$ | 0 | 0 | 0 | 0 |
| $a_{TS}^{(1)}$ | −23.18485905 | 0 | 0 | 0 |
| $b_{TS}^{(2)}$ | 0 | 0 | 0 | 0 |
| $c_{TS}$ | 0.175555556 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −43.48595551 | −70.50554427 | −41.95412638 |
| $a_{TE}^{(1)}$ | 0 | −2.467954545 | −5.460437635 | −2.19025056 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006875 | 0.006716461 | 0.006819556 |
| $c_{TE}$ | 0 | 0.15 | 0.365254237 | 0.360666667 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0.000119479 | −0.000172812 |
| $a_{\psi Si}^{(2)}$ | 0.018474062 | 0 | 0.003987724 | 0.002213009 |
| $a_{\psi Si}^{(1)}$ | 0.059131688 | 0 | −0.047908658 | 0.073831446 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | −2384.203107 | 1647.952 |
| $b_{\psi Si}^{(2)}$ | 81.55555556 | 0 | 216.791152 | 242.24 |
| $c_{\psi Si}$ | 35.33333333 | 0 | 30.76271186 | 62.6 |

TABLE 14-continued

Si(110)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\theta LT}^{(2)}$ | 0 | 0 | 0 | 0 |
| $a_{\theta LT}^{(1)}$ | 0.009475371 | 0 | 0.026725166 | 0 |
| $b_{\theta LT}^{(2)}$ | 0 | 0 | 0 | 0 |
| $c_{\theta LT}$ | −49.33333333 | −90 | −49.83050847 | −90 |
| $d_{TLTTS}$ | 0 | 0 | 0 | 0 |
| $d_{TLTTE}$ | 0 | 0 | 0 | 42.3018696 |
| $d_{TLT\psi Si}$ | 0 | 0 | 0 | 0 |
| $d_{TLT\theta LT}$ | 0.617240199 | 0 | 0 | 0 |
| $d_{TSTE}$ | 0 | 0 | 0 | 0 |
| $d_{TS\psi Si}$ | 2.612107038 | 0 | 0 | 0 |
| $d_{TS\theta LT}$ | 2.129359248 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.871101002 | 0 | 0 | 0 |
| e | −2.851861362 | −2.210765625 | −2.573237288 | −2.440604203 |

TABLE 15

Si(110)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −10.87353735 | −17.74612134 | −16.74814911 | −16.74814911 |
| $b_{TLT}^{(2)}$ | 0 | 0 | 0 | 0 |
| $c_{TLT}$ | 0.167045455 | 0.158227848 | 0.168032787 | 0.168032787 |
| $a_{TS}^{(2)}$ | 92.14417413 | 275.6432031 | 0 | 0 |
| $a_{TS}^{(1)}$ | −6.141913324 | −0.713377524 | −9.071522271 | −9.071522271 |
| $b_{TS}^{(2)}$ | 0.004213585 | 0.004749239 | 0 | 0 |
| $c_{TS}$ | 0.339772727 | 0.317721519 | 0.314754098 | 0.314754098 |
| $a_{TE}^{(4)}$ | 0 | 0 | 0 | 0 |
| $a_{TE}^{(3)}$ | 0 | 0 | 0 | 0 |
| $a_{TE}^{(2)}$ | −37.82699975 | 0 | 0 | 0 |
| $a_{TE}^{(1)}$ | 4.315324766 | 3.259148162 | −5.270739047 | −5.270739047 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.007147469 | 0 | 0 | 0 |
| $c_{TE}$ | 0.153409091 | 0.138607595 | 0.356557377 | 0.356557377 |
| $a_{\psi Si}^{(6)}$ | 0 | 0 | −3.73552E−09 | −3.73552E−09 |
| $a_{\psi Si}^{(5)}$ | 0 | 0 | −4.69013E−08 | −4.69013E−08 |
| $a_{\psi Si}^{(4)}$ | 0 | 0 | 1.07773E−05 | 1.07773E−05 |
| $a_{\psi Si}^{(3)}$ | 0.000254041 | −0.000266841 | 5.64997E−05 | 5.64997E−05 |
| $a_{\psi Si}^{(2)}$ | 0.00704637 | 0.003350583 | −0.007526984 | −0.007526984 |
| $a_{\psi Si}^{(1)}$ | −0.123432463 | 0.05687546 | −0.035719404 | −0.035719404 |
| $b_{\psi Si}^{(6)}$ | 0 | 0 | 1801696668 | 1801696668 |
| $b_{\psi Si}^{(5)}$ | 0 | 0 | 6726299.443 | 6726299.443 |
| $b_{\psi Si}^{(4)}$ | 0 | 0 | 1035415.498 | 1035415.498 |
| $b_{\psi Si}^{(3)}$ | −1197.310014 | 2539.305207 | 3573.665857 | 3573.665857 |
| $b_{\psi Si}^{(2)}$ | 188.2457386 | 286.0358917 | 720.1088417 | 720.1088417 |
| $c_{\psi Si}$ | 28.125 | 63.60759494 | 48.19672131 | 48.19672131 |
| $a_{\theta LT}^{(2)}$ | 0 | 0 | 0 | 0 |
| $a_{\theta LT}^{(1)}$ | 0.046748629 | 0.00460971 | 0 | 0 |
| $b_{\theta LT}^{(2)}$ | 0 | 0 | 0 | 0 |
| $c_{\theta LT}$ | −51.59090909 | −50.75949367 | −90 | −90 |
| $d_{TLTTS}$ | 0 | 0 | 0 | 0 |
| $d_{TLTTE}$ | 0 | 105.3055279 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 58.63016883 | 0 | 0 | 0 |
| $d_{TS\psi Si}$ | 0.443510572 | 0.274149566 | 0 | 0 |
| $d_{TS\theta LT}$ | 0 | 0 | 0 | 0 |
| $d_{TE\psi Si}$ | 0.293912516 | −0.280924747 | 0 | 0 |
| $d_{TE\theta LT}$ | 0 | 0.457718571 | 0 | 0 |

TABLE 15-continued

Si(110)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{\psi Si \theta LT}$ | 0 | −0.005165328 | 0 | 0 |
| e | −1.722804167 | −2.484892701 | −2.976959016 | −2.976959016 |

TABLE 16

Si(110)
First higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 39.48011293 |
| $a_{TLT}^{(1)}$ | −5.239160454 | −5.820942031 | −4.867344296 | −2.496300587 |
| $b_{TLT}^{(2)}$ | 0 | 0 | 0 | 0.00654321 |
| $c_{TLT}$ | 0.309375 | 0.302702703 | 0.286363636 | 0.288888889 |
| $a_{TS}^{(2)}$ | 24.40391167 | 40.38499201 | 0 | 40.45660337 |
| $a_{TS}^{(1)}$ | −2.128595361 | −6.73354721 | −3.626479228 | −6.290401812 |
| $b_{TS}^{(2)}$ | 0.006013184 | 0.005624543 | 0 | 0.005617284 |
| $c_{TS}$ | 0.3265625 | 0.275675676 | 0.31 | 0.272222222 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −51.46488975 | 0 | 0 |
| $a_{TE}^{(1)}$ | −1.921891837 | −0.509929613 | −1.508039016 | −0.870147512 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006479182 | 0 | 0 |
| $c_{TE}$ | 0.153125 | 0.147297297 | 0.341818182 | 0.351388889 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | −0.000165117 | 0 | −9.55404E−05 |
| $a_{\psi Si}^{(2)}$ | 0.000936051 | 0.00475603 | 0 | 0.002198207 |
| $a_{\psi Si}^{(1)}$ | −0.02141106 | 0.040196571 | −0.017752634 | 0.036260775 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 2115.829763 | 0 | 1531.394676 |
| $b_{\psi Si}^{(2)}$ | 246.9177246 | 196.5668371 | 0 | 199.8263889 |
| $c_{\psi Si}$ | 24.140625 | 57.97297297 | 21.13636364 | 60.41666667 |
| $a_{\theta LT}^{(2)}$ | 0 | 0 | 0 | −0.003220943 |
| $a_{\theta LT}^{(1)}$ | 0.023743346 | 0.023741003 | 0.038368027 | 0.005042496 |
| $b_{\theta LT}^{(2)}$ | 0 | 0 | 0 | 72.22222222 |
| $c_{\theta LT}$ | −50.078125 | −48.51351351 | −50.81818182 | −50 |
| $d_{TLTTS}$ | 0 | 0 | 0 | −43.45862557 |
| $d_{TLTTE}$ | −35.16960363 | −48.00382984 | 23.6423037 | 52.46703277 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.234382842 | 0 | 0 | −0.273892853 |
| $d_{\psi Si \theta LT}$ | 0 | −0.00130658 | −0.001221935 | 0 |
| e | −2.175330984 | −2.239116787 | −2.271294054 | −2.496300587 |

TABLE 17

Si(110)

Second higher-order mode
$0 < T_{LT} < 0.2$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 0 | 0 |
| $a_{TLT}^{(1)}$ | −7.587457615 | −7.587457615 | −7.587457615 | −7.587457615 |
| $b_{TLT}^{(2)}$ | 0 | 0 | 0 | 0 |
| $c_{TLT}$ | 0.174380165 | 0.174380165 | 0.174380165 | 0.174380165 |
| $a_{TS}^{(2)}$ | 0 | 0 | 0 | 0 |
| $a_{TS}^{(1)}$ | −3.979714537 | −3.979714537 | −3.979714537 | −3.979714537 |
| $b_{TS}^{(2)}$ | 0 | 0 | 0 | 0 |
| $c_{TS}$ | 0.150413223 | 0.150413223 | 0.150413223 | 0.150413223 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −0.865040993 | −0.865040993 | −0.865040993 | −0.865040993 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.245867769 | 0.245867769 | 0.245867769 | 0.245867769 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 5.87537E−07 | 5.87537E−07 | 5.87537E−07 | 5.87537E−07 |
| $a_{\psi Si}^{(3)}$ | −8.59015E−07 | −8.59015E−07 | −8.59015E−07 | −8.59015E−07 |
| $a_{\psi Si}^{(2)}$ | −0.001948222 | −0.001948222 | −0.001948222 | −0.001948222 |
| $a_{\psi Si}^{(1)}$ | −0.027558032 | −0.027558032 | −0.027558032 | −0.027558032 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 1129197.497 | 1129197.497 | 1129197.497 | 1129197.497 |
| $b_{\psi Si}^{(3)}$ | −1524.372996 | −1524.372996 | −1524.372996 | −1524.372996 |
| $b_{\psi Si}^{(2)}$ | 776.3813947 | 776.3843947 | 776.3813947 | 776.3813947 |
| $c_{\psi Si}$ | 41.52892562 | 41.52892562 | 41.52892562 | 41.52892562 |
| $a_{\theta LT}^{(2)}$ | 0 | 0 | 0 | 0 |
| $a_{\theta LT}^{(1)}$ | 0.018744549 | 0.018744549 | 0.018744549 | 0.018744549 |
| $b_{\theta LT}^{(2)}$ | 0 | 0 | 0 | 0 |
| $c_{\theta LT}$ | −49.25619835 | −49.25619835 | −49.25619835 | −49.25619835 |
| $d_{TLTTS}$ | 140.6234074 | 140.6234074 | 140.6234074 | 140.6234074 |
| $d_{TLTTE}$ | −25.20654793 | −25.20654793 | −25.20654793 | −25.20654793 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0 | 0 | 0 | 0 |
| e | −1.789519626 | −1.789519626 | −1.789519626 | −1.789519626 |

TABLE 18

Si(110)
Second higher-order mode
$0.2 \leq T_{LT} \leq 3.5$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 39.68139696 | 39.68139696 |
| $a_{TLT}^{(1)}$ | −3.912934705 | −3.912934705 | −3.801935963 | −3.801935963 |
| $b_{TLT}^{(2)}$ | 0 | 0 | 0.00692398 | 0.00692398 |
| $c_{TLT}$ | 0.306451613 | 0.306451613 | 0.297857143 | 0.297857143 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 1.912614784 | 1.912614784 | −6.089810932 | −6.089810932 |
| $b_{TE}^{(4)}$ | 0 | 0 | 0 | 0 |

TABLE 18-continued

Si(110)
Second higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{TE}^{(3)}$ | 0 | 0 | 0 | 0 |
| $b_{TE}^{(2)}$ | 0 | 0 | 0 | 0 |
| $c_{TE}$ | 0.148924731 | 0.148924731 | 0.347857143 | 0.347857143 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 8.78847E−06 | 8.78847E−06 |
| $a_{\psi Si}^{(2)}$ | −0.0004718 | −0.0004718 | −0.000160567 | −0.000160567 |
| $a_{\psi Si}^{(1)}$ | 0.003265633 | 0.003265633 | −0.023574651 | −0.023574651 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 2351.597668 | 2351.597668 |
| $b_{\psi Si}^{(2)}$ | 847.4765869 | 847.4765869 | 880.2091837 | 880.2091837 |
| $c_{\psi Si}$ | 35.32258065 | 35.32258065 | 43.07142857 | 43.07142857 |
| $a_{\theta LT}^{(2)}$ | 0.005014741 | 0.005014741 | 0 | 0 |
| $a_{\theta LT}^{(1)}$ | 0.023115164 | 0.023115164 | 0.030121011 | 0.030121011 |
| $b_{\theta LT}^{(2)}$ | 67.0626662 | 67.0626662 | 0 | 0 |
| $c_{\theta LT}$ | −49.62365591 | −49.62365591 | −51.28571429 | −51.28571429 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0.125572529 | 0.125572529 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.563162206 | 0.563162206 | −0.417002414 | −0.417002414 |
| $d_{\psi Si\theta LT}$ | 0 | 0 | 0 | 0 |
| e | −2.002512986 | −2.002512986 | −2.550158637 | −2.550158637 |

TABLE 19

Si(110)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | 2.992014692 | 2.992014692 | −1.461725087 | −1.461725087 |
| $b_{TLT}^{(2)}$ | 0 | 0 | 0 | 0 |
| $c_{TLT}$ | 0.156390977 | 0.156390977 | 0.155345912 | 0.155345912 |
| $a_{TS}^{(2)}$ | 0 | 0 | 0 | 0 |
| $a_{TS}^{(1)}$ | −9.089925228 | −9.089925228 | −1.247751383 | −1.247751383 |
| $b_{TS}^{(2)}$ | 0 | 0 | 0 | 0 |
| $c_{TS}$ | 0.305263158 | 0.305263158 | 0.327672956 | 0.327672956 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −130.6388144 | −130.6388144 |
| $a_{TE}^{(1)}$ | 5.773590917 | 5.773590917 | −0.010504162 | −0.010504162 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006662711 | 0.006662711 |
| $c_{TE}$ | 0.166541353 | 0.166541353 | 0.341823899 | 0.341823899 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 1.03604E−05 | 1.03604E−05 |
| $a_{\psi Si}^{(2)}$ | −0.000377109 | −0.000377109 | −0.000138558 | −0.000138558 |
| $a_{\psi Si}^{(1)}$ | −0.013702515 | −0.013702515 | −0.028102653 | −0.028102653 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 3096.349671 | 3096.349671 |

TABLE 19-continued

Si(110)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(2)}$ | 792.2381141 | 792.2381141 | 957.6361695 | 957.6361695 |
| $c_{\psi Si}$ | 41.39097744 | 41.39097744 | 43.20754717 | 43.20754717 |
| $a_{\theta LT}^{(2)}$ | 0 | 0 | 0 | 0 |
| $a_{\theta LT}^{(1)}$ | 0.015804666 | 0.015804666 | 0.028892246 | 0.028892246 |
| $b_{\theta LT}^{(2)}$ | 0 | 0 | 0 | 0 |
| $c_{\theta LT}$ | −49.32330827 | −49.32330827 | −49.62264151 | −49.62264151 |
| $d_{TLTTS}$ | 0 | 0 | −44.5976835 | −44.5976835 |
| $d_{TLTTE}$ | 80.90186655 | 80.90186655 | −150.2428298 | −150.2428298 |
| $d_{TLT\psi Si}$ | 0 | 0 | 0.225109644 | 0.225109644 |
| $d_{TLT\theta LT}$ | 0 | 0 | 0 | 0 |
| $d_{TSTE}$ | 29.68261053 | 29.68261053 | 47.35851038 | 47.35851038 |
| $d_{TS\psi Si}$ | 0.136750854 | 0.136750854 | 0 | 0 |
| $d_{TS\theta LT}$ | 0 | 0 | 0 | 0 |
| $d_{TE\psi Si}$ | −0.146211814 | −0.146211814 | 0 | 0 |
| $d_{TE\theta LT}$ | 0.41229257 | 0.41229257 | 0 | 0 |
| $d_{\psi Si\theta LT}$ | 0 | 0 | 0 | 0 |
| e | −2.596813807 | −2.596813807 | −2.049341112 | −2.049341112 |

TABLE 20

Si(110)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −2.80791074 | −2.80791074 | 0 | 0 |
| $b_{TLT}^{(2)}$ | 0 | 0 | 0 | 0 |
| $c_{TLT}$ | 0.3069869 | 0.3069869 | 0 | 0 |
| $a_{TS}^{(2)}$ | 0 | 0 | 0 | 0 |
| $a_{TS}^{(1)}$ | −5.618098986 | −5.618098986 | 0 | 0 |
| $b_{TS}^{(2)}$ | 0 | 0 | 0 | 0 |
| $c_{TS}$ | 0.286462882 | 0.286462882 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −73.23839461 | −73.23839461 |
| $a_{TE}^{(1)}$ | 8.962154821 | 8.962154821 | −5.710295136 | −5.710295136 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007310763 | 0.007310763 |
| $c_{TE}$ | 0.167467249 | 0.167467249 | 0.330930233 | 0.330930233 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.003677309 | 0.003677309 | 0 | 0 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 40.93886463 | 40.93886463 | 0 | 0 |
| $a_{\theta LT}^{(2)}$ | 0.00527863 | 0.00527863 | 0 | 0 |
| $a_{\theta LT}^{(1)}$ | 0.008431458 | 0.008431458 | 0 | 0 |
| $b_{\theta LT}^{(2)}$ | 66.00179249 | 66.00179249 | 0 | 0 |
| $c_{\theta LT}$ | −50.61135371 | −50.61135371 | −90 | −90 |
| $d_{TLTTS}$ | 63.6265441 | 63.6265441 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 57.20229582 | 57.20229582 | 0 | 0 |
| $d_{TS\psi Si}$ | 0 | 0 | 0 | 0 |
| $d_{TS\theta LT}$ | 0 | 0 | 0 | 0 |

TABLE 20-continued

Si(110)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{TE\psi Si}$ | −0.098212695 | −0.098212695 | 0 | 0 |
| $d_{TE\theta LT}$ | 0.32576925 | 0.32576925 | 0 | 0 |
| $d_{\psi Si\theta LT}$ | 0 | 0 | 0 | 0 |
| e | −2.431352404 | −2.431352404 | −2.39032093 | −2.39032093 |

TABLE 21

Si(110)
Third higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −11.04825287 | −11.04825287 | −11.04825287 | −11.04825287 |
| $b_{TLT}^{(2)}$ | 0 | 0 | 0 | 0 |
| $c_{TLT}$ | 0.164705882 | 0.164705882 | 0.164705882 | 0.164705882 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.86806521 | −12.86806521 | −12.86806521 | −12.86806521 |
| $a_{TE}^{(1)}$ | 39.88235294 | 39.88235294 | 39.88235294 | 39.88235294 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.019258131 | 0.019258131 | 0.019258131 | 0.019258131 |
| $c_{TE}$ | 0.286470588 | 0.286470588 | 0.286470588 | 0.286470588 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.000762445 | −0.000762445 | −0.000762445 | −0.000762445 |
| $a_{\psi Si}^{(1)}$ | −0.031584918 | −0.031584918 | −0.031584918 | −0.031584918 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 749.7716263 | 749.7716263 | 749.7716263 | 749.7716263 |
| $c_{\psi Si}$ | 52.58823529 | 52.58823529 | 52.58823529 | 52.58823529 |
| $a_{\theta LT}^{(2)}$ | −0.004115091 | −0.004115091 | −0.004115091 | −0.004115091 |
| $a_{\theta LT}^{(1)}$ | 0.023260981 | 0.023260981 | 0.023260981 | 0.023260981 |
| $b_{\theta LT}^{(2)}$ | 81.16252976 | 81.16262976 | 81.16262976 | 81.16262976 |
| $c_{\theta LT}$ | −50.11764706 | −50.11764706 | −50.11764706 | −50.11764706 |
| $d_{TLTTS}$ | 0 | 0 | 0 | 0 |
| $d_{TLTTE}$ | −32.35244505 | −32.35244505 | −32.35244505 | −32.35244505 |
| $d_{TLT\psi Si}$ | 0.348515389 | 0.348515389 | 0.348515389 | 0.348515389 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.000823202 | 0.000823202 | 0.000823202 | 0.000823202 |
| e | −1.678155024 | −1.678155024 | −1.678155024 | −1.678155024 |

TABLE 22

Si(110)
Third higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $d_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |
| $d_{TS\theta LT}$ | 0 | 0 | 0 | 0 |
| $d_{TE\psi Si}$ | 0.081014811 | 0.081014811 | 0 | 0 |
| $d_{TE\theta LT}$ | 0 | 0 | −0.194432704 | −0.194432704 |
| $d_{\psi Si\theta LT}$ | 0 | 0 | 0.000875955 | 0.000875955 |
| $e$ | −2.543790382 | −2.543790382 | −2.964933907 | −2.964933907 |

TABLE 23

Si(110)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | −54.97015257 | −54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |

TABLE 23-continued

Si(110)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015 |

TABLE 24

Si(110)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.140898252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.413434 | −1267.413434 | 1811.750092 | 0 |

TABLE 24-continued

Si(110)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $d_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| e | −2.390757235 | −2.390757235 | −2.548464154 | −2.523994879 |

TABLE 25

Si(111)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.883915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $d_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |

TABLE 25-continued

Si(111)
First higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $d_{TE\psi Si}$ | −0.613440559 | 0 | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.55329028 | −1.074792989 | −1.290770348 | −1.165057152 |

TABLE 26

Si(111)
First higher-order mode
$0.2 \le T_{LT} \le 3.5$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | −24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.021125116 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1635802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 0 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $d_{TLT\theta LT}$ | −0.785540829 | −0.785540829 | 0 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468 |

TABLE 27

Si(111)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | −15.38083251 | −11.91949736 |
| $b_{TS}^{(2)}$ | 0.004461166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33125 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | −161.2345526 | 0 |
| $d_{TLT\psi Si}$ | −0.827435588 | 0 | 0 | 1.107475984 |
| $d_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084 |

TABLE 28

Si(111)
First higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |

TABLE 28-continued

Si(111)
First higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{TE}^{(3)}$ | 0 | 0 | 0 | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |
| $a_{\theta LT}^{(1)}$ | −0.017420386 | −0.012240534 | 0 | 0 |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132 |

TABLE 29

Si(111)
Second higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | −10.04988717 | 5.027045348 | −5.686378626 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | −0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 29-continued

Si(111)
Second higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\psi Si}^{(2)}$ | 0 | 0 | 125.0280404 | 0 |
| $c_{\psi Si}$ | 9.683544304 | 50 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.451355926 | 0 |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691 |

TABLE 30

Si(111)
Second higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 45.51074293 | −94.44342524 | 0 |
| $a_{TLT}^{(1)}$ | 0.788515154 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 9.791468713 | 0.170587985 | −0.71523762 | −10.72534988 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |

TABLE 30-continued

Si(111)
Second higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 0 | 0.20688896 | 0 | 0 |
| $d_{TE\theta LT}$ | 0.774150432 | 0.489880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612 |

TABLE 31

Si(111)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 0 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.41666667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| e | −2.770026639 | −2.638591885 | −1.980941925 | −2.412296494 |

TABLE 32

Si(111)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 86.18383552 | 0 |
| $a_{TE}^{(1)}$ | 3.853394073 | 8.768511808 | −1.867550529 | −15.68616064 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |
| $b_{\theta LT}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | 0 |
| $d_{TLT\theta LT}$ | 0 | 0 | 0 | −0.608943868 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | |
| $d_{\psi Si\theta LT}$ | 0 | 0 | 0 | 0 |
| e | −2.401219798 | −3.18651044 | −3.93030224 | −4.143483981 |

TABLE 33

Si(111)
Third higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |
| $b_{TLT}^{(2)}$ | 0 | 0 | 0 | 0 |
| $c_{TLT}$ | 0.160869565 | 0.160869565 | 0.160869565 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |

TABLE 33-continued

Si(111)
Third higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| e | −0.277577227 | −0.277577227 | −0.277577227 | −0.277577227 |

TABLE 34

Si(111)
Third higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | −215.3850281 | −215.3850281 | −215.3850281 | −215.3850281 |
| $a_{TE}^{(3)}$ | 54.12265846 | 54.12265846 | 54.12265846 | 54.12265846 |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 34-continued

Si(111)
Third higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 45.80413521 | 45.80413521 | 45.80413521 | 45.80413521 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| e | −0.446604617 | −0.446604617 | −0.446604617 | −0.446604617 |

TABLE 35

Si(111)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |

TABLE 35-continued

Si(111)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 0.024454063 | 0.024454063 | 0.024454063 | 0.024454063 |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |

TABLE 36

Si(111)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |
| $b_{\theta LT}^{(2)}$ | 0 | 0 | 0 | 0 |
| $c_{\theta LT}$ | −48.52941176 | −48.52941176 | −48.52941176 | −48.52941116 |
| $d_{TLTTS}$ | −0.04933649 | −0.04933649 | −0.04933649 | −0.04933649 |
| $d_{TLTTE}$ | −0.021023839 | −0.021023839 | −0.021023839 | −0.021023839 |
| $d_{TLT\psi Si}$ | 0 | 0 | 0 | 0 |
| $d_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485 |

In an acoustic wave device according to a preferred embodiment of the present invention, $I_h$ for each of the first and second higher-order modes is more than about −2.4.

In an acoustic wave device according to a preferred embodiment of the present invention, $I_h$ for each of the first and third higher-order modes is more than about −2.4.

In an acoustic wave device according to a preferred embodiment of the present invention, $I_h$ for each of the second and third higher-order modes is more than about −2.4.

In an acoustic wave device according to a preferred embodiment of the present invention, preferably, $I_h$ for each of the first, second, and third higher-order modes is more than about −2.4. In this case, all of the responses of the first higher-order mode, the second higher-order mode, and the third higher-order mode are able to be effectively reduced or prevented.

In an acoustic wave device according to a preferred embodiment of the present invention, the piezoelectric body has a thickness of about 3.5λ or less.

In an acoustic wave device according to a preferred embodiment of the present invention, the piezoelectric body has a thickness of about 2.5λ or less.

In an acoustic wave device according to a preferred embodiment of the present invention, the piezoelectric body has a thickness of about 1.5λ or less.

In an acoustic wave device according to a preferred embodiment of the present invention, the piezoelectric body has a thickness of about 0.5λ or less.

In an acoustic wave device according to a preferred embodiment of the present invention, an acoustic wave resonator is provided as the acoustic wave device.

An acoustic wave filter according to a preferred embodiment of the present invention includes multiple resonators, in which at least one of the multiple resonators is defined by an acoustic wave device according to a preferred embodiment of the present invention. Thus, the acoustic wave filter in which at least one of the responses of the first, second, and third higher-order modes is reduced or prevented is provided.

A multiplexer according to a preferred embodiment of the present invention includes N acoustic wave filters (where N is 2 or more) having different pass bands, one terminal of each of the N acoustic wave filters being commonly connected on an antenna terminal side, in which at least one acoustic wave filter among the N acoustic wave filters excluding an acoustic wave filter having a highest-frequency pass band includes multiple acoustic wave resonators, and at least one acoustic wave resonator among the multiple acoustic wave resonators is defined by an acoustic wave device according to a preferred embodiment of the present invention.

Preferably, the multiplexers according to preferred embodiments of the present invention are each used as a composite filter device for carrier aggregation.

A high-frequency front-end circuit according to a preferred embodiment of the present invention includes an acoustic wave filter including an acoustic wave device according to a preferred embodiment of the present invention and a power amplifier connected to the acoustic wave filter.

A communication apparatus according to a preferred embodiment of the present invention includes a high-frequency front-end circuit including an acoustic wave filter that includes an acoustic wave device according to a preferred embodiment of the present invention and a power amplifier connected to the acoustic wave filter, and an RF signal processing circuit.

In the acoustic wave devices, the multiplexers, the high-frequency front-end circuits, and the communication apparatuses according to preferred embodiments of the present invention, at least one of the response of the first higher-order mode, the response of the second higher-order mode, and the response of the third higher-order mode located at higher frequencies than the main mode is able to be effectively reduced or prevented. Thus, in the multiplexers, the high-frequency front-end circuits, and the communication apparatuses including the acoustic wave devices according to preferred embodiments of the present invention, ripples due to the higher-order mode are less likely to occur in another band pass filter having a pass band with a higher frequency than the acoustic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments according to the present invention will be described in detail below with reference to the attached drawings so as to clarify the present invention.

Preferred embodiments described in this specification are illustrative. It should be noted that partial replacement and combination of configurations in different preferred embodiments may be made.

Figure 1A:
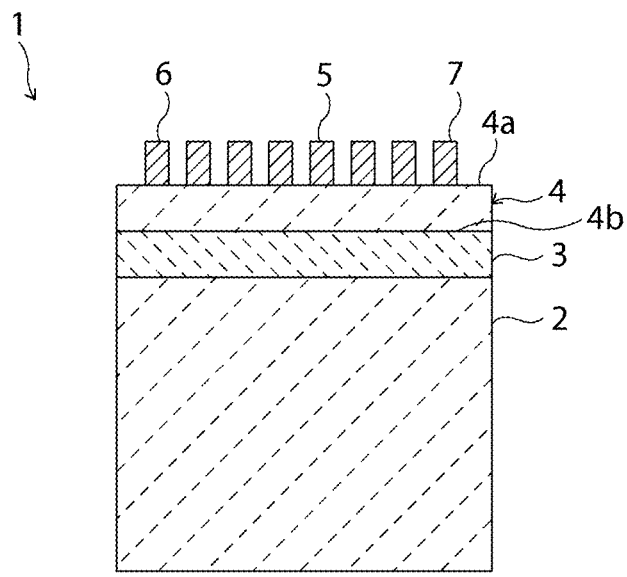
FIG. 1A is a schematic elevational cross-sectional view of an acoustic wave device according to a first preferred embodiment of the present invention.
Figure 1B:
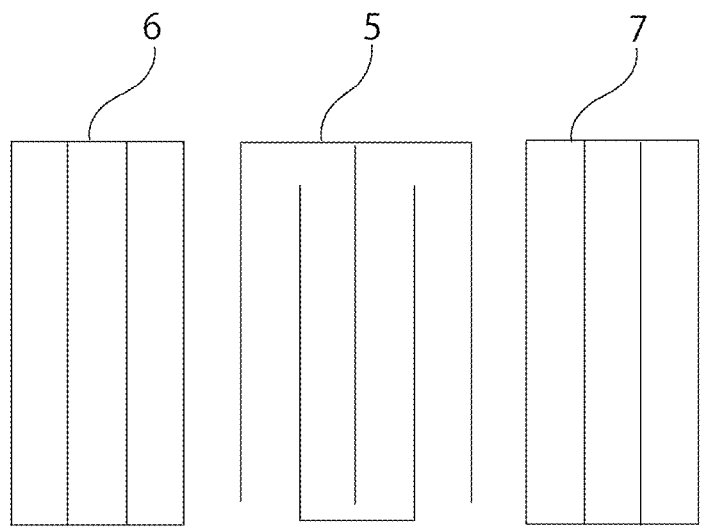
FIG. 1B is a schematic plan view illustrating the electrode structure of the acoustic wave device according to the first preferred embodiment of the present invention.

FIG. 1A is a schematic elevational cross-sectional view of an acoustic wave device according to a first preferred embodiment of the present invention, and FIG. 1B is a schematic plan view illustrating the electrode structure thereof.

An acoustic wave device 1 is preferably a one-port acoustic wave resonator, for example. The acoustic wave device 1 includes a single-crystal Si layer 2 defining and functioning as a supporting substrate made of silicon. The term "supporting substrate made of silicon" includes a supporting substrate including only of silicon; and a supporting substrate made of a material including silicon as a main component and impurities. A SiO$_2$ film 3 defining and functioning as a silicon oxide film and a piezoelectric body 4 made of lithium tantalate (LiTaO$_3$) are stacked on the single-crystal Si layer 2. The piezoelectric body 4 includes first and second main surfaces 4a and 4b opposed to each other. Interdigital transducer electrodes 5 are disposed on the first main surface 4a. Reflectors 6 and 7 are disposed on both sides of the interdigital transducer electrodes 5 in the propagation direction of an acoustic wave. The SiO$_2$ film 3 defining and functioning as a silicon oxide film may include not only SiO$_2$ but also, for example, silicon oxide in which SiO$_2$ is doped with fluorine or the like. In FIG. 1A, the SiO$_2$ film 3 is directly on the single-crystal Si layer 2, the piezoelectric body 4 is directly on the SiO$_2$ film 3, and the Interdigital transducer electrodes 5 are disposed directly on the piezoelectric body 4. However, the SiO$_2$ film 3 may be indirectly on (or above) the single-crystal Si layer 2, the piezoelectric body 4 may be indirectly on (or above) the SiO$_2$ film 3, and the Interdigital transducer electrodes 5 may be disposed indirectly on (or above) the piezoelectric body 4.

The inventors of preferred embodiments of the present invention have discovered that in an acoustic wave resonator having such a structure in which a piezoelectric body made of lithium tantalate is stacked directly or indirectly on the single-crystal Si layer 2, responses due to first, second, and third higher-order modes are generated.

Figure 2:
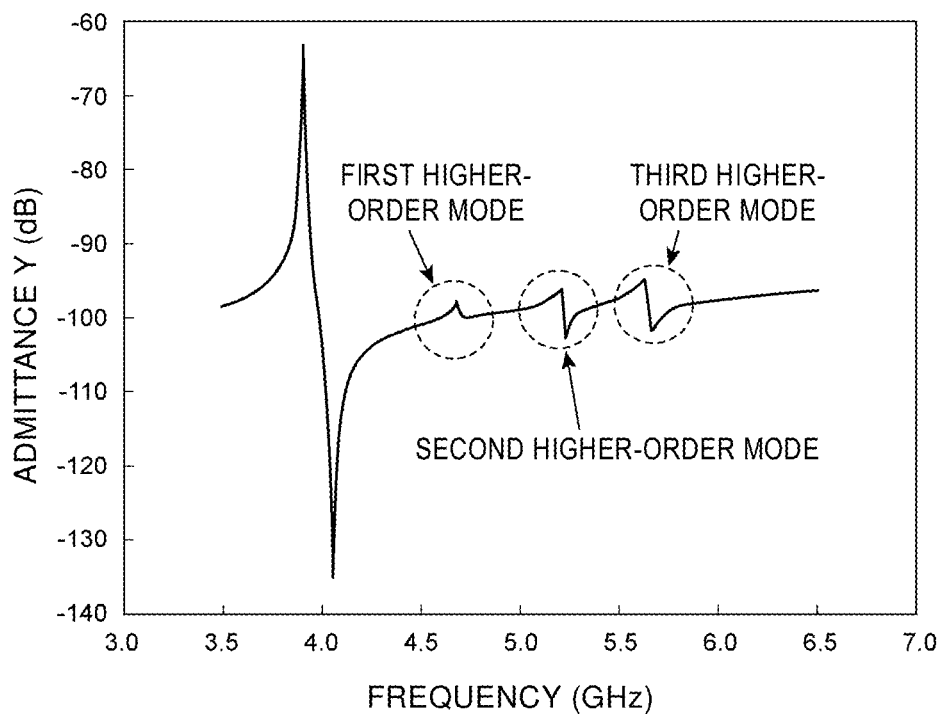
FIG. 2 illustrates admittance characteristics of an acoustic wave resonator.

FIG. 2 illustrates admittance characteristics of an acoustic wave resonator in order to explain first to third higher-order modes. The admittance characteristics illustrated in FIG. 2 are admittance characteristics of an acoustic wave resonator that has design parameters described below and that is not a preferred embodiment of the present invention.

The single-crystal Si layer has Euler angles ($\varphi_{Si}$, $\theta_{Si}$, $\psi_{Si}$)=(0°, 0°, 45°). The SiO$_2$ film has a film thickness of about 0.30λ. The piezoelectric body made of lithium tantalate has a film thickness of about 0.30λ. The piezoelectric body made of lithium tantalate has Euler angles ($\varphi_{LT}$, $\theta_{LT}$, $\psi_{LT}$)=(0°, −40°, 0°) The wave length λ determined by the pitch of electrode fingers of the interdigital transducer electrodes is about 1 μm. Each of the interdigital transducer electrodes is defined by a stacked metal film in which an Al film and a Ti film are stacked, and each interdigital transducer electrode has a thickness of about 0.05λ in terms of aluminum.

As is apparent from FIG. 2, in the acoustic wave resonator described above, each of the responses of the first higher-order mode, the second higher-order mode, and the third higher-order mode appears at higher frequencies than the response of the main mode. Regarding the frequency positions, a position of response of first higher-order mode is lower than a position of response of second higher-order mode and a position of response of third higher-order mode, and the position of response of the second higher-order mode is lower than the position of response of the third higher-order mode. The response of the first higher-order mode is closest to the response of the main mode. However, FIG. 2 is an example, and the positional relationship of the frequencies of the modes may be switched, depending on conditions, such as the electrode thickness.

A feature of the acoustic wave device 1 according to the present preferred embodiment is the fact that at least one of the response of the first higher-order mode, the response of the second higher-order mode, and the response of the third higher-order mode is reduced or prevented.

The wave length determined by the pitch of the electrode fingers of the interdigital transducer electrodes 5 is denoted by λ. The wave length-normalized film thickness of the piezoelectric body 4 made of lithium tantalate is denoted by $T_{LT}$. The Euler angle θ of the piezoelectric body made of lithium tantalate is denoted by $θ_{LT}$. The wave length-normalized film thickness of the SiO$_2$ film 3 is denoted by $T_S$. The wave length-normalized film thickness of the interdigital transducer electrodes 5 in terms of aluminum thickness is denoted by $T_E$. The propagation direction in the single-crystal Si layer 2 is denoted by $ψ_{Si}$. The wave length-normalized film thickness of the single-crystal Si layer 2 is denoted by $T_{Si}$. $T_{LT}$, $θ_{LT}$, $T_S$, $T_E$, and $ψ_{Si}$ are set such that $I_h$ represented by Formula (1) for at least one of the responses of the first higher-order mode, the second higher-order mode, and the third higher-order mode is preferably more than about −2.4, and $T_{Si}$>about 20, for example. Thus, the at least one of the responses of the first, second, and third higher-order modes is effectively reduced or prevented. This will be described in detail below.

In this specification, the wave length-normalized film thickness is a value obtained by normalizing the thickness of the film to the wave length λ determined by the pitch of the electrode fingers of the interdigital transducer electrodes. Thus, a value obtained by dividing actual thickness of the film by λ is the wave length-normalized film thickness. The wave length λ determined by the pitch of the electrode fingers of the interdigital transducer electrodes may be determined by the average pitch of the electrode fingers.

$$I_h = a^{(2)}_{T_{LT}}\left((T_{LT} - c_{T_{LT}})^2 - b^{(2)}_{T_{LT}}\right) + \\
a^{(1)}_{T_{LT}}(T_{LT} - c_{T_{LT}}) + a^{(2)}_{T_S}\left((T_S - c_{T_S})^2 - b^{(2)}_{T_S}\right) + \\
a^{(1)}_{T_S}(T_S - c_{T_S}) + a^{(4)}_{T_E}\left((T_E - c_{T_E})^4 - b^{(4)}_{T_E}\right) + \\
a^{(3)}_{T_E}\left((T_E - c_{T_E})^3 - b^{(3)}_{T_E}\right) + a^{(2)}_{T_E}\left((T_E - c_{T_E})^2 - b^{(2)}_{T_E}\right) + \\
a^{(1)}_{T_E}(T_E - c_{T_E}) + a^{(6)}_{ψ_{Si}}\left((ψ_{Si} - c_{ψ_{Si}})^6 - b^{(6)}_{ψ_{Si}}\right) + \\
a^{(5)}_{ψ_{Si}}\left((ψ_{Si} - c_{ψ_{Si}})^5 - b^{(5)}_{ψ_{Si}}\right) + a^{(4)}_{ψ_{Si}}\left((ψ_{Si} - c_{ψ_{Si}})^4 - b^{(4)}_{ψ_{Si}}\right) + \\
a^{(3)}_{ψ_{Si}}\left((ψ_{Si} - c_{ψ_{Si}})^3 - b^{(3)}_{ψ_{Si}}\right) + a^{(2)}_{ψ_{Si}}\left((ψ_{Si} - c_{ψ_{Si}})^2 - b^{(2)}_{ψ_{Si}}\right) + \\
a^{(1)}_{ψ_{Si}}(ψ_{Si} - c_{ψ_{Si}}) + a^{(2)}_{θ_{LT}}\left((θ_{LT} - c_{θ_{LT}})^2 - b^{(2)}_{θ_{LT}}\right) + \\
a^{(1)}_{θ_{LT}}(θ_{LT} - c_{θ_{LT}}) + d_{T_{LT}T_S}(T_{LT} - c_{T_{LT}})(T_S - c_{T_S}) + \\
d_{T_{LT}T_E}(T_{LT} - c_{T_{LT}})(T_E - c_{T_E}) + \\
d_{T_{LT}ψ_{Si}}(T_{LT} - c_{T_{LT}})(ψ_{Si} - c_{ψ_{Si}}) + \\
d_{T_{LT}θ_{LT}}(T_{LT} - c_{T_{LT}})(θ_{LT} - c_{θ_{LT}}) + \\
d_{T_S T_E}(T_S - c_{T_S})(T_E - c_{T_E}) + \\
d_{T_S ψ_{Si}}(T_S - c_{T_S})(ψ_{Si} - c_{ψ_{Si}}) + \\
d_{T_S θ_{LT}}(T_S - c_{T_S})(θ_{LT} - c_{θ_{LT}}) + \\
d_{T_E ψ_{Si}}(T_E - c_{T_E})(ψ_{Si} - c_{ψ_{Si}}) + \\
d_{T_E θ_{LT}}(T_E - c_{T_E})(θ_{LT} - c_{θ_{LT}}) + \\
d_{ψ_{Si} θ_{LT}}(ψ_{Si} - c_{ψ_{Si}})(θ_{LT} - c_{θ_{LT}}) + e \quad \text{Formula (1)}$$

In Formula (1), coefficients a, b, c, d, and e are values presented in Tables 37 to 72 below in accordance with ranges of, for example, the type of higher-order mode, the orientation of the single-crystal Si layer 2 either of (100), (110), or (111), the wave length-normalized film thickness of the SiO$_2$ film 3, the wave length-normalized film thickness of the piezoelectric body made of lithium tantalate, and the propagation direction in the single-crystal Si layer 2.

TABLE 37

| | Si(100) First higher-order mode $0 < T_{LT} < 0.2$ $0 ≤ T_S < 0.2$ | |
|---|---|---|
| | $0.05 ≤ T_E < 0.25$ | $0.25 ≤ T_E ≤ 0.45$ |
| $a_{TLT}^{(2)}$ | 0 | 0 |
| $a_{TLT}^{(1)}$ | 0 | 0 |
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | −5.857231176 | −5.857231176 |
| $b_{TS}^{(2)}$ | 0 | 0 |
| $c_{TS}$ | 0.148 | 0.148 |
| $a_{TE}^{(4)}$ | 0 | 0 |
| $a_{TE}^{(3)}$ | 0 | 0 |
| $a_{TE}^{(2)}$ | −19.75255913 | −19.75255913 |
| $a_{TE}^{(1)}$ | −2.877583447 | −2.877583447 |
| $b_{TE}^{(4)}$ | 0 | 0 |
| $b_{TE}^{(3)}$ | 0 | 0 |
| $b_{TE}^{(2)}$ | 0.022736 | 0.022736 |
| $c_{TE}$ | 0.242 | 0.242 |
| $a_{ψSi}^{(6)}$ | 0 | 0 |
| $a_{ψSi}^{(5)}$ | 0 | 0 |
| $a_{ψSi}^{(4)}$ | 0 | 0 |
| $a_{ψSi}^{(3)}$ | 0 | 0 |
| $a_{ψSi}^{(2)}$ | 0.004788767 | 0.004788767 |
| $a_{ψSi}^{(1)}$ | 0.024306207 | 0.024306207 |
| $b_{ψSi}^{(6)}$ | 0 | 0 |
| $b_{ψSi}^{(5)}$ | 0 | 0 |
| $b_{ψSi}^{(4)}$ | 0 | 0 |
| $b_{ψSi}^{(3)}$ | 0 | 0 |
| $b_{ψSi}^{(2)}$ | 81.81 | 81.81 |
| $c_{ψSi}$ | 8.7 | 8.7 |
| $a_{θLT}^{(2)}$ | −0.008235936 | −0.008235936 |
| $a_{θLT}^{(1)}$ | −0.021048278 | −0.021048278 |
| $b_{θLT}^{(2)}$ | 65.16 | 65.16 |
| $c_{θLT}$ | −52.2 | −52.2 |
| $d_{TLTTS}$ | 0 | 0 |
| $d_{TLTTE}$ | 0 | 0 |
| $d_{TLTψSi}$ | 0 | 0 |
| $d_{TLTθLT}$ | 0 | 0 |
| $d_{TSTE}$ | 0 | 0 |
| $d_{TSψSi}$ | 0 | 0 |
| $d_{TSθLT}$ | −0.786852571 | −0.786852571 |
| $d_{TEψSi}$ | 0 | 0 |
| $d_{TEθLT}$ | −0.237034335 | −0.237034335 |
| $d_{ψSiθLT}$ | 0 | 0 |
| e | −1.499248378 | −1.499248378 |

TABLE 38

| | Si(100) First higher-order mode $0.2 ≤ T_{LT} ≤ 3.5$ $0 ≤ T_S < 0.2$ | |
|---|---|---|
| | $0.05 ≤ T_E < 0.25$ | $0.25 ≤ T_E ≤ 0.45$ |
| $a_{TLT}^{(2)}$ | 0 | 125.5342427 |
| $a_{TLT}^{(1)}$ | −13.43961051 | −7.643409732 |
| $b_{TLT}^{(2)}$ | 0 | 0.006076558 |
| $c_{TLT}$ | 0.329807692 | 0.321186441 |
| $a_{TS}^{(2)}$ | 0 | 0 |
| $a_{TS}^{(1)}$ | −11.80744788 | −10.05306878 |
| $b_{TS}^{(2)}$ | 0 | 0 |
| $c_{TS}$ | 0.158653846 | 0.153389831 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | −7.595099843 |
| $b_{TE}^{(4)}$ | 0 | 0 |
| $b_{TE}^{(3)}$ | 0 | 0 |

TABLE 38-continued

Si(100)
First higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $b_{TE}^{(2)}$ | 0 | 0 |
| $c_{TE}$ | 0 | 0.366101695 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.003335792 | 0 |
| $a_{\psi Si}^{(1)}$ | 0.039268266 | −0.013700762 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 191.7159763 | 0 |
| $c_{\psi Si}$ | 13.26923077 | 16.01694915 |
| $a_{\theta LT}^{(2)}$ | −0.007476194 | 0 |
| $a_{\theta LT}^{(1)}$ | −0.010867175 | −0.053997369 |
| $b_{\theta LT}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $d_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| e | −2.071831837 | −3.228508418 |

TABLE 39

Si(100)
First higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −15.6141248 | −15.6141248 |
| $b_{TLT}^{(2)}$ | 0 | 0 |
| $c_{TLT}$ | 0.163309353 | 0.163309353 |
| $a_{TS}^{(2)}$ | 0 | 0 |
| $a_{TS}^{(1)}$ | −22.02440893 | −22.02440893 |
| $b_{TS}^{(2)}$ | 0 | 0 |
| $c_{TS}$ | 0.325179856 | 0.325179856 |
| $a_{TE}^{(4)}$ | 0 | 0 |
| $a_{TE}^{(3)}$ | −248.4374004 | −248.4374004 |
| $a_{TE}^{(2)}$ | −36.57127964 | −36.57127964 |
| $a_{TE}^{(1)}$ | 13.88180854 | 13.88180854 |
| $b_{TE}^{(4)}$ | 0 | 0 |
| $b_{TE}^{(3)}$ | 0.000480119 | 0.000480119 |
| $b_{TE}^{(2)}$ | 0.020416128 | 0.020416128 |
| $c_{TE}$ | 0.240647482 | 0.240647482 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002456326 | 0.002456326 |
| $a_{\psi Si}^{(1)}$ | 0.048553126 | 0.048553126 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 279.6050929 | 279.6050929 |
| $c_{\psi Si}$ | 22.3381295 | 22.3381295 |
| $a_{\theta LT}^{(2)}$ | 0 | 0 |
| $a_{\theta LT}^{(1)}$ | 0.005427275 | 0.005427275 |
| $b_{\theta LT}^{(2)}$ | 0 | 0 |

TABLE 39-continued

Si(100)
First higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $c_{\theta LT}$ | −50.35971223 | −50.35971223 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679 |

TABLE 40

Si(100)
First higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |
| $a_{TE}^{(3)}$ | 0 | 0 |
| $a_{TE}^{(2)}$ | 110.8304316 | 0 |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | 0 |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $d_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513 |

TABLE 41

Si(100)
Second higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −5.687707928 | −5.687707928 |
| $b_{TLT}^{(2)}$ | 0 | 0 |
| $c_{TLT}$ | 0.139506173 | 0.139506173 |
| $a_{TS}^{(2)}$ | 0 | 0 |
| $a_{TS}^{(1)}$ | 5.653643283 | 5.653643283 |
| $b_{TS}^{(2)}$ | 0 | 0 |
| $c_{TS}$ | 0.148148148 | 0.148148148 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.004369706 | −1.004369706 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.255555556 | 0.255555556 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000197083 | −0.000197083 |
| $a_{\psi Si}^{(2)}$ | −0.003376583 | −0.003376583 |
| $a_{\psi Si}^{(1)}$ | 0.118081927 | 0.118081927 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −379.4708632 | −379.4708632 |
| $b_{\psi Si}^{(2)}$ | 278.0521262 | 278.0521262 |
| $c_{\psi Si}$ | 23.14814815 | 23.14814815 |
| $a_{\theta LT}^{(2)}$ | 0 | 0 |
| $a_{\theta LT}^{(1)}$ | 0.128631041 | 0.128631041 |
| $b_{\theta LT}^{(2)}$ | 0 | 0 |
| $c_{\theta LT}$ | −49.32098765 | −49.32098765 |
| $d_{TLTTS}$ | 0 | 0 |
| $d_{TLTTE}$ | 72.43278274 | 72.43278274 |
| $d_{TLT\psi Si}$ | 0.604747502 | 0.604747502 |
| $d_{TLT\theta LT}$ | −1.743618251 | −1.743618251 |
| $d_{TSTE}$ | 0 | 0 |
| $d_{TS\psi Si}$ | 0 | 0 |
| $d_{TS\theta LT}$ | 0.994157261 | 0.994157261 |
| $d_{TE\psi Si}$ | 0 | 0 |
| $d_{TE\theta LT}$ | 0.280889881 | 0.280889881 |
| $d_{\psi Si\theta LT}$ | 0.003095822 | 0.003095822 |
| $e$ | −5.638096455 | −5.638096455 |

TABLE 42

Si(100)
Second higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | 7.809960834 | 4.249755245 |
| $b_{TLT}^{(2)}$ | 0 | 0 |
| $c_{TLT}$ | 0.30962963 | 0.302857143 |
| $a_{TS}^{(2)}$ | 0 | 0 |
| $a_{TS}^{(1)}$ | 0 | −0.800874586 |
| $b_{TS}^{(2)}$ | 0 | 0 |
| $c_{TS}$ | 0 | 0.150714286 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.563479635 | 9.07053135 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148518519 | 0.353571429 |
| $a_{\psi Si}^{(6)}$ | 0 | 0 |

TABLE 42-continued

Si(100)
Second higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{\psi Si}^{(5)}$ | 0 | 0 |
| $a_{\psi Si}^{(4)}$ | 0 | 0 |
| $a_{\psi Si}^{(3)}$ | −0.000160979 | 0 |
| $a_{\psi Si}^{(2)}$ | −0.000757552 | 0.001332545 |
| $a_{\psi Si}^{(1)}$ | 0.095765615 | 0.003836714 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 384.7407407 | 0 |
| $b_{\psi Si}^{(2)}$ | 278.2222222 | 285.0956633 |
| $c_{\psi Si}$ | 21.33333333 | 20.89285714 |
| $a_{\theta LT}^{(2)}$ | 0 | 0 |
| $a_{\theta LT}^{(1)}$ | 0.043185248 | 0.033521037 |
| $b_{\theta LT}^{(2)}$ | 0 | 0 |
| $c_{\theta LT}$ | −50 | −50.92857143 |
| $d_{TLTTS}$ | 0 | 0 |
| $d_{TLTTE}$ | 0 | 0 |
| $d_{TLT\psi Si}$ | −0.383208698 | −0.220029295 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0.974573109 |
| $d_{TE\psi Si}$ | 0 | 0 |
| $d_{TE\theta LT}$ | 1.01389349 | −1.078939399 |
| $d_{\psi Si\theta LT}$ | 0 | 0.002899732 |
| $e$ | −5.569590226 | −5.29442278 |

TABLE 43

Si(100)
Second higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | −1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |

TABLE 43-continued

Si(100)
Second higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408 |

TABLE 44

Si(100)
Second higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 0.35631068 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811 |

TABLE 45

Si(100)
Third higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −16.39135605 | −16.39135605 |
| $b_{TLT}^{(2)}$ | 0 | 0 |
| $c_{TLT}$ | 0.196774194 | 0.196774194 |
| $a_{TS}^{(2)}$ | 0 | 0 |
| $a_{TS}^{(1)}$ | −4.824831305 | −4.824831305 |
| $b_{TS}^{(2)}$ | 0 | 0 |
| $c_{TS}$ | 0.170967742 | 0.170967742 |
| $a_{TE}^{(4)}$ | 0 | 0 |
| $a_{TE}^{(3)}$ | 0 | 0 |
| $a_{TE}^{(2)}$ | −45.57608817 | −45.57608817 |
| $a_{TE}^{(1)}$ | −10.80005563 | −10.80005563 |
| $b_{TE}^{(4)}$ | 0 | 0 |
| $b_{TE}^{(3)}$ | 0 | 0 |
| $b_{TE}^{(2)}$ | 0.018296046 | 0.018296046 |
| $c_{TE}$ | 0.303225806 | 0.303225806 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000172048 | 0.000172048 |
| $a_{\psi Si}^{(2)}$ | −0.00384923 | −0.00384923 |
| $a_{\psi Si}^{(1)}$ | −0.009826773 | −0.009826773 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 143.0843208 | 143.0843208 |
| $b_{\psi Si}^{(2)}$ | 215.8688866 | 215.8688866 |
| $c_{\psi Si}$ | 22.25806452 | 22.25806452 |
| $a_{\theta LT}^{(2)}$ | 0 | 0 |
| $a_{\theta LT}^{(1)}$ | 0.066799879 | 0.066799879 |
| $b_{\theta LT}^{(2)}$ | 0 | 0 |
| $c_{\theta LT}$ | −50.16129032 | −50.16129032 |
| $d_{TLTTS}$ | 0 | 0 |
| $d_{TLTTE}$ | −112.847682 | −112.847682 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | −1.750763196 | −1.750763196 |
| $d_{TS\theta LT}$ | 0 | 0 |
| $d_{TE\psi Si}$ | 0 | 0 |
| $d_{TE\theta LT}$ | 0.466692151 | 0.466692151 |
| $d_{\psi Si\theta LT}$ | 0 | 0 |
| e | −2.904746788 | −2.904746788 |

TABLE 46

Si(100)
Third higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −8.135537689 | −8.135537689 |
| $b_{TLT}^{(2)}$ | 0 | 0 |
| $c_{TLT}$ | 0.311659193 | 0.311659193 |
| $a_{TS}^{(2)}$ | 0 | 0 |
| $a_{TS}^{(1)}$ | −20.38200282 | −20.38200282 |
| $b_{TS}^{(2)}$ | 0 | 0 |
| $c_{TS}$ | 0.149327354 | 0.149327354 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.460675692 | −3.460675692 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.267488789 | 0.267488789 |
| $a_{\psi Si}^{(6)}$ | 0 | 0 |

TABLE 46-continued

Si(100)
Third higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.003759233 | −0.003759233 |
| $a_{\psi Si}^{(1)}$ | 0.015931998 | 0.015931998 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 239.0395946 | 239.0395946 |
| $c_{\psi Si}$ | 18.90134529 | 18.90134529 |
| $a_{\theta LT}^{(2)}$ | 0 | 0 |
| $a_{\theta LT}^{(1)}$ | 0.017576249 | 0.017576249 |
| $b_{\theta LT}^{(2)}$ | 0 | 0 |
| $c_{\theta LT}$ | −49.9103139 | −49.9103139 |
| $d_{TLTTS}$ | −152.1817236 | −152.1817236 |
| $d_{TLTTE}$ | 0 | 0 |
| $d_{TLT\psi Si}$ | −0.359387178 | −0.359387178 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0.911415415 | 0.911415415 |
| $d_{TE\psi Si}$ | 0 | 0 |
| $d_{TE\theta LT}$ | 0.275815872 | 0.275815872 |
| $d_{\psi Si\theta LT}$ | 0 | 0 |
| e | −3.952626598 | −3.952626598 |

TABLE 47

Si(100)
Third higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |

TABLE 47-continued

Si(100)
Third higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $c_{\theta LT}$ | −48.97435897 | −48.97435897 |
| $d_{TLTTS}$ | 0 | 0 |
| $d_{TLTTE}$ | 0 | 0 |
| $d_{TLT\psi Si}$ | −0.816828716 | −0.816828716 |
| $d_{TLT\theta LT}$ | 0.865519967 | 0.865519967 |
| $d_{TSTE}$ | 0 | 0 |
| $d_{TS\psi Si}$ | −0.538336559 | −0.538336559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202 |

TABLE 48

Si(100)
Third higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| e | −4.940340284 | −4.940340284 |

TABLE 49

Si(110)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −16.69742899 | −16.69742899 | −33.56520202 | 0 |
| $b_{TLT}^{(2)}$ | 0 | 0 | 0 | 0 |
| $c_{TLT}$ | 0.1675 | 0.1675 | 0.192857143 | 0 |
| $a_{TS}^{(2)}$ | 0 | 0 | 0 | 0 |
| $a_{TS}^{(1)}$ | 15.90196012 | 15.90196012 | 0 | 0 |
| $b_{TS}^{(2)}$ | 0 | 0 | 0 | 0 |
| $c_{TS}$ | 0.1525 | 0.1525 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 26.3030303 | 0 |
| $a_{TE}^{(1)}$ | 0 | 0 | −6.481053391 | 0 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006326531 | 0 |
| $c_{TE}$ | 0 | 0 | 0.378571429 | 0 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | −0.000183963 | −0.000183963 | 0 | −0.000177142 |
| $a_{\psi Si}^{(2)}$ | −0.003236307 | −0.003236307 | 0 | 0.002186084 |
| $a_{\psi Si}^{(1)}$ | 0.071460688 | 0.071460688 | 0.085067773 | 0.13561432 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | −5768.71875 | −5768.71875 | 0 | 2642.857143 |
| $b_{\psi Si}^{(2)}$ | 399.9375 | 399.9375 | 0 | 500 |
| $c_{\psi Si}$ | 65.25 | 65.25 | 34.28571429 | 55 |
| $a_{\theta LT}^{(2)}$ | 0 | 0 | 0 | −0.005336622 |
| $a_{\theta LT}^{(1)}$ | 0 | 0 | 0.070255628 | 0.032718563 |
| $b_{\theta LT}^{(2)}$ | 0 | 0 | 0 | 65.75963719 |
| $c_{\theta LT}$ | −90 | −90 | −51.42857143 | −50.95238095 |
| $d_{TLTTS}$ | 0 | 0 | 0 | 0 |
| $d_{TLTTE}$ | 0 | 0 | 0 | 0 |
| $d_{TLT\psi Si}$ | 1.873870705 | 1.878870705 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0.716151515 | 0 |
| $d_{\psi Si\theta LT}$ | 0 | 0 | −0.00729303 | 0.002110378 |
| e | −0.957101918 | −0.957101918 | −1.634922542 | −1.290881853 |

TABLE 50

Si(110)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −23.96596978 | −4.695531045 | −7.344438725 | −5.603099398 |
| $b_{TLT}^{(2)}$ | 0 | 0 | 0 | 0 |
| $c_{TLT}$ | 0.34 | 0.3296875 | 0.338983051 | 0.306666667 |
| $a_{TS}^{(2)}$ | 0 | 0 | 0 | 0 |
| $a_{TS}^{(1)}$ | −23.18485905 | 0 | 0 | 0 |
| $b_{TS}^{(2)}$ | 0 | 0 | 0 | 0 |
| $c_{TS}$ | 0.175555556 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −43.48595551 | −70.50554427 | −41.95412638 |
| $a_{TE}^{(1)}$ | 0 | −2.467954545 | −5.460437635 | −2.19025056 |
| $b_{TE}^{(4)}$ | 0 | 0 | 0 | 0 |

TABLE 50-continued

Si(110)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{TE}^{(3)}$ | 0 | 0 | 0 | 0 |
| $b_{TE}^{(2)}$ | 0 | 0.006875 | 0.006716461 | 0.006819556 |
| $c_{TE}$ | 0 | 0.15 | 0.365254237 | 0.360666667 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0.000119479 | −0.000172812 |
| $a_{\psi Si}^{(2)}$ | 0.018474062 | 0 | 0.003987724 | 0.002213009 |
| $a_{\psi Si}^{(1)}$ | 0.059131688 | 0 | −0.047908658 | 0.073831446 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | −2384.203107 | 1647.952 |
| $b_{\psi Si}^{(2)}$ | 81.55555556 | 0 | 216.791152 | 242.24 |
| $c_{\psi Si}$ | 35.33333333 | 0 | 30.76271186 | 62.6 |
| $a_{\theta LT}^{(2)}$ | 0 | 0 | 0 | 0 |
| $a_{\theta LT}^{(1)}$ | 0.009475371 | 0 | 0.026725166 | 0 |
| $b_{\theta LT}^{(2)}$ | 0 | 0 | 0 | 0 |
| $c_{\theta LT}$ | −49.33333333 | −90 | −49.83050847 | −90 |
| $d_{TLTTS}$ | 0 | 0 | 0 | 0 |
| $d_{TLTTE}$ | 0 | 0 | 0 | 42.3018696 |
| $d_{TLT\psi Si}$ | 0 | 0 | 0 | 0 |
| $d_{TLT\theta LT}$ | 0.617240199 | 0 | 0 | 0 |
| $d_{TSTE}$ | 0 | 0 | 0 | 0 |
| $d_{TS\psi Si}$ | 2.612107038 | 0 | 0 | 0 |
| $d_{TS\theta LT}$ | 2.129359248 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.871101002 | 0 | 0 | 0 |
| e | −2.851861362 | −2.210765625 | −2.573237288 | −2.440604203 |

TABLE 51

Si(110)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −10.87353735 | −17.74612134 | −16.74814911 | −16.74814911 |
| $b_{TLT}^{(2)}$ | 0 | 0 | 0 | 0 |
| $c_{TLT}$ | 0.167045455 | 0.158227848 | 0.168032787 | 0.168032787 |
| $a_{TS}^{(2)}$ | 92.14417413 | 275.6432031 | 0 | 0 |
| $a_{TS}^{(1)}$ | −6.141913324 | −0.713377524 | −9.071522271 | −9.071522271 |
| $b_{TS}^{(2)}$ | 0.004213585 | 0.004749239 | 0 | 0 |
| $c_{TS}$ | 0.339772727 | 0.317721519 | 0.314754098 | 0.314754098 |
| $a_{TE}^{(4)}$ | 0 | 0 | 0 | 0 |
| $a_{TE}^{(3)}$ | 0 | 0 | 0 | 0 |
| $a_{TE}^{(2)}$ | −37.82699975 | 0 | 0 | 0 |
| $a_{TE}^{(1)}$ | 4.315324766 | 3.259148162 | −5.270739047 | −5.270739047 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.007147469 | 0 | 0 | 0 |
| $c_{TE}$ | 0.153409091 | 0.138607595 | 0.356557377 | 0.356557377 |
| $a_{\psi Si}^{(6)}$ | 0 | 0 | −3.73552E−09 | −3.73552E−09 |
| $a_{\psi Si}^{(5)}$ | 0 | 0 | −4.69013E−08 | −4.69013E−08 |
| $a_{\psi Si}^{(4)}$ | 0 | 0 | 1.07773E−05 | 1.07773E−05 |
| $a_{\psi Si}^{(3)}$ | 0.000254041 | −0.000266841 | 5.64997E−05 | 5.64997E−05 |
| $a_{\psi Si}^{(2)}$ | 0.00704637 | 0.003350583 | −0.007526984 | −0.007526984 |
| $a_{\psi Si}^{(1)}$ | −0.123432463 | 0.05687546 | −0.035719404 | −0.035719404 |
| $b_{\psi Si}^{(6)}$ | 0 | 0 | 1801696668 | 1801696668 |
| $b_{\psi Si}^{(5)}$ | 0 | 0 | 6726299.443 | 6726299.443 |
| $b_{\psi Si}^{(4)}$ | 0 | 0 | 1035415.498 | 1035415.498 |
| $b_{\psi Si}^{(3)}$ | −1197.310014 | 2539.305207 | 3573.665857 | 3573.665857 |

TABLE 51-continued

| | Si(110) First higher-order mode $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(2)}$ | 188.2457386 | 286.0358917 | 720.1088417 | 720.1088417 |
| $c_{\psi Si}$ | 28.125 | 63.60759494 | 48.19672131 | 48.19672131 |
| $a_{\theta LT}^{(2)}$ | 0 | 0 | 0 | 0 |
| $a_{\theta LT}^{(1)}$ | 0.046748629 | 0.00460971 | 0 | 0 |
| $b_{\theta LT}^{(2)}$ | 0 | 0 | 0 | 0 |
| $c_{\theta LT}$ | −51.59090909 | −50.75949367 | −90 | −90 |
| $d_{TLTTS}$ | 0 | 0 | 0 | 0 |
| $d_{TLTTE}$ | 0 | 105.3055279 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 58.63016883 | 0 | 0 | 0 |
| $d_{TS\psi Si}$ | 0.443510572 | 0.274149566 | 0 | 0 |
| $d_{TS\theta LT}$ | 0 | 0 | 0 | 0 |
| $d_{TE\psi Si}$ | 0.293912516 | −0.280924747 | 0 | 0 |
| $d_{TE\theta LT}$ | 0 | 0.457718571 | 0 | 0 |
| $d_{\psi Si\theta LT}$ | 0 | −0.005165328 | 0 | 0 |
| e | −1.722804167 | −2.484892701 | −2.976959016 | −2.976959016 |

TABLE 52

| | Si(110) First higher-order mode $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 39.48011293 |
| $a_{TLT}^{(1)}$ | −5.239160454 | −5.820942031 | −4.867344296 | −2.496300587 |
| $b_{TLT}^{(2)}$ | 0 | 0 | 0 | 0.00654321 |
| $c_{TLT}$ | 0.309375 | 0.302702703 | 0.286363636 | 0.288888889 |
| $a_{TS}^{(2)}$ | 24.40391167 | 40.38499201 | 0 | 40.45660337 |
| $a_{TS}^{(1)}$ | −2.128595361 | −6.73354721 | −3.626479228 | −6.290401812 |
| $b_{TS}^{(2)}$ | 0.006013184 | 0.005624543 | 0 | 0.005617284 |
| $c_{TS}$ | 0.3265625 | 0.275675676 | 0.31 | 0.272222222 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −51.46488975 | 0 | 0 |
| $a_{TE}^{(1)}$ | −1.921891837 | −0.509929613 | −1.508039016 | −0.870147512 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006479182 | 0 | 0 |
| $c_{TE}$ | 0.153125 | 0.147297297 | 0.341818182 | 0.351388889 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | −0.000165117 | 0 | −9.55404E−05 |
| $a_{\psi Si}^{(2)}$ | 0.000936051 | 0.00475603 | 0 | 0.002198207 |
| $a_{\psi Si}^{(1)}$ | −0.02141106 | 0.040196571 | −0.017752634 | 0.036260775 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 2115.829763 | 0 | 1531.394676 |
| $b_{\psi Si}^{(2)}$ | 246.9177246 | 196.5668371 | 0 | 199.8263889 |
| $c_{\psi Si}$ | 24.140625 | 57.97297297 | 21.13636364 | 60.41666667 |
| $a_{\theta LT}^{(2)}$ | 0 | 0 | 0 | −0.003220943 |
| $a_{\theta LT}^{(1)}$ | 0.023743346 | 0.023741003 | 0.038368027 | 0.005042496 |
| $b_{\theta LT}^{(2)}$ | 0 | 0 | 0 | 72.22222222 |
| $c_{\theta LT}$ | −50.078125 | −48.51351351 | −50.81818182 | −50 |
| $d_{TLTTS}$ | 0 | 0 | 0 | −43.45862557 |
| $d_{TLTTE}$ | −35.16960363 | −48.00382984 | 23.6423037 | 52.46703277 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |

TABLE 52-continued

Si(110)
First higher-order mode
$0.2 \leq T_{LT} \leq 3.5$
$0.2 \leq T_S \leq 2.0$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $d_{TE\psi Si}$ | 0 | 0 | 0 | 0 |
| $d_{TE\theta LT}$ | 0.234382842 | 0 | 0 | −0.273892853 |
| $d_{\psi Si\theta LT}$ | 0 | −0.00130658 | −0.001221935 | 0 |
| e | −2.175330984 | −2.239116787 | −2.271294054 | −2.496300587 |

TABLE 53

Si(110)
First higher-order mode
$0 < T_{LT} < 0.2$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 0 | 0 |
| $a_{TLT}^{(1)}$ | −7.587457615 | −7.587457615 | −7.587457615 | −7.587457615 |
| $b_{TLT}^{(2)}$ | 0 | 0 | 0 | 0 |
| $c_{TLT}$ | 0.174380165 | 0.174380165 | 0.174380165 | 0.174380165 |
| $a_{TS}^{(2)}$ | 0 | 0 | 0 | 0 |
| $a_{TS}^{(1)}$ | −3.979714537 | −3.979714537 | −3.979714537 | −3.979714537 |
| $b_{TS}^{(2)}$ | 0 | 0 | 0 | 0 |
| $c_{TS}$ | 0.150413223 | 0.150413223 | 0.150413223 | 0.150413223 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −0.865040993 | −0.865040993 | −0.865040993 | −0.865040993 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.245867769 | 0.245867769 | 0.245867769 | 0.245867769 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 5.87537E−07 | 5.87537E−07 | 5.87537E−07 | 5.87537E−07 |
| $a_{\psi Si}^{(3)}$ | −8.59015E−07 | −8.59015E−07 | −8.59015E−07 | −8.59015E−07 |
| $a_{\psi Si}^{(2)}$ | −0.001948222 | −0.001948222 | −0.001948222 | −0.001948222 |
| $a_{\psi Si}^{(1)}$ | −0.027558032 | −0.027558032 | −0.027558032 | −0.027558032 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 1129197.497 | 1129197.497 | 1129197.497 | 1129197.497 |
| $b_{\psi Si}^{(3)}$ | −1524.372996 | −1524.372996 | −1524.372996 | −1524.372996 |
| $b_{\psi Si}^{(2)}$ | 776.3813947 | 776.3813947 | 776.3813947 | 776.3813947 |
| $c_{\psi Si}$ | 41.52892562 | 41.52892562 | 41.52892562 | 41.52892562 |
| $a_{\theta LT}^{(2)}$ | 0 | 0 | 0 | 0 |
| $a_{\theta LT}^{(1)}$ | 0.018744549 | 0.018744549 | 0.018744549 | 0.018744549 |
| $b_{\theta LT}^{(2)}$ | 0 | 0 | 0 | 0 |
| $c_{\theta LT}$ | −49.25619835 | −49.25619835 | −49.25619835 | −49.25619835 |
| $d_{TLTTS}$ | 140.6234074 | 140.6234074 | 140.6234074 | 140.6234074 |
| $d_{TLTTE}$ | −25.20654793 | −25.20654793 | −25.20654793 | −25.20654793 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0 | 0 | 0 | 0 |
| e | −1.78.9519626 | −1.789519626 | −1.789519626 | −1.789519626 |

TABLE 54

Si(110)
Second higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 39.68139696 | 39.68139696 |
| $a_{TLT}^{(1)}$ | −3.912934705 | −3.912934705 | −3.801935963 | −3.801935963 |
| $b_{TLT}^{(2)}$ | 0 | 0 | 0.00692398 | 0.00692398 |
| $c_{TLT}$ | 0.306451613 | 0.306451613 | 0.297857143 | 0.297857143 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 1.912614784 | 1.912614784 | −6.089810932 | −6.089810932 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.148924731 | 0.148924731 | 0.347857143 | 0.347857143 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 8.78847E−06 | 8.78847E−06 |
| $a_{\psi Si}^{(2)}$ | −0.0004718 | −0.0004718 | −0.000160567 | −0.000160567 |
| $a_{\psi Si}^{(1)}$ | 0.003265633 | 0.003265633 | −0.023574651 | −0.023574651 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 2351.597668 | 2351.597668 |
| $b_{\psi Si}^{(2)}$ | 847.4765869 | 847.4765869 | 880.2091837 | 880.2091837 |
| $c_{\psi Si}$ | 35.32258065 | 35.32258065 | 43.07142857 | 43.07142857 |
| $a_{\theta LT}^{(2)}$ | 0.005014741 | 0.005014741 | 0 | 0 |
| $a_{\theta LT}^{(1)}$ | 0.023115164 | 0.023115164 | 0.030121011 | 0.030121011 |
| $b_{\theta LT}^{(2)}$ | 67.0626662 | 67.0626662 | 0 | 0 |
| $c_{\theta LT}$ | −49.62365591 | −49.62365591 | −51.28571429 | −51.28571429 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0.125572529 | 0.125572529 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.563162206 | 0.563162206 | −0.417002414 | −0.417002414 |
| $d_{\psi Si\theta LT}$ | 0 | 0 | 0 | 0 |
| e | −2.002512986 | −2.002512986 | −2.550158637 | −2.550158637 |

TABLE 55

Si(110)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | 2.992014692 | 2.992014692 | −1.461725087 | −1.461725087 |
| $b_{TLT}^{(2)}$ | 0 | 0 | 0 | 0 |
| $c_{TLT}$ | 0.156390977 | 0.156390977 | 0.155345912 | 0.155345912 |
| $a_{TS}^{(2)}$ | 0 | 0 | 0 | 0 |
| $a_{TS}^{(1)}$ | −9.089925228 | −9.089925228 | −1.247751383 | −1.247751383 |
| $b_{TS}^{(2)}$ | 0 | 0 | 0 | 0 |
| $c_{TS}$ | 0.305263158 | 0.305263158 | 0.327672956 | 0.327672956 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −130.6388144 | −130.6388144 |
| $a_{TE}^{(1)}$ | 5.773590917 | 5.773590917 | −0.010504162 | −0.010504162 |
| $b_{TE}^{(4)}$ | 0 | 0 | 0 | 0 |

TABLE 55-continued

Si(110)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{TE}^{(3)}$ | 0 | 0 | 0 | 0 |
| $b_{TE}^{(2)}$ | 0 | 0 | 0.006662711 | 0.006662711 |
| $c_{TE}$ | 0.166541353 | 0.166541353 | 0.341823899 | 0.341823899 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 1.03604E−05 | 1.03604E−05 |
| $a_{\psi Si}^{(2)}$ | −0.000377109 | −0.000377109 | −0.000138558 | −0.000138558 |
| $a_{\psi Si}^{(1)}$ | −0.013702515 | −0.013702515 | −0.028102653 | −0.028102653 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 3096.349671 | 3096.349671 |
| $b_{\psi Si}^{(2)}$ | 792.2381141 | 792.2381141 | 957.6361695 | 957.6361695 |
| $c_{\psi Si}$ | 41.39097744 | 41.39097744 | 43.20754717 | 43.20754717 |
| $a_{\theta LT}^{(2)}$ | 0 | 0 | 0 | 0 |
| $a_{\theta LT}^{(1)}$ | 0.015804666 | 0.015804666 | 0.028892246 | 0.028892246 |
| $b_{\theta LT}^{(2)}$ | 0 | 0 | 0 | 0 |
| $c_{\theta LT}$ | −49.32330827 | −49.32330827 | −49.62264151 | −49.62264151 |
| $d_{TLTTS}$ | 0 | 0 | −44.5976835 | −44.5976835 |
| $d_{TLTTE}$ | 80.90186655 | 80.90186655 | −150.2428298 | −150.2428298 |
| $d_{TLT\psi Si}$ | 0 | 0 | 0.225109644 | 0.225109644 |
| $d_{TLT\theta LT}$ | 0 | 0 | 0 | 0 |
| $d_{TSTE}$ | 29.68261053 | 29.68261053 | 47.35851038 | 47.35851038 |
| $d_{TS\psi Si}$ | 0.136750854 | 0.136750854 | 0 | 0 |
| $d_{TS\theta LT}$ | 0 | 0 | 0 | 0 |
| $d_{TE\psi Si}$ | −0.146211814 | −0.146211814 | 0 | 0 |
| $d_{TE\theta LT}$ | 0.41229257 | 0.41229257 | 0 | 0 |
| $d_{\psi Si\theta LT}$ | 0 | 0 | 0 | 0 |
| e | −2.596813807 | −2.596813807 | −2.049341112 | −2.049341112 |

TABLE 56

Si(110)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −2.80791074 | −2.80791074 | 0 | 0 |
| $b_{TLT}^{(2)}$ | 0 | 0 | 0 | 0 |
| $c_{TLT}$ | 0.3069869 | 0.3069869 | 0 | 0 |
| $a_{TS}^{(2)}$ | 0 | 0 | 0 | 0 |
| $a_{TS}^{(1)}$ | −5.618098986 | −5.618098986 | 0 | 0 |
| $b_{TS}^{(2)}$ | 0 | 0 | 0 | 0 |
| $c_{TS}$ | 0.286462882 | 0.286462882 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −73.23839461 | −73.23839461 |
| $a_{TE}^{(1)}$ | 8.962154821 | 8.962154821 | −5.710295136 | −5.710295136 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007310763 | 0.007310763 |
| $c_{TE}$ | 0.167467249 | 0.167467249 | 0.330930233 | 0.330930233 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.003677309 | 0.003677309 | 0 | 0 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 56-continued

Si(110)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(2)}$ | 0 | 0 | 0 | 0 |
| $c_{\psi Si}$ | 40.93886463 | 40.93886463 | 0 | 0 |
| $a_{\theta LT}^{(2)}$ | 0.00527863 | 0.00527863 | 0 | 0 |
| $a_{\theta LT}^{(1)}$ | 0.008431458 | 0.008431458 | 0 | 0 |
| $b_{\theta LT}^{(2)}$ | 66.00179249 | 66.00179249 | 0 | 0 |
| $c_{\theta LT}$ | −50.61135371 | −50.61135371 | −90 | −90 |
| $d_{TLTTS}$ | 63.6265441 | 63.6265441 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 57.20229582 | 57.20229582 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | −0.098212695 | −0.098212695 | 0 | 0 |
| $d_{TE\theta LT}$ | 0.32576925 | 0.32576925 | 0 | 0 |
| $d_{\psi Si\theta LT}$ | 0 | 0 | 0 | 0 |
| e | −2.431352404 | −2.431352404 | −2.39032093 | −2.39032093 |

TABLE 57

Si(110)
Third higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −11.04825287 | −11.04825287 | −11.04825287 | −11.04825287 |
| $b_{TLT}^{(2)}$ | 0 | 0 | 0 | 0 |
| $c_{TLT}$ | 0.164705882 | 0.164705882 | 0.164705882 | 0.164705882 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.86806521 | −12.86806521 | −12.86806521 | −12.86806521 |
| $a_{TE}^{(1)}$ | 39.88235294 | 39.88235294 | 39.88235294 | 39.88235294 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.019258131 | 0.019258131 | 0.019258131 | 0.019258131 |
| $c_{TE}$ | 0.286470588 | 0.286470588 | 0.286470588 | 0.286470588 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.000762445 | −0.000762445 | −0.000762445 | −.000762445 |
| $a_{\psi Si}^{(1)}$ | −0.031584918 | −0.031584918 | −0.031584918 | −0.031584918 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 749.7716263 | 749.7716263 | 749.7716263 | 749.7716263 |
| $c_{\psi Si}$ | 52.58823529 | 52.58823529 | 52.58823529 | 52.58823529 |
| $a_{\theta LT}^{(2)}$ | −0.004115091 | −0.004115091 | −0.004115091 | −0.004115091 |
| $a_{\theta LT}^{(1)}$ | 0.023260981 | 0.023260981 | 0.023260981 | 0.023260981 |
| $b_{\theta LT}^{(2)}$ | 81.16262976 | 81.16262976 | 81.16262976 | 81.16262976 |
| $c_{\theta LT}$ | −50.11764706 | −50.11764706 | −50.11764706 | −50.11764706 |
| $d_{TLTTS}$ | 0 | 0 | 0 | 0 |
| $d_{TLTTE}$ | −32.35244505 | −32.35244505 | −32.35244505 | −32.35244505 |
| $d_{TLT\psi Si}$ | 0.348515389 | 0.348515389 | 0.348515389 | 0.348515389 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |

TABLE 57-continued

Si(110)
Third higher-order mode
$0 < T_{LT} < 0.2$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.000823202 | 0.000823202 | 0.000823202 | 0.000823202 |
| e | −1.678155024 | −1.678155024 | −1.678155024 | −1.678155024 |

TABLE 58

Si(110)
Third higher-order mode
$0.2 \leq T_{LT} \leq 3.5$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $d_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |
| $d_{TS\theta LT}$ | 0 | 0 | 0 | 0 |
| $d_{TE\psi Si}$ | 0.081014811 | 0.081014811 | 0 | 0 |
| $d_{TE\theta LT}$ | 0 | 0 | −0.194432704 | −0.194432704 |
| $d_{\psi Si\theta LT}$ | 0 | 0 | 0.000875955 | 0000875955 |
| e | −2.543790382 | −2.543790382 | −2.964933907 | −2.964933907 |

TABLE 59

Si(110)
Third higher-order mode
$0 < T_{LT} < 0.2$
$0.2 \leq T_S \leq 2.0$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 60 | 0 ≤ $\psi_{Si}$ < 45 | 45 ≤ $\psi_{Si}$ ≤ 60 |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | −54.97015257 | −54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015 |

TABLE 60

Si(110)
Third higher-order mode
$0.2 \leq T_{LT} \leq 3.5$
$0.2 \leq T_S \leq 2.0$

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.14098252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |

TABLE 60-continued

Si(110)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.413434 | −1267.413434 | 1811.750092 | 0 |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $d_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| e | −2.390757235 | −2.390757235 | −2.548464154 | −2.523994879 |

TABLE 61

Si(111)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.883915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 61-continued

Si(111)
First higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $d_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |
| $d_{TE\psi Si}$ | −0.613440559 | 0 | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.553295028 | −1.074792989 | −1.290770348 | −1.165057152 |

TABLE 62

Si(111)
First higher-order mode
$0.2 \le T_{LT} \le 3.5$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | −24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.02112516 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1635802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 0 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $d_{TLT\theta LT}$ | −0.785540829 | −0.785540829 | 0 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |

TABLE 62-continued

Si(111)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468 |

TABLE 63

Si(111)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | −15.38083251 | −11.91949736 |
| $b_{TS}^{(2)}$ | 0.004461166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33195 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | −161.2345526 | 0 |
| $d_{TLT\psi Si}$ | −0.827435588 | 0 | 0 | 1.107475984 |
| $d_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084 |

TABLE 64

Si(111)
First higher-order mode
$0.2 \leq T_{LT} \leq 3.5$
$0.2 \leq T_S \leq 2.0$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |
| $a_{\theta LT}^{(1)}$ | −0.017420386 | −0.012240534 | 0 | 0 |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132 |

TABLE 65

Si(111)
Second higher-order mode
$0 < T_{LT} < 0.2$
$0 \leq T_S < 0.2$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | −10.04988717 | 5.027045348 | −5.686378626 |
| $b_{TE}^{(4)}$ | 0 | 0 | 0 | 0 |

TABLE 65-continued

Si(111)
Second higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | −0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 125.0280404 | 0 |
| $c_{\psi Si}$ | 9.683544304 | 50 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.451355926 | 0 |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691 |

TABLE 66

Si(111)
Second higher-order mode
$0.2 \le T_{LT} \le 3.5$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 45.51074293 | −94.44342524 | 0 |
| $a_{TLT}^{(1)}$ | 0.788515154 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 9.791468713 | 0.170587985 | −0.71523762 | −10.72534988 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 66-continued

Si(111)
Second higher-order mode
$0.2 \leq T_{LT} \leq 3.5$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 30 | 30 ≤ $\psi_{Si}$ ≤ 60 | 0 ≤ $\psi_{Si}$ < 30 | 30 ≤ $\psi_{Si}$ ≤ 60 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |
| $d_{TE\psi Si}$ | 0 | 0.20688896 | 0 | 0 |
| $d_{TE\theta LT}$ | 0.774150432 | 0.439880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612 |

TABLE 67

Si(111)
Second higher-order mode
$0 < T_{LT} < 0.2$
$0.2 \leq T_S \leq 2.0$

| | 0.05 ≤ $T_E$ < 0.25 | | 0.25 ≤ $T_E$ ≤ 0.45 | |
|---|---|---|---|---|
| | 0 ≤ $\psi_{Si}$ < 30 | 30 ≤ $\psi_{Si}$ ≤ 60 | 0 ≤ $\psi_{Si}$ < 30 | 30 ≤ $\psi_{Si}$ ≤ 60 |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 0 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.41666667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |

TABLE 67-continued

Si(111)
Second higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| e | −2.770026639 | −2.638591885 | −1.980941925 | −2.412296494 |

TABLE 68

Si(111)
Second higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 86.18383552 | 0 |
| $a_{TE}^{(1)}$ | 3.853394073 | 8.768511808 | −1.867550529 | −15.68616064 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |
| $b_{\theta LT}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | 0 |
| $d_{TLT\theta LT}$ | 0 | 0 | 0 | −0.608943868 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | 0 |
| $d_{\psi Si\theta LT}$ | 0 | 0 | 0 | 0 |
| e | −2.401219798 | −3.18651044 | −3.93030224 | −4.143483981 |

TABLE 69

Si(111)
Third higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |
| $b_{TLT}^{(2)}$ | 0 | 0 | 0 | 0 |
| $c_{TLT}$ | 0.160869565 | 0.160869565 | 0.160869565 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| e | −0.277577227 | −0.277577227 | −0.277577227 | −0.277577227 |

TABLE 70

Si(111)
Third higher-order mode
$0.2 \le T_{LT} \le 3.5$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | −215.3850281 | −215.3850281 | −215.3850281 | −215.3850281 |
| $a_{TE}^{(3)}$ | 54.12265846 | 54.12265846 | 54.12265846 | 54.12265846 |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |

TABLE 70-continued

Si(111)
Third higher-order mode
$0.2 \leq T_{LT} \leq 3.5$
$0 \leq T_S < 0.2$

| | 0.05 ≤ $T_E$ < 0.25 | | 0.25 ≤ $T_E$ ≤ 0.45 | |
|---|---|---|---|---|
| | 0 ≤ $\psi_{Si}$ < 30 | 30 ≤ $\psi_{Si}$ ≤ 60 | 0 ≤ $\psi_{Si}$ < 30 | 30 ≤ $\psi_{Si}$ ≤ 60 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 45.80413521 | 45.80413521 | 45.80413521 | 45.80413524 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| e | −0.446604617 | −0.446604617 | −0.446604617 | −0.446604617 |

TABLE 71

Si(111)
Third higher-order mode
$0 < T_{LT} < 0.2$
$0.2 \leq T_S \leq 2.0$

| | 0.05 ≤ $T_E$ < 0.25 | | 0.25 ≤ $T_E$ ≤ 0.45 | |
|---|---|---|---|---|
| | 0 ≤ $\psi_{Si}$ < 30 | 30 ≤ $\psi_{Si}$ ≤ 60 | 0 ≤ $\psi_{Si}$ < 30 | 30 ≤ $\psi_{Si}$ ≤ 60 |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |

TABLE 71-continued

Si(111)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.024454063 | 0.024454063 | 0.024454063 | 0.024454063 |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |

TABLE 72

Si(111)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |
| $b_{\theta LT}^{(2)}$ | 0 | 0 | 0 | 0 |
| $c_{\theta LT}$ | −48.52941176 | −48.52941176 | −48.52941176 | −48.52941176 |
| $d_{TLTTS}$ | −0.04933649 | −0.04933649 | −0.04933649 | −0.04933649 |
| $d_{TLTTE}$ | −0.021023839 | −0.021023839 | −0.021023839 | −0.021023839 |
| $d_{TLT\psi Si}$ | 0 | 0 | 0 | 0 |
| $d_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |

TABLE 72-continued

| | Si(111)<br>Third higher-order mode<br>$0.2 \leq T_{LT} \leq 3.5$<br>$0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485 |

The inventors of preferred embodiments of the present invention have examined how the strength of the responses of the first higher-order mode, the second higher-order mode, and the third higher-order mode change by variously changing the design parameters of $T_{LT}$, $\theta_{LT}$, $T_S$, $T_E$, $\psi_{Si}$, and $T_{Si}$.

As the strength of response of the higher-order mode when the parameters are changed, the absolute value of S11 was determined. A smaller decibel value of the absolute value of S11 indicates a higher strength of the response of the higher-order mode. In the case of calculating S11, the intersecting width of the electrode fingers was 20λ, the number of pairs of the electrode fingers was 94, and S11 was determined by a two-dimensional finite element method using an electrode single-pair model.

The interdigital transducer electrodes had a structure in which metal films were stacked in order of Ti/Pt/Ti/Al from the piezoelectric body side. The thickness of the interdigital transducer electrodes was changed by changing the thickness of the Pt film. As the wave length-normalized film thickness $T_E$ of the interdigital transducer electrodes, a wave length-normalized film thickness in terms of aluminum thickness was determined using the total mass of the interdigital transducer electrodes estimated from the density of each of the metal films.

First Higher-Order Mode

Figure 3:
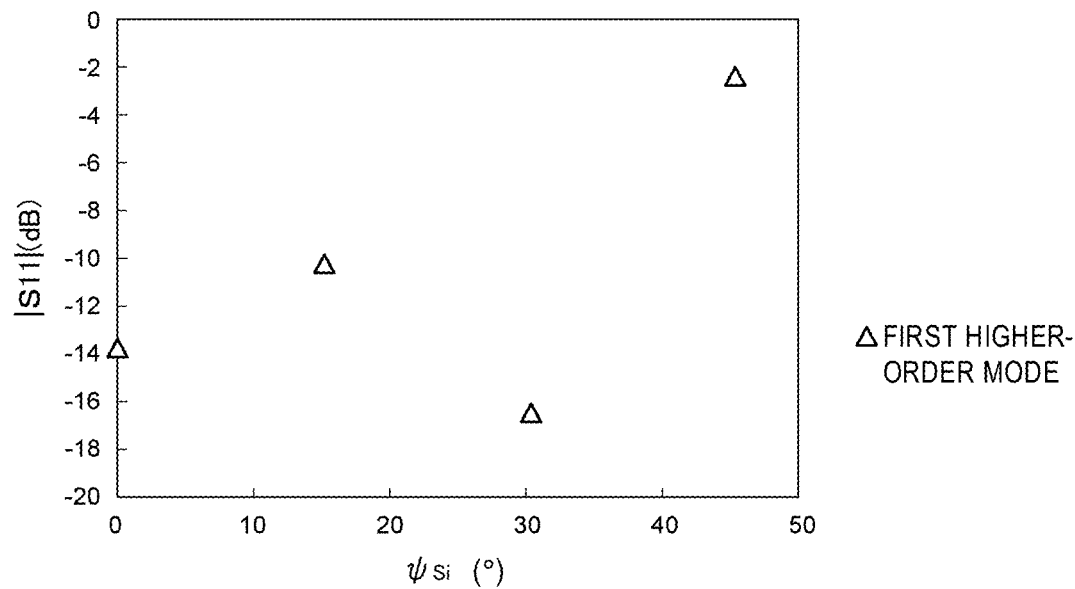
FIG. 3 illustrates the relationship between the propagation direction $\psi_{Si}$ in a single-crystal Si layer and the strength S11 of the response of a first higher-order mode.

An acoustic wave resonator having the admittance characteristics illustrated in FIG. 2 is used as a reference structure. FIGS. 3 to 7 each illustrate a change in the strength S11 of the response of the first higher-order mode when the parameters are changed with respect to the reference structure. FIG. 3 indicates that the strength S11 of the response of the first higher-order mode changes when the propagation direction $\psi_{Si}$ in the single-crystal Si layer changes from about 0° to about 45° with respect to the reference structure.

Figure 4:
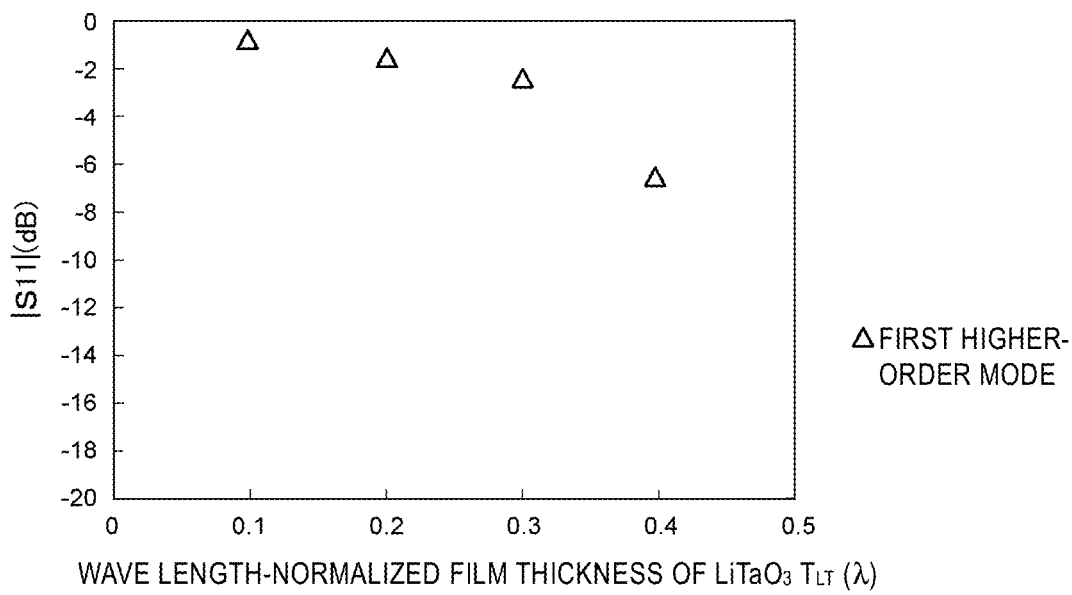
FIG. 4 illustrates the relationship between the wave length-normalized film thickness $T_{LT}$ of a piezoelectric body made of lithium tantalate and the strength S11 of the response of the first higher-order mode.

Similarly, FIG. 4 indicates that the strength S11 of the response of the first higher-order mode changes also when the wave length-normalized film thickness $T_{LT}$ of the piezoelectric body made of lithium tantalate changes.

Figure 5:
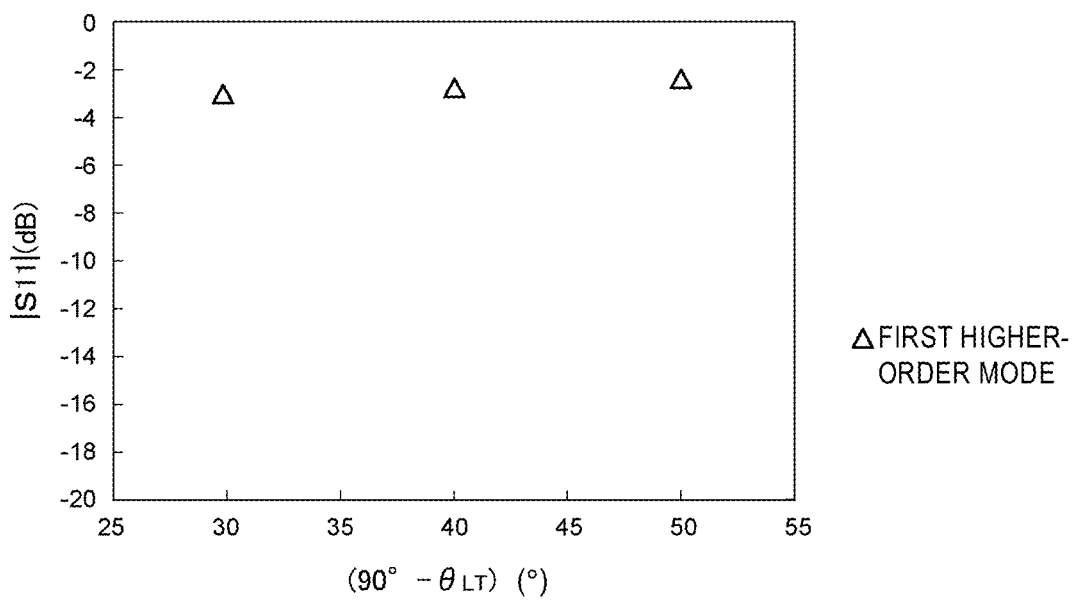
FIG. 5 illustrates the relationship between the cut angle $(90°+\theta_{LT})$ of a piezoelectric body made of lithium tantalate and the strength S11 of the response of the first higher-order mode.

As illustrated in FIG. 5, the strength S11 of the response of the first higher-order mode changes also when the cut angle (90°+$\theta_{LT}$) of the piezoelectric body made of lithium tantalate changes.

Figure 6:
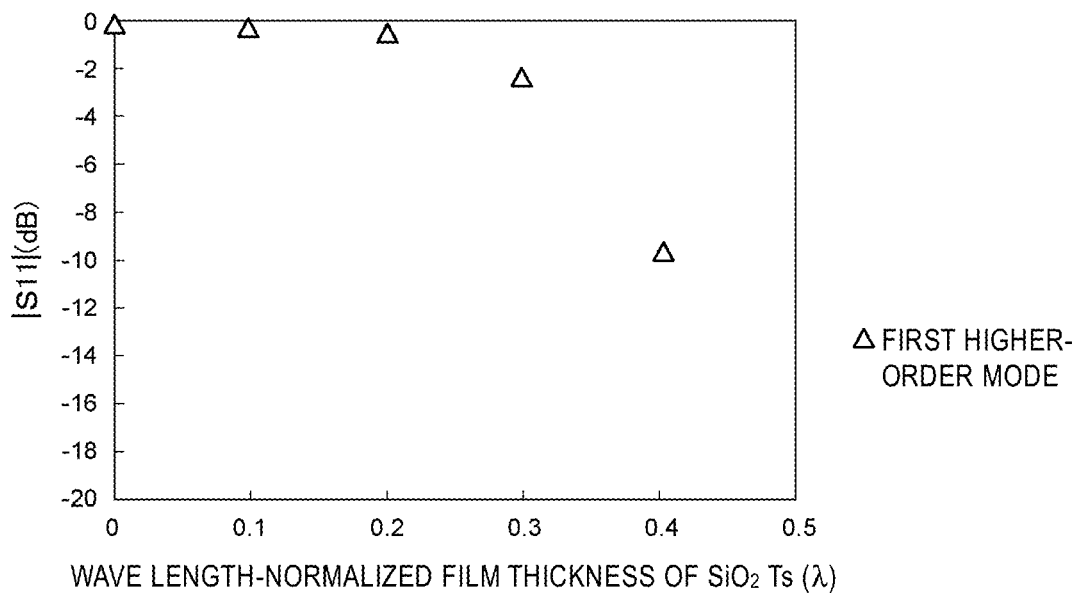
FIG. 6 illustrates the relationship between the wave length-normalized film thickness $T_S$ of a SiO$_2$ film and the strength S11 of the response of the first higher-order mode.

As illustrated in FIG. 6, the strength S11 of the response of the first higher-order mode changes also when the wave length-normalized film thickness $T_S$ of the $SiO_2$ film changes.

Figure 7:
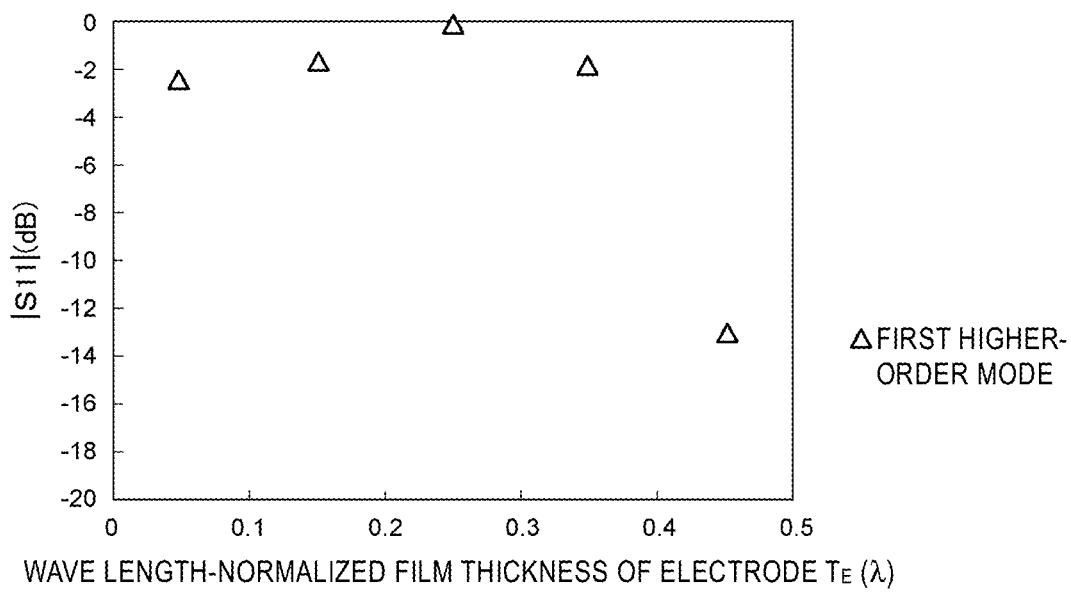
FIG. 7 illustrates the relationship between the wave length-normalized film thickness $T_E$ of interdigital transducer electrodes and the strength S11 of the response of the first higher-order mode.

As illustrated in FIG. 7, the strength S11 of the response of the first higher-order mode changes also when the wave length-normalized film thickness $T_E$ of the interdigital transducer electrodes in terms of Al thickness changes.

FIGS. 3 to 7 indicate that the strength of the response of the first higher-order mode is able to be adjusted by changing these parameters. That is, the strength of the response of the first higher-order mode is able to be reduced by selecting the values of the parameters while the response of the main mode is maintained.

From the calculation results of FIGS. 3 to 7 and the like, the inventors of preferred embodiments of the present invention have derived the fact that $I_h$ corresponding to the strength of the response of the higher-order mode is determined from the Formula (1) described above and the coefficients a, b, c, d, and e in Tables 37 to 72.

The inventors of preferred embodiments of the present invention have discovered that the coefficients in Formula (1) are values presented in Table 37 to 40, Tables 49 to 52, or Tables 61 to 64 in accordance with the ranges of the crystal orientation of the single-crystal Si layer, the wave length-normalized film thickness $T_{LT}$ of the piezoelectric body made of lithium tantalate, the wave length-normalized film thickness $T_S$ of the $SiO_2$ film, the wave length-normalized film thickness $T_E$ of the interdigital transducer electrodes, and the propagation direction $\psi_{Si}$ in the single-crystal Si layer. Thus, the conditions of $T_{LT}$, $\theta_{LT}$, $T_S$, $T_E$, and $\psi_{Si}$ when $I_{h1}$ corresponding to the strength of the response of the first higher-order mode is more than about −2.4 are determined.

In a multiplexer in which multiple acoustic wave filters are connected at one terminal of each filter, the response of a higher-order mode in any one of the multiple acoustic wave filters is required to have a strength S11 of more than about −2.4 dB. This is because the influence on transmission characteristics of acoustic wave filters other than the one of the multiple acoustic wave filters is negligible. In cellular phones and the like, for example, usually, ripples appearing in a pass band of a filter are required to be about −0.8 dB or more from the viewpoint of ensuring the receiver sensitivity. It has been discovered that in the case where a higher-order mode of one acoustic wave filter is in the pass band of another acoustic wave filter, ripples having a strength of about ⅓ of the strength of the response of the higher-order mode occur in the pass band of another filter. Thus, in order to achieve ripples having a magnitude of about −0.8 dB or more in the pass band of another filter, the strength S11 of the response of the higher-order mode of one filter may be more than about −2.4 dB.

Additionally, in the acoustic wave device 1 according to the first preferred embodiment, $T_{Si}$>20.

Regarding the first higher-order mode, $I_h$ is larger than about −2.4 ($I_h$>−2.4), and $T_{Si}$ is larger than about 20 ($T_{Si}$>20). It is thus possible to effectively reduce or prevent the influence of the response of the first higher-order mode on the pass band of another acoustic wave filter. This will be described with reference to FIGS. 8 to 11.

Figure 8:
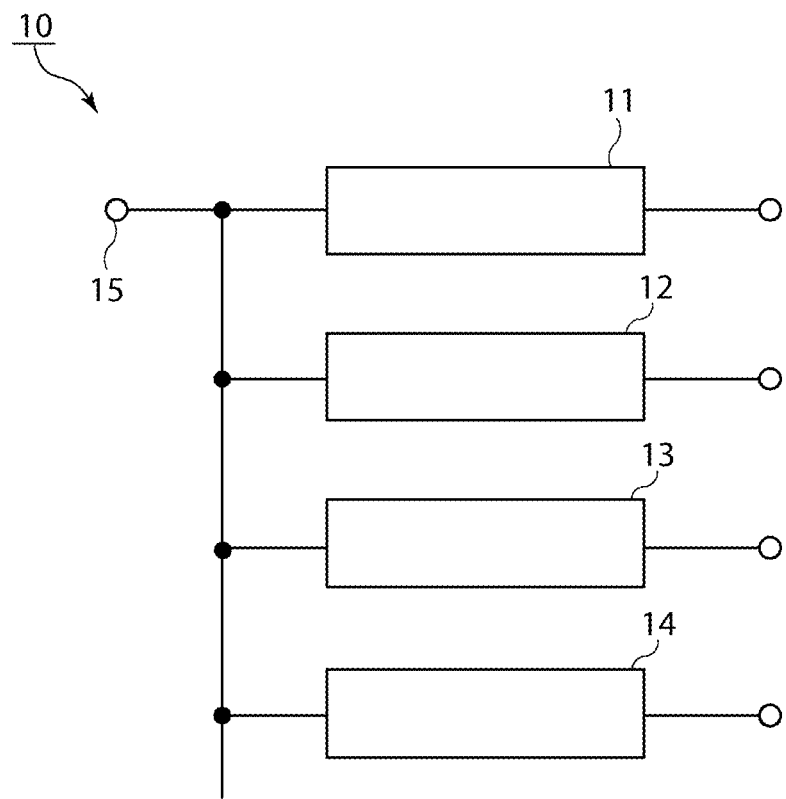
FIG. 8 is a circuit diagram of a multiplexer including an acoustic wave device according to the first preferred embodiment of the present invention.
Figure 9:
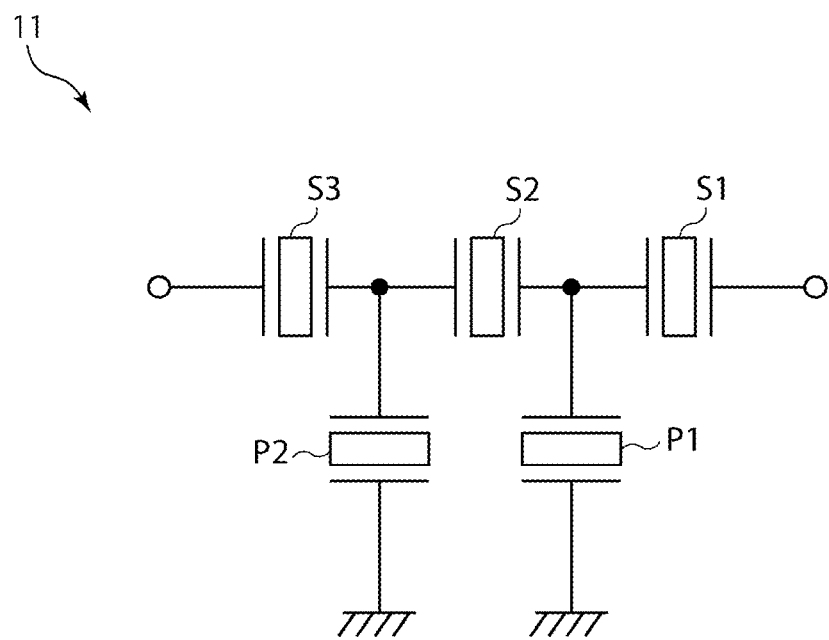
FIG. 9 is a circuit diagram of an acoustic wave filter that includes the acoustic wave device according to the first preferred embodiment of the present invention and is used in a multiplexer.

FIG. 8 is a circuit diagram of a multiplexer. In a multiplexer 10, first to fourth acoustic wave filters 11 to 14 are commonly connected on the antenna terminal 15 side. FIG. 9 is a circuit diagram of a first acoustic wave filter 11. The first acoustic wave filter 11 includes multiple series-arm resonators S1 to S3 and multiple parallel-arm resonators P1 and P2. That is, the first acoustic wave filter 11 is a ladder filter. The series-arm resonators S1 to S3 and the parallel-arm resonators P1 and P2 are defined by the acoustic wave devices 1.

In preferred embodiments of the present invention, the circuit configuration of the acoustic wave filter including the acoustic wave device is not limited thereto. For example, an acoustic wave filter including a longitudinally coupled resonator acoustic wave filter may be used. In this case, the longitudinally coupled resonator acoustic wave filter may be the acoustic wave device. An acoustic wave resonator coupled to the longitudinally coupled resonator acoustic wave filter may be defined by the acoustic wave device according to preferred embodiments of the present invention.

Pass bands of the first to fourth acoustic wave filters 11 to 14 are referred to as a first pass band to a fourth pass band. Regarding the frequency positions, preferably, first pass band<second pass band<third pass band<fourth pass band.

Figure 10A:
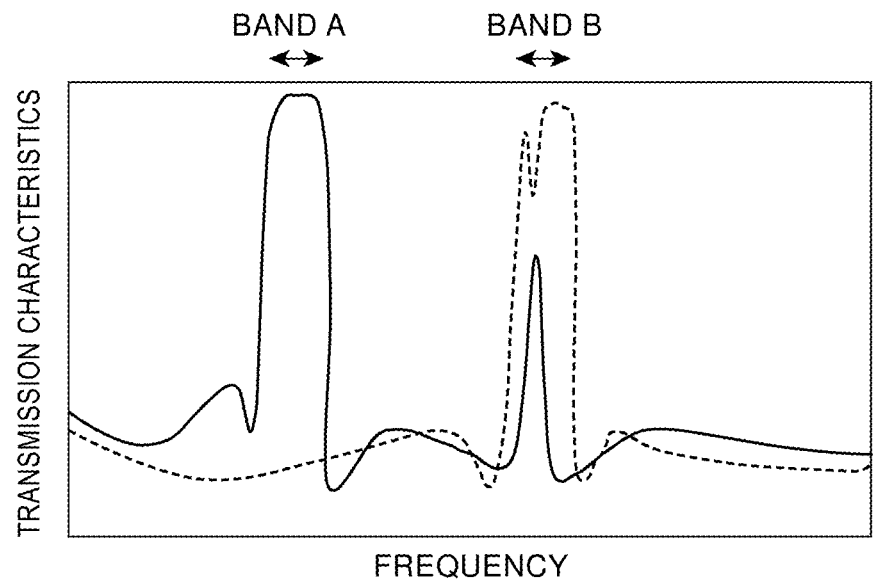
FIG. 10A illustrates the filter characteristics of a multiplexer including an acoustic wave device of a comparative example.

For comparison, a multiplexer including a first acoustic wave filter according to a comparative example was provided as in the foregoing preferred embodiment, except that the acoustic wave resonator having the reference structure described above was used. That is, in the multiplexer of the comparative example, the acoustic wave resonator having the reference structure and having the admittance characteristics illustrated in FIG. 2 was used in place of the acoustic wave device 1 of the present preferred embodiment described above. FIG. 10A illustrates filter characteristics of the first acoustic wave filter and a second acoustic wave filter in the multiplexer of the comparative example. A solid line indicates the filter characteristics of the first acoustic wave filter. A broken line indicates the filter characteristics of the second acoustic wave filter. Band A indicates the pass band of the first acoustic wave filter. Band B indicates the pass band of the second acoustic wave filter. A large ripple appears in the second pass band. This is because the response of the first higher-order mode of the acoustic wave resonator used in the first acoustic wave filter largely appears.

Figure 10B:
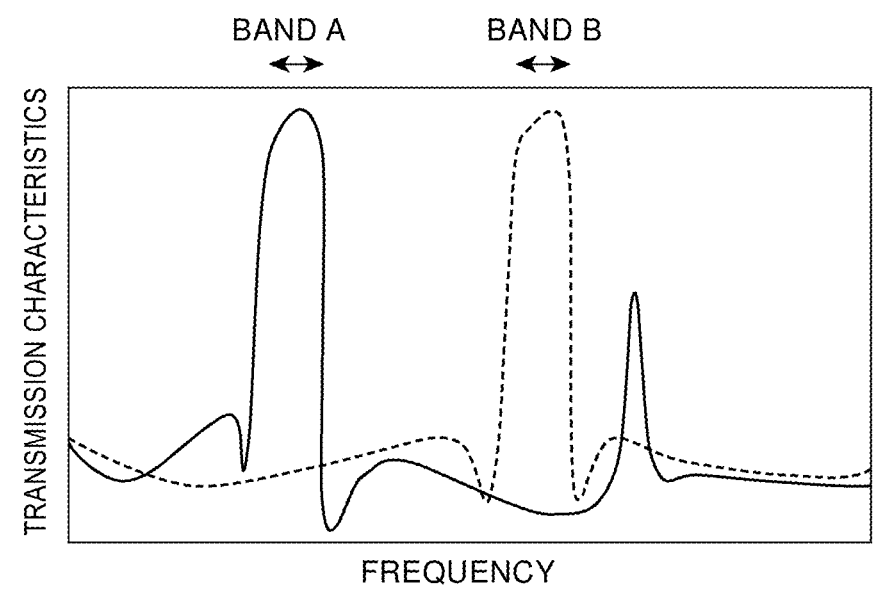
FIG. 10B illustrates the filter characteristics of a multiplexer according to the first preferred embodiment of the present invention.

FIG. 10B illustrates filter characteristics of a multiplexer according to a preferred embodiment of the present invention. A solid line indicates the filter characteristics of the first acoustic wave filter. A broken line indicates the filter characteristics of the second acoustic wave filter. Here, the first acoustic wave filter is defined by the acoustic wave device according to the foregoing preferred embodiment. Thus, a large ripple does not appear in the second pass band. That is, in the pass band of the second acoustic wave filter, which is another filter, a large ripple does not appear. Thus, the filter characteristics of the second acoustic wave filter are not easily degraded.

As described above, in the multiplexer according to a preferred embodiment of the present invention, the response of the first higher-order mode is reduced or prevented in the acoustic wave filter including the acoustic wave device according to a preferred embodiment of the present invention. It is thus possible to effectively reduce or prevent the deterioration of the filter characteristics of another acoustic wave filter having a higher-frequency pass band than the acoustic wave filter.

Figure 11:
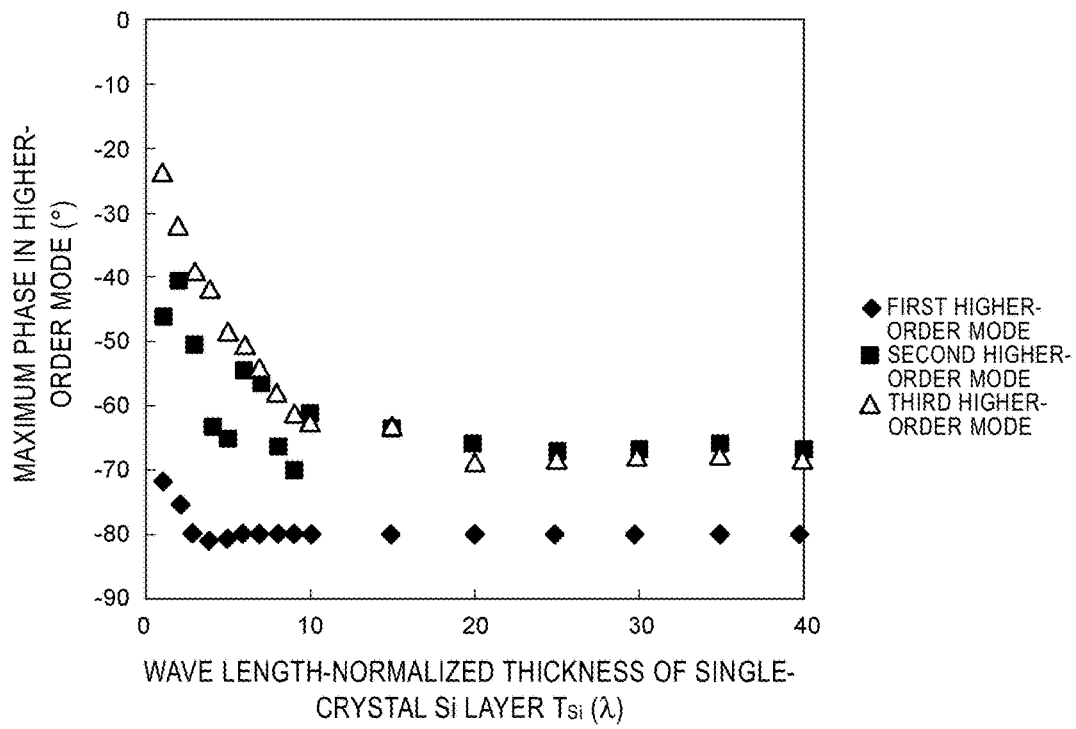
FIG. 11 illustrates the relationship between the wave length-normalized film thickness of a single-crystal Si layer and the maximum phases of responses of the first, second, and third higher-order modes.

FIG. 11 illustrates the relationship between the wave length-normalized film thickness of the single-crystal Si layer 2 and the maximum phases of responses of the first, second, and third higher-order modes. FIG. 11 indicates that when $T_{Si}>20$, it is possible to effectively reduce or prevent the strength of the response of each of the first higher-order mode, the second higher-order mode, and the third higher-order mode.

Second Higher-Order Mode

Figure 12:
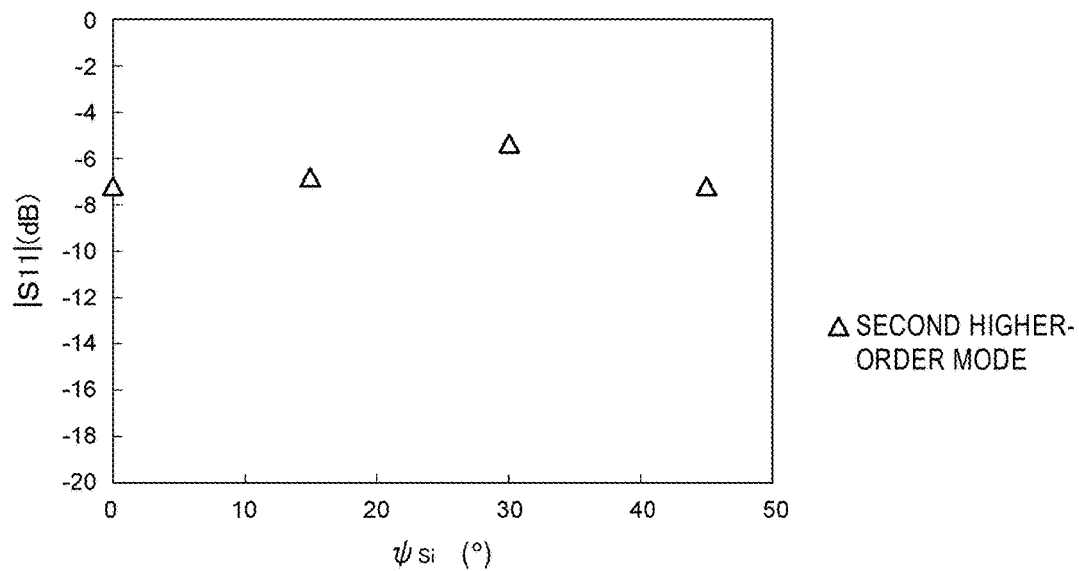
FIG. 12 illustrates the relationship between the propagation direction $\psi_{Si}$ in a single-crystal Si layer and the strength S11 of the response of the second higher-order mode.
Figure 13:
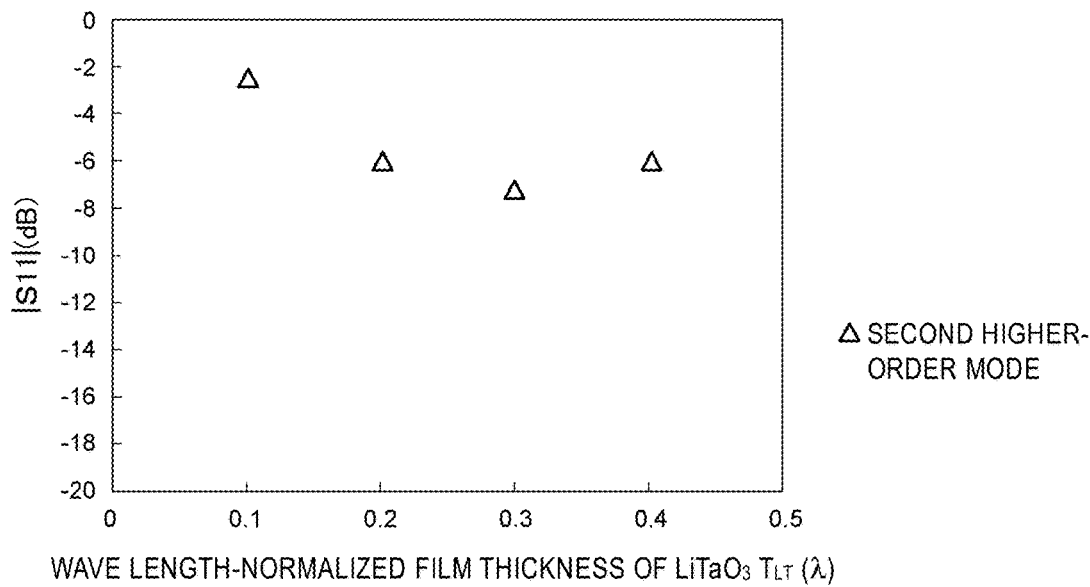
FIG. 13 illustrates the relationship between the wave length-normalized film thickness $T_{LT}$ of a piezoelectric body made of lithium tantalate and the strength S11 of the response of the second higher-order mode.
Figure 14:
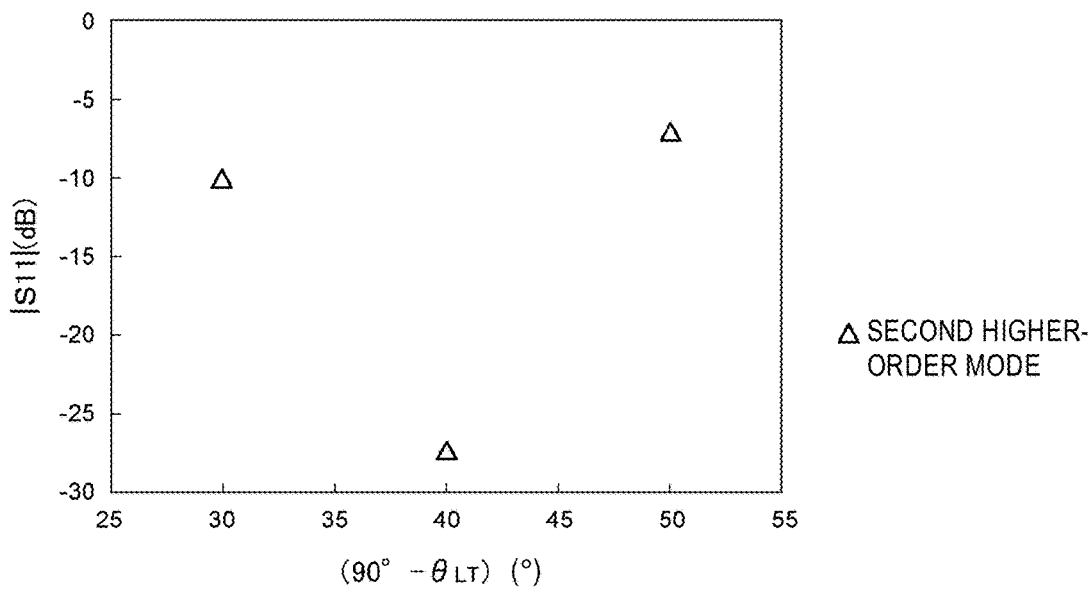
FIG. 14 illustrates the relationship between the cut angle $(90°+\theta_{LT})$ of a piezoelectric body made of lithium tantalate and the strength S11 of the response of the second higher-order mode.
Figure 15:
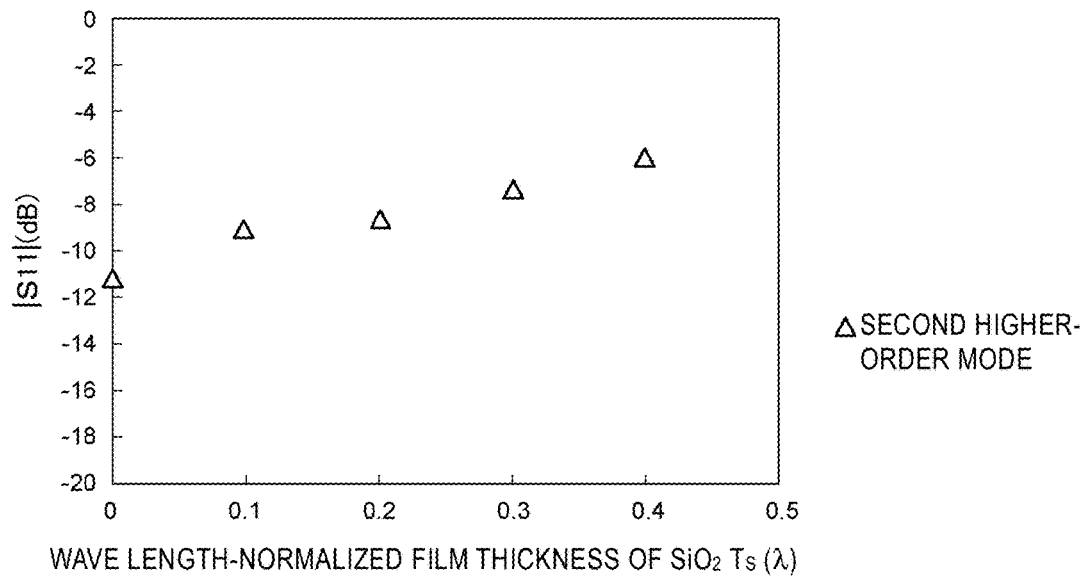
FIG. 15 illustrates the relationship between the wavelength-normalized film thickness $T_S$ of a SiO$_2$ film and the strength S11 of the response of the second higher-order mode.
Figure 16:
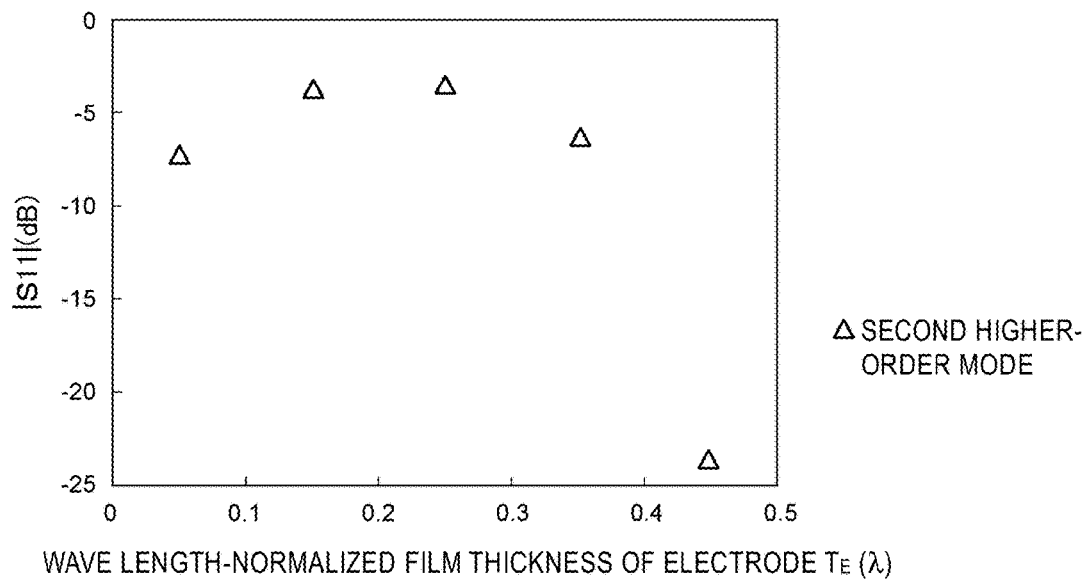
FIG. 16 illustrates the relationship between the wavelength-normalized film thickness $T_E$ of interdigital transducer electrodes and the strength S11 of the response of the second higher-order mode.

FIG. 12 illustrates the relationship between the propagation direction $\psi_{Si}$ in the single-crystal Si layer and the strength S11 of the response of the second higher-order mode. As is apparent from FIG. 12, the strength S11 of the response of the second higher-order mode changes when $\psi_{Si}$ changes. Similarly, as illustrated in FIG. 13, the strength S11 of the response of the second higher-order mode changes when the wave length-normalized film thickness $T_{LT}$ of the piezoelectric body made of lithium tantalate changes. As illustrated in FIG. 14, the strength S11 of the response of the second higher-order mode changes also when the cut angle $(90°+\theta_{LT})$ of the piezoelectric body made of lithium tantalate changes. As illustrated in FIG. 15, the strength S11 of the response of the second higher-order mode changes also when the wave length-normalized film thickness $T_S$ of the SiO$_2$ film changes. As illustrated in FIG. 16, the strength S11 of the response of the second higher-order mode changes also when the wave length-normalized film thickness $T_E$ of the interdigital transducer electrodes in terms of Al changes.

From the calculation results of FIGS. 12 to 16 and the like, similarly to the case of the first higher-order mode, the coefficients in Formula (1) for expressing $I_{h2}$ corresponding to the strength of the response of the second higher-order mode were determined. When the coefficients of Formula (1) are set as described in Tables 41 to 44, Tables 53 to 56, or Tables 65 to 68 in accordance with ranges of the orientation of the single-crystal Si layer of (100), (110), or (111), the wave length-normalized film thickness $T_{LT}$ of the piezoelectric body made of lithium tantalate, the wave length-normalized film thickness $T_S$ of the SiO$_2$ film, the wave length-normalized film thickness $T_E$ of the interdigital transducer electrodes, and the propagation direction $\psi_{Si}$, $I_{h2}$ corresponding to the strength of the response of the second higher-order mode are able to be expressed. In particular, in the case where the conditions of $T_{LT}$, $\theta_{LT}$, $T_S$, $T_E$, and $\psi_{Si}$ when $I_{h2}$ is about −2.4 or more are determined and where $T_{Si}$ is larger than about 20 ($T_{Si}>20$), the response of the second higher-order mode is also able to be sufficiently reduced.

Third Higher-Order Mode

Figure 17:
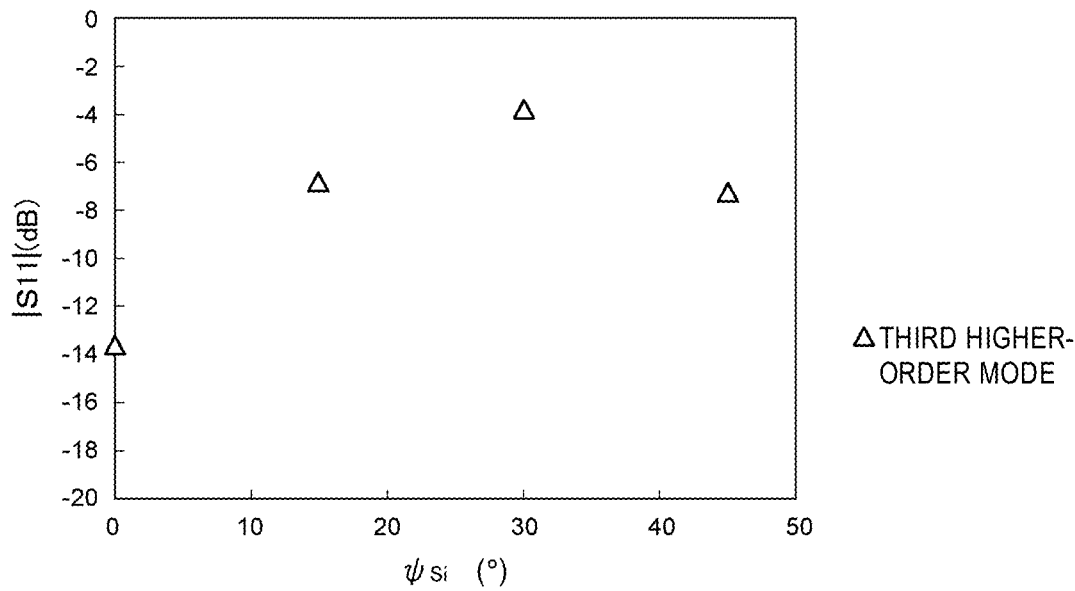
FIG. 17 illustrates the relationship between the propagation direction $\psi_{Si}$ in a single-crystal Si layer and the strength S11 of the response of the third higher-order mode.
Figure 18:
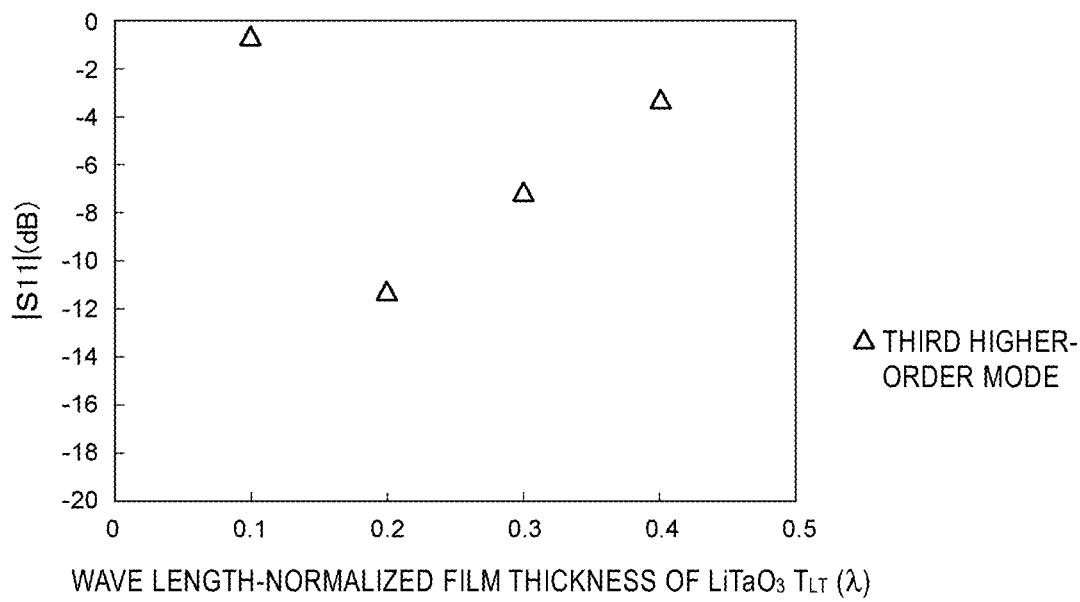
FIG. 18 illustrates the relationship between the wavelength-normalized film thickness $T_{LT}$ of a piezoelectric body made of lithium tantalate and the strength S11 of the response of the third higher-order mode.
Figure 19:
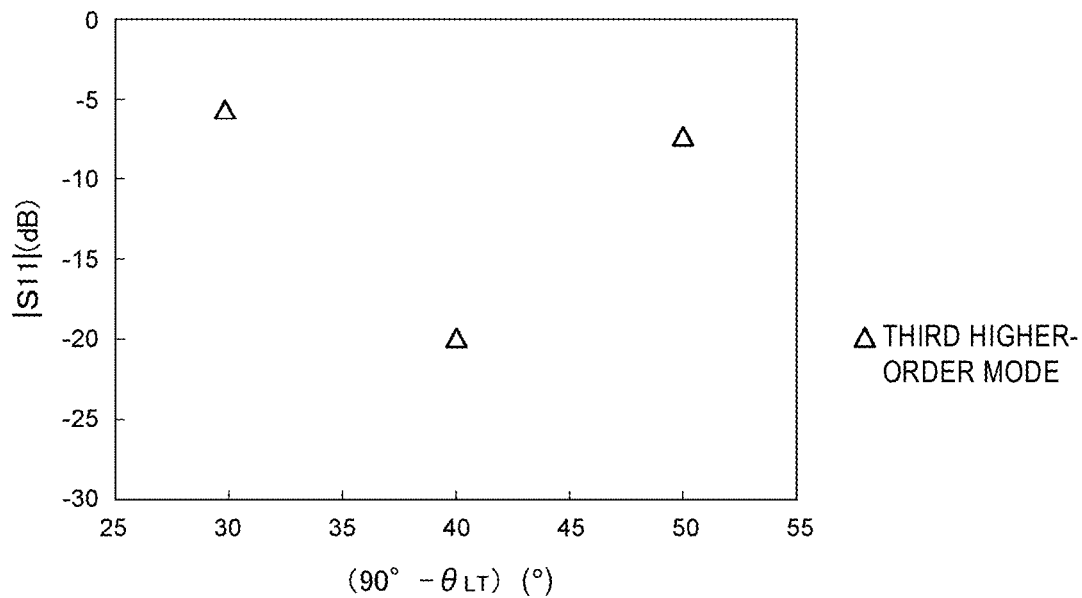
FIG. 19 illustrates the relationship between the cut angle (90°+$\theta_{LT}$) of a piezoelectric body made of lithium tantalate and the strength S11 of the response of the third higher-order mode.
Figure 20:
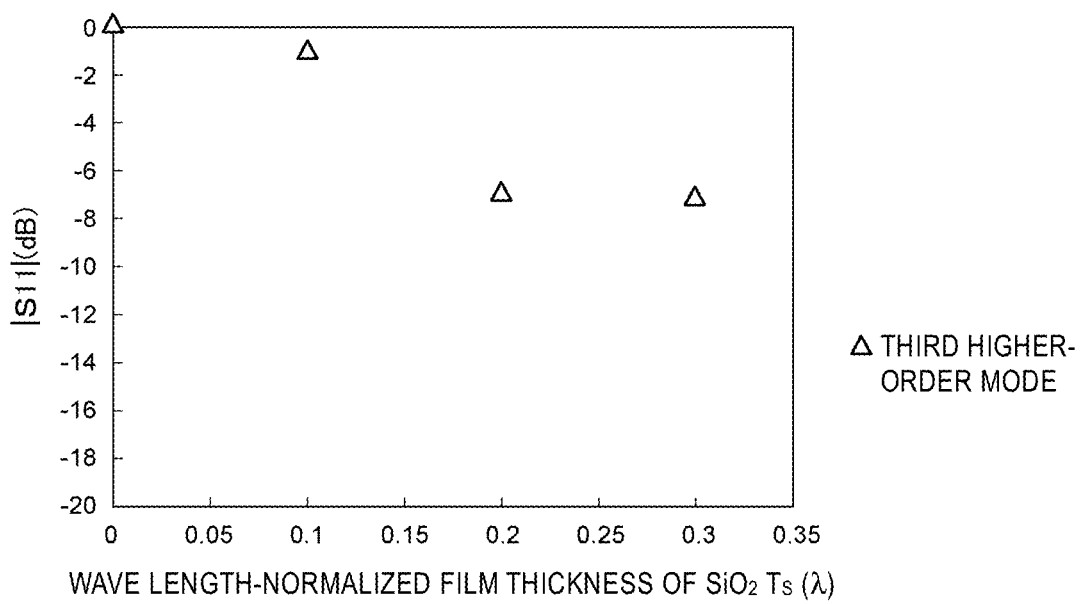
FIG. 20 illustrates the relationship between the wavelength-normalized film thickness $T_S$ of a SiO$_2$ film and the strength S11 of the response of the third higher-order mode.
Figure 21:
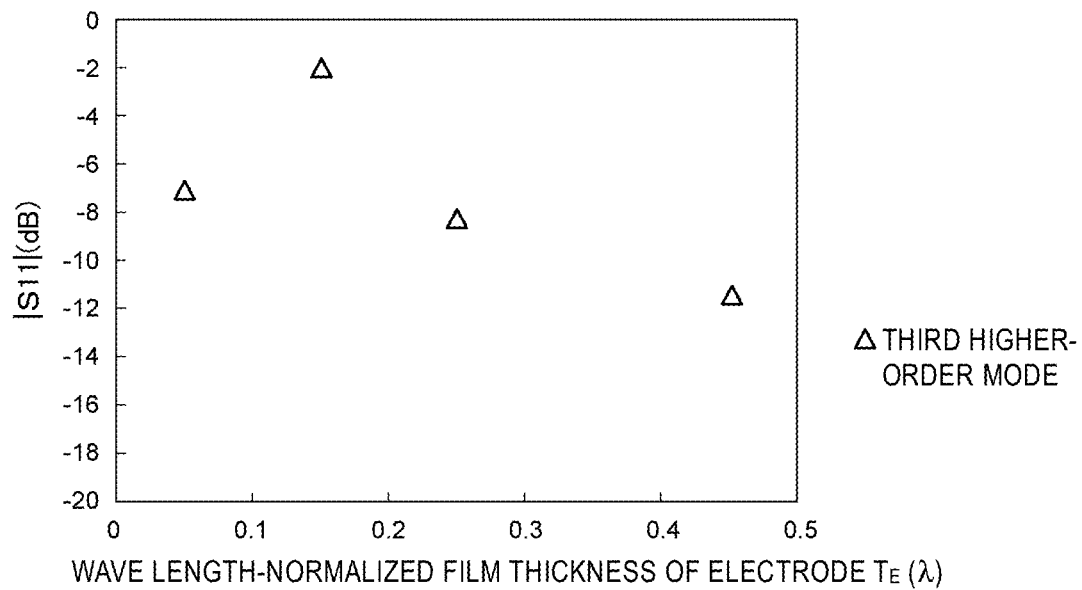
FIG. 21 illustrates the relationship between the wavelength-normalized film thickness $T_E$ of interdigital transducer electrodes and the strength S11 of the response of the third higher-order mode.

FIG. 17 illustrates the relationship between the propagation direction $\psi_{Si}$ in the single-crystal Si layer and the strength S11 of the response of the third higher-order mode. As is apparent from FIG. 17, the strength S11 of the response of the third higher-order mode changes when $\psi_{Si}$ changes. Similarly, as illustrated in FIG. 18, the strength S11 of the response of the third higher-order mode changes also when the wave length-normalized film thickness $T_{LT}$ of the piezoelectric body made of lithium tantalate changes. As illustrated in FIG. 19, the strength S11 of the response of the third higher-order mode changes also when the cut angle $(90°+\theta_{LT})$ of the piezoelectric body made of lithium tantalate changes. As illustrated in FIG. 20, the strength S11 of the response of the third higher-order mode changes also when the wave length-normalized film thickness $T_S$ of the SiO$_2$ film changes. As illustrated in FIG. 21, the strength S11 of the response of the third higher-order mode changes also when the wave length-normalized film thickness $T_E$ of the interdigital transducer electrodes in terms of Al changes.

From FIGS. 17 to 21 and the like, the coefficients in Formula (1) for expressing $I_{h3}$ corresponding to the strength of the response of the third higher-order mode were determined. When the coefficients of Formula (1) are set as described in Tables 45 to 48, Tables 57 to 60, or Tables 69 to 72 in accordance with ranges of the orientation of the single-crystal Si layer of (100), (110), or (111), the wave length-normalized film thickness $T_{LT}$ of the piezoelectric body made of lithium tantalate, the wave length-normalized film thickness $T_S$ of the SiO$_2$ film, the wave length-normalized film thickness $T_E$ of the interdigital transducer electrodes, and the propagation direction $\psi_{Si}$, $I_{h3}$ corresponding to the strength of the response of the third higher-order mode are able to be expressed. In particular, in the case where the conditions of $T_{LT}$, $\theta_{LT}$, $T_S$, $T_E$, and $\psi_{Si}$ when $I_{h3}$ is about −2.4 or more are determined and where $T_{Si}$ is larger than about 20 ($T_{Si}$>20), the response of the third higher-order mode is able to also be sufficiently reduced.

Regarding $I_h$ for all of the first higher-order mode, the second higher-order mode, and the third higher-order mode, $I_h$>−about 2.4 is preferable. In this case, it is possible to effectively reduce or prevent the influence of the first to third higher-order modes on another acoustic wave filter. Regarding $I_h$ for the first higher-order mode and the second higher-order mode, $I_h$ for the first higher-order mode and the third higher-order mode, or $I_h$ for the second higher-order mode and the third higher-order mode, $I_h$>about −2.4 may preferably be used. In this case, it is possible to reduce or prevent the influence of two higher-order modes selected from the first to third higher-order modes.

In the case of using the structure of preferred embodiments of the present invention, as described above, a higher-order mode tends to be confined in a portion where the SiO$_2$ film 3 and the piezoelectric body 4 are stacked. However, in the case where the piezoelectric body 4 has a thickness of about 3.5λ or less, the stacked portion of the SiO$_2$ film 3 and the piezoelectric body 4 has a small thickness. Thus, the higher-order mode is not easily confined therein.

More preferably, the piezoelectric body 4 made of lithium tantalate has a thickness of about 2.5λ or less, for example. In this case, the absolute value of the temperature coefficient of frequency TCF is able to be reduced. Even more preferably, the piezoelectric body 4 made of lithium tantalate has a thickness of about 1.5λ or less, for example. In this case, the electromechanical coupling coefficient is able to be easily adjusted. Still even more preferably, the piezoelectric body 4 made of lithium tantalate has a thickness of about 0.5λ or less, for example. In this case, the electromechanical coupling coefficient is able to be easily adjusted in a wide range.

In Formula (1), a) In the case of using Si(100) (Euler angles ($\varphi_{Si}$=0±5°, $\theta_{Si}$=0±5°, $\psi_{Si}$)), the range of $\psi_{Si}$ is preferably 0°≤$\psi_{Si}$≤45°, for example. However, from the symmetry of the crystal structure of Si(100), $\psi_{Si}$ and $\psi_{Si}$±(n×90°) have the same meaning (where n=1, 2, 3 . . . ). Similarly, $\psi_{Si}$ and −$\psi_{Si}$ have the same meaning.

b) In the case of using Si(110) (Euler angles ($\varphi_{Si}$=−45±5°, $\theta_{Si}$=−90±5°, $\psi_{Si}$)), the range of $\psi_{Si}$ is preferably 0°≤$\psi_{Si}$≤90°, for example. However, from the symmetry of the crystal structure of Si(110), $\psi_{Si}$ and $\psi_{Si}$±(n×180°) have the same meaning (where n=1, 2, 3 . . . ). Similarly, $\psi_{Si}$ and −$\psi_{Si}$ have the same meaning.

c) In the case of using Si(111) (Euler angles ($\varphi_{Si}$=−45±5°, $\theta_{Si}$=−54.73561±5°, $\psi_{Si}$)), the range of $\psi_{Si}$ is preferably 0°≤$\psi_{Si}$≤60° for example. However, from the symmetry of the crystal structure of Si(111), $\psi_{Si}$ and $\psi_{Si}$±(n×120°) have the same meaning (where n=1, 2, 3 . . . ). Similarly, $\psi_{Si}$ and −$\psi_{Si}$ have the same meaning.

The range of $\theta_{LT}$ is −180°<$\theta_{LT}$≤0°. $\theta_{LT}$ and $\theta_{LT}$+180° may be treated as having the same meaning.

In this specification, for example, the range of "0°±5°" in the Euler angles (0°±5°, θ, 0°±15°) means within the range about −5° or more and about +5° or less. The range of 0°±15° means within the range of about −15° or more and about +15° or less.

Figure 22:
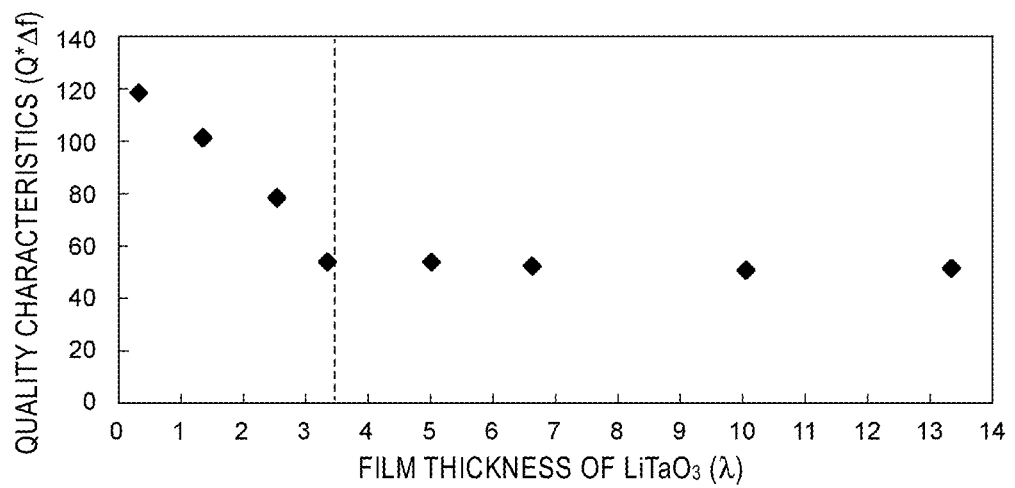
FIG. 22 illustrates the relationship between the film thickness of a LiTaO$_3$ film in an acoustic wave device and the quality factor.
Figure 23:
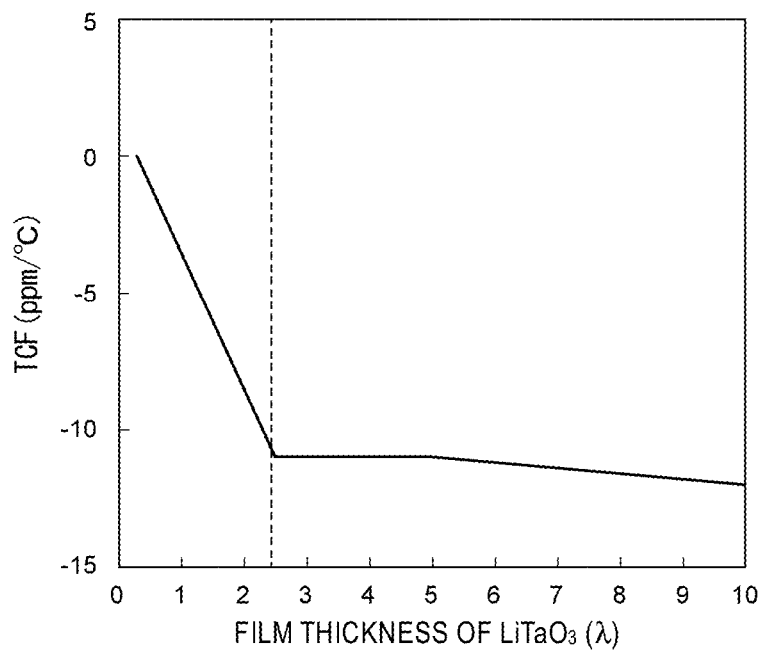
FIG. 23 illustrates the relationship between the film thickness of a LiTaO$_3$ film in an acoustic wave device and the temperature coefficient of frequency TCF.
Figure 24:
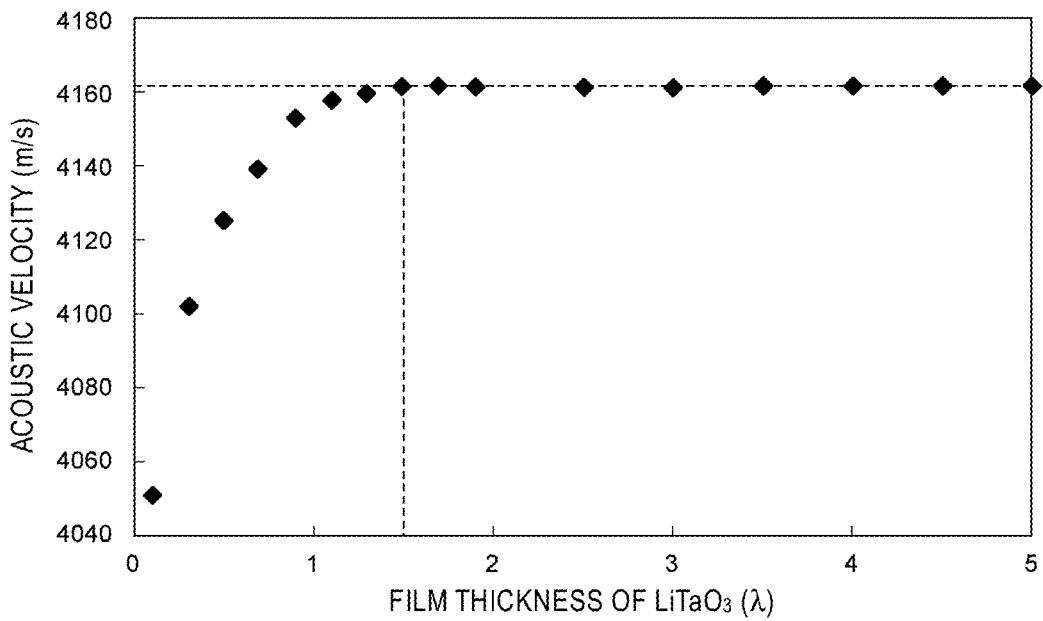
FIG. 24 illustrates the relationship between the film thickness of a LiTaO$_3$ film in an acoustic wave device and the acoustic velocity.

FIG. 22 illustrates, in an acoustic wave device in which a low-acoustic-velocity film made of a SiO$_2$ film having a thickness of about 0.35λ and a piezoelectric film made of lithium tantalate with Euler angles of (0°, 140.0°, 0°) are stacked on a high-acoustic-velocity supporting substrate made of silicon, the relationship between the film thickness of the LiTaO$_3$ film and the quality factor. The vertical axis of FIG. 22 is the product of the quality characteristics and the band width ratio (Δf) of the resonator. FIG. 23 illustrates the relationship between the film thickness of the LiTaO$_3$ film and the temperature coefficient of frequency TCF. FIG. 24 illustrates the film thickness of the LiTaO$_3$ film and the acoustic velocity. From FIG. 22, the film thickness of the LiTaO$_3$ film is preferably about 3.5λ or less, for example. In this case, the quality factor is high, compared with the case of a film thickness of more than about 3.5λ. More preferably, the film thickness of the LiTaO$_3$ film is about 2.5λ or less, for example, in order to further increase the quality factor.

From FIG. 23, in the case where the LiTaO$_3$ film has a thickness of about 2.5λ or less, the absolute value of the temperature coefficient of frequency TCF is able to be reduced, compared with the case of a film thickness of more than about 2.5λ. More preferably, the film thickness of the LiTaO$_3$ film is about 2λ or less, for example. In this case, the absolute value of the temperature coefficient of frequency TCF is able to be about 10 ppm/° C. or less. To reduce the absolute value of the temperature coefficient of frequency TCF, the film thickness of the LiTaO$_3$ film is more preferably about 1.5λ or less, for example.

From FIG. 24, when the film thickness of the LiTaO$_3$ film is more than 1.5λ, a change in acoustic velocity is markedly small.

Figure 25:
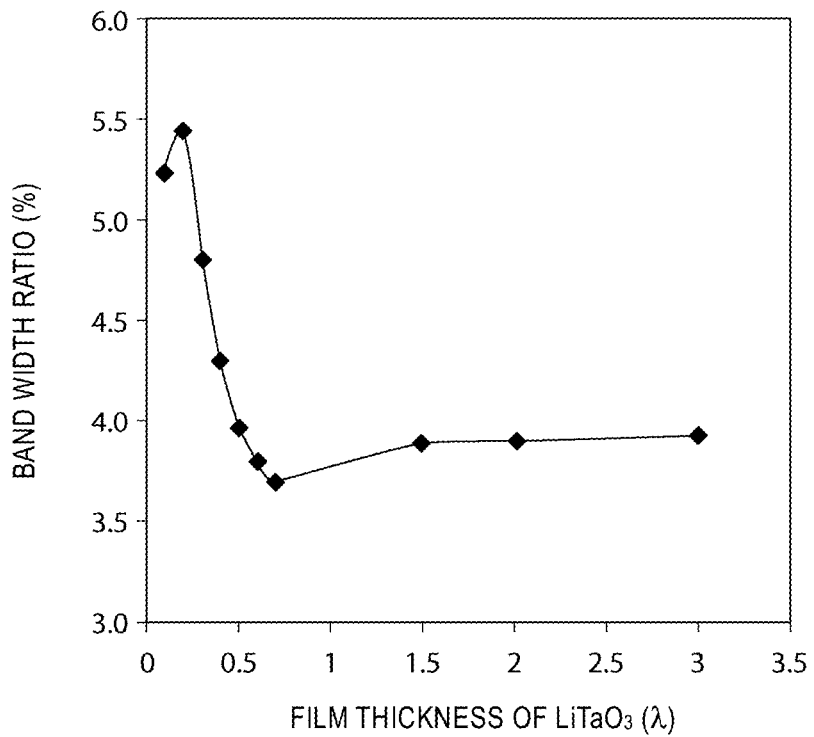
FIG. 25 illustrates the relationship between the film thickness of a LiTaO$_3$ film and the band width ratio.

As illustrated in FIG. 25, however, when the film thickness of the LiTaO$_3$ film is in the range of about 0.05λ or more and about 0.5λ or less, the band width ratio changes greatly. Thus, the electromechanical coupling coefficient is able to be adjusted in a wider range. To extend the adjustment ranges of the electromechanical coupling coefficient and the band width ratio, the film thickness of the LiTaO$_3$ film is preferably in the range of about 0.05λ or more and about 0.5λ or less, for example.

Figure 26:
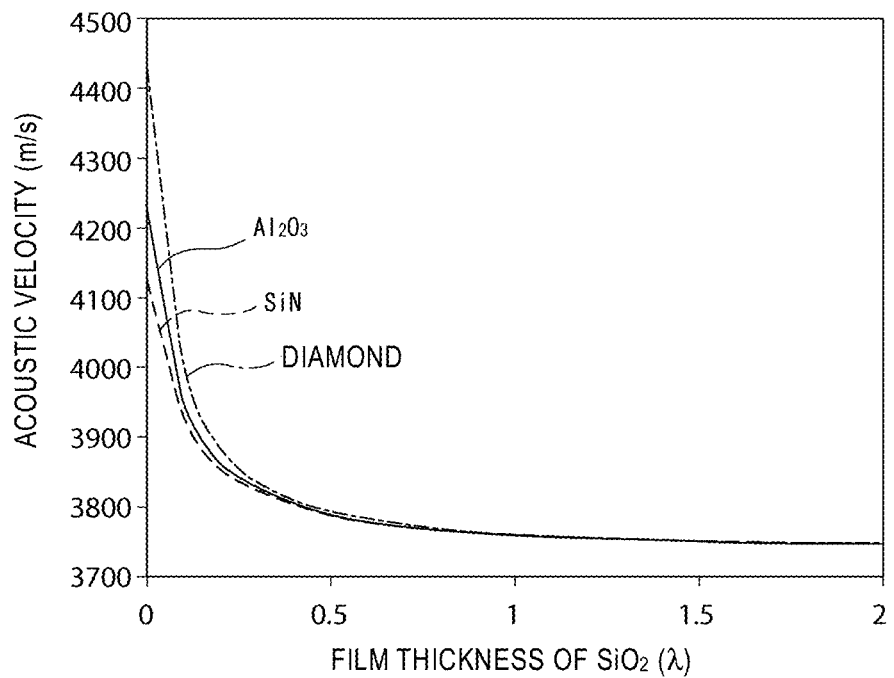
FIG. 26 illustrates the relationships among the film thickness of a SiO$_2$ film, materials of high-acoustic-velocity films, and the acoustic velocity.
Figure 27:
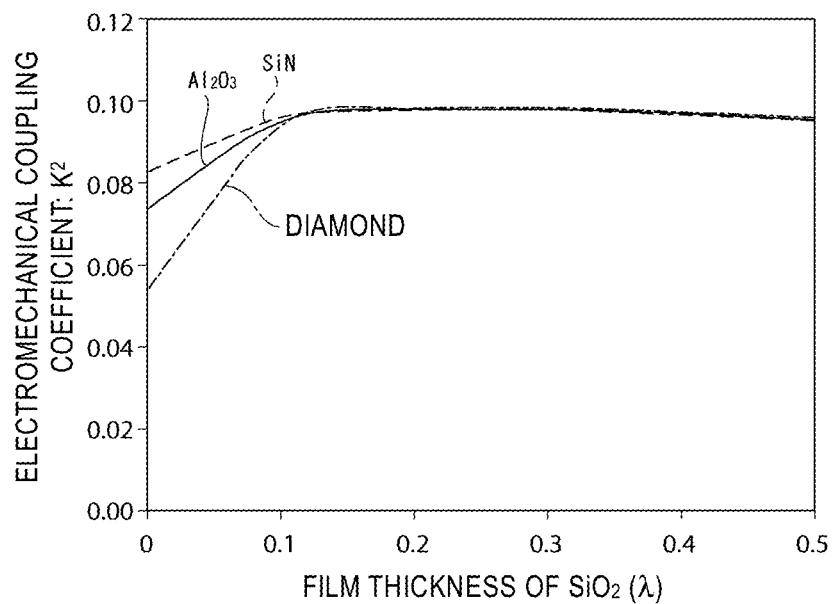
FIG. 27 illustrates the relationships among the film thickness of a SiO$_2$ film, the electromechanical coupling coefficient, and materials of high-acoustic-velocity films.

FIG. 26 illustrates the relationship between the film thickness of SiO$_2$ (λ) and the acoustic velocity, and FIG. 27 illustrates the relationship between the film thickness of SiO$_2$ (λ) and the electromechanical coupling coefficient. The acoustic wave device according to preferred embodiments of the present invention may include a low-acoustic-velocity film and a high-acoustic-velocity film disposed between the single-crystal Si layer and the piezoelectric body. Here, for example, a silicon nitride film, an aluminum oxide film, or a diamond film was preferably used as a high-acoustic-velocity film disposed below the low-acoustic-velocity film made of SiO$_2$. The low-acoustic-velocity film refers to a film in which the acoustic velocity of a bulk wave that propagates through the low-acoustic-velocity film is lower than the acoustic velocity of an acoustic wave that propagates through the piezoelectric body. The high-acoustic-velocity film refers to a film in which the acoustic velocity of a bulk wave that propagates through the high-acoustic-velocity film is higher than the acoustic velocity of an acoustic wave that propagates through the piezoelectric body. The film thickness of the high-acoustic-velocity film was 1.5λ. The acoustic velocity of a bulk wave that propagates through silicon nitride is about 6,000 m/s. The acoustic velocity of a bulk wave that propagates through aluminum oxide is about 6,000 m/s. The acoustic velocity of a bulk wave that propagates through diamond is about 12,800 m/s. As illustrated in FIGS. 26 and 27, when the material of the high-acoustic-velocity film and the film thickness of the SiO₂ film are changed, the electromechanical coupling coefficient and the acoustic velocity are little changed. In particular, as illustrated in FIG. 27, when the film thickness of the SiO₂ film is about 0.1λ or more and about 0.5λ or less, the electromechanical coupling coefficient is little changed regardless of the material of the high-acoustic-velocity film. As illustrated in FIG. 26, when the film thickness of the SiO₂ film is about 0.3λ or more and about 2λ or less, the acoustic velocity is unchanged regardless of the material of the high-acoustic-velocity film. Thus, the film thickness of the low-acoustic-velocity film made of silicon oxide is preferably about 2λ or less, and more preferably about 0.5λ or less, for example.

The acoustic wave device of each preferred embodiment may be used as a component, such as a multiplexer, used in a high-frequency front-end circuit. An example of such a high-frequency front-end circuit will be described below.

Figure 28:
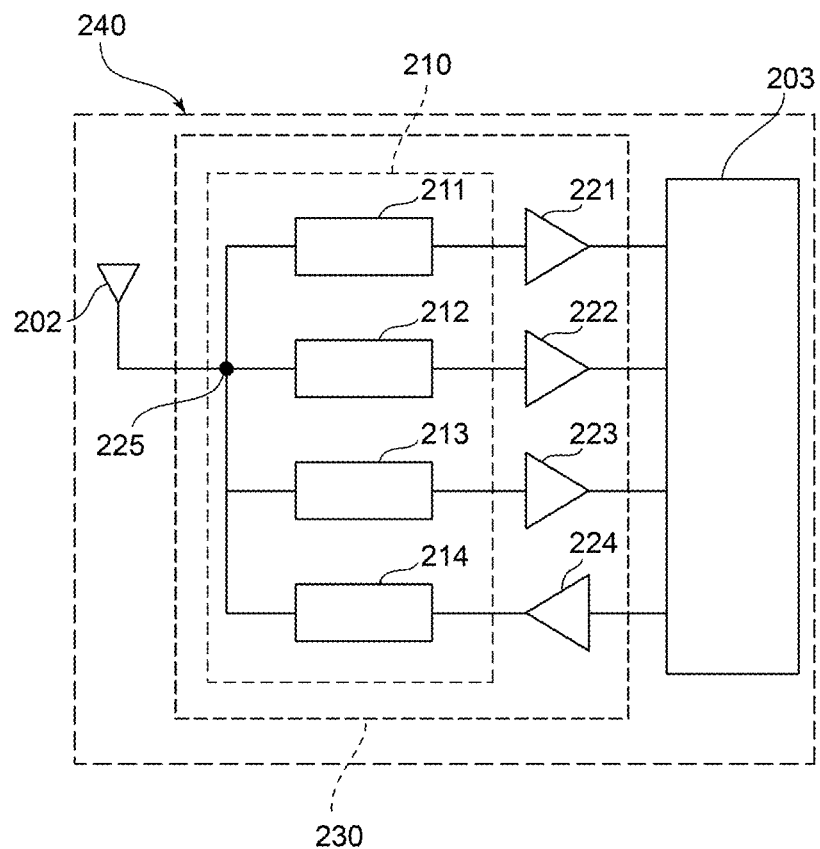
FIG. 28 is a block diagram of a communication apparatus including a high-frequency front-end circuit according to a preferred embodiment of the present invention.

FIG. 28 is a schematic block diagram of a communication apparatus including a high-frequency front-end circuit according to a preferred embodiment of the present invention. A communication apparatus 240 includes an antenna 202, a high-frequency front-end circuit 230, and an RF signal processing circuit 203. The high-frequency front-end circuit 230 is a circuit section connected to the antenna 202. The high-frequency front-end circuit 230 includes a multiplexer 210 and amplifiers 221 to 224 to define and function as power amplifiers. The multiplexer 210 includes first to fourth filters 211 to 214. As the multiplexer 210, a multiplexer according to a preferred embodiment of the present invention may preferably be used. The multiplexer 210 includes a common antenna terminal 225 connected to the antenna 202. One terminal of each of the first to third filters 211 to 213 defining and functioning as reception filters and one terminal of the fourth filter 214 defining and functioning as a transmission filter are connected in common to the common antenna terminal 225. Output terminals of the first to third filters 211 to 213 are connected to the amplifiers 221 to 223, respectively. The input terminal of the fourth filter 214 is connected to the amplifier 224.

The output terminals of the amplifiers 221 to 223 are connected to the RF signal processing circuit 203. The input terminal of the amplifier 224 is connected to the RF signal processing circuit 203.

The multiplexer according to the present preferred embodiment may be appropriately used as the multiplexer 210 in the communication apparatus 240.

Multiplexer according to preferred embodiments of the present invention may include multiple transmission filters and multiple reception filters. The multiplexer includes n band-pass filters where n is 2 or more. Thus, a duplexer is also included in a multiplexer in the present invention.

Filters, multiplexers that can be used for a multiband system, front-end circuits, and communication apparatuses according to preferred embodiments of the present invention can be widely used for communication equipment such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device, comprising:
a supporting substrate made of silicon;
a silicon oxide film stacked on or above the supporting substrate;
a piezoelectric body stacked on or above the silicon oxide film, the piezoelectric body being made of lithium tantalate; and
interdigital transducer electrodes disposed on or above a main surface of the piezoelectric body; wherein
where a wave length determined by a pitch of electrode fingers of the interdigital transducer electrodes is denoted by λ, a wave length-normalized film thickness of the piezoelectric body is denoted by $T_{LT}$, an Euler angle θ of the piezoelectric body is denoted by $\theta_{LT}$, a wave length-normalized film thickness of the silicon oxide film is denoted by $T_S$, a wave length-normalized film thickness of the interdigital transducer electrodes in terms of aluminum thickness is denoted by $T_E$, a propagation direction in the supporting substrate is denoted by $\psi_{Si}$, and a wave length-normalized film thickness of the supporting substrate is denoted by $T_{Si}$, $T_{LT}$, $\theta_{LT}$, $T_S$, $T_E$, and $\psi_{Si}$ are set such that $I_h$ represented by Formula (1) below for at least one of responses of a first higher-order mode, a second higher-order mode, and a third higher-order mode is more than about −2.4, and $T_{Si} > 20$;

$$\begin{aligned}
I_h = &\, a^{(2)}_{T_{LT}}\left((T_{LT} - c_{T_{LT}})^2 - b^{(2)}_{T_{LT}}\right) + \\
&\, a^{(1)}_{T_{LT}}(T_{LT} - c_{T_{LT}}) + a^{(2)}_{T_S}\left((T_S - c_{T_S})^2 - b^{(2)}_{T_S}\right) + \\
&\, a^{(1)}_{T_S}(T_S - c_{T_S}) + a^{(4)}_{T_E}\left((T_E - c_{T_E})^4 - b^{(4)}_{T_E}\right) + \\
&\, a^{(3)}_{T_E}\left((T_E - c_{T_E})^3 - b^{(3)}_{T_E}\right) + a^{(2)}_{T_E}\left((T_E - c_{T_E})^2 - b^{(2)}_{T_E}\right) + \\
&\, a^{(1)}_{T_E}(T_E - c_{T_E}) + a^{(6)}_{\psi_{Si}}\left((\psi_{Si} - c_{\psi_{Si}})^6 - b^{(6)}_{\psi_{Si}}\right) + \\
&\, a^{(5)}_{\psi_{Si}}\left((\psi_{Si} - c_{\psi_{Si}})^2 - b^{(5)}_{\psi_{Si}}\right) + a^{(4)}_{\psi_{Si}}\left((\psi_{Si} - c_{\psi_{Si}})^2 - b^{(4)}_{\psi_{Si}}\right) + \\
&\, a^{(3)}_{\psi_{Si}}\left((\psi_{Si} - c_{\psi_{Si}})^3 - b^{(3)}_{\psi_{Si}}\right) + a^{(2)}_{\psi_{Si}}\left((\psi_{Si} - c_{\psi_{Si}})^2 - b^{(2)}_{\psi_{Si}}\right) + \\
&\, a^{(1)}_{\psi_{Si}}(\psi_{Si} - c_{\psi_{Si}}) + a^{(2)}_{\theta_{LT}}\left((\theta_{LT} - c_{\theta_{LT}})^2 - b^{(2)}_{\theta_{LT}}\right) + \\
&\, a^{(1)}_{\theta_{LT}}(\theta_{LT} - c_{\theta_{LT}}) + d_{T_{LT}T_S}(T_{LT} - c_{T_{LT}})(T_S - c_{T_S}) + \\
&\, d_{T_{LT}T_E}(T_{LT} - c_{T_{LT}})(T_E - c_{T_E}) + \\
&\, d_{T_{LT}\psi_{Si}}(T_{LT} - c_{T_{LT}})(\psi_{Si} - c_{\psi_{Si}}) + \\
&\, d_{T_{LT}\theta_{LT}}(T_{LT} - c_{T_{LT}})(\theta_{LT} - c_{\theta_{LT}}) + \\
&\, d_{T_S T_E}(T_S - c_{T_S})(T_E - c_{T_E}) + \\
&\, d_{T_S \psi_{Si}}(T_S - c_{T_S})(\psi_{Si} - c_{\psi_{Si}}) + \\
&\, d_{T_S \theta_{LT}}(T_S - c_{T_S})(\theta_{LT} - c_{\theta_{LT}}) + \\
&\, d_{T_E \psi_{Si}}(T_E - c_{T_E})(\psi_{Si} - c_{\psi_{Si}}) + \\
&\, d_{T_E \theta_{LT}}(T_E - c_{T_E})(\theta_{LT} - c_{\theta_{LT}}) + \\
&\, d_{\psi_{Si}\theta_{LT}}(\psi_{Si} - c_{\psi_{Si}})(\theta_{LT} - c_{\theta_{LT}}) + e
\end{aligned} \qquad \text{Formula (1)}$$

where coefficients a, b, c, d, and e in Formula (1) are values presented in Tables 1 to 36 below in accordance with ranges of orientation of the supporting substrate either of (100), (110), or (111), a type of higher-order mode, the wave length-normalized film thickness of the silicon oxide film, the wave length-normalized film thickness of the piezoelectric body, and the propagation direction in the supporting substrate;

TABLE 1

Si(100)
First higher-order mode
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | 0 | 0 |
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | −5.857231176 | −5.857231176 |
| $b_{TS}^{(2)}$ | 0 | 0 |
| $c_{TS}$ | 0.148 | 0.148 |
| $a_{TE}^{(4)}$ | 0 | 0 |
| $a_{TE}^{(3)}$ | 0 | 0 |
| $a_{TE}^{(2)}$ | −19.75255913 | −19.75255913 |
| $a_{TE}^{(1)}$ | −2.877583447 | −2.877583447 |
| $b_{TE}^{(4)}$ | 0 | 0 |
| $b_{TE}^{(3)}$ | 0 | 0 |
| $b_{TE}^{(2)}$ | 0.022736 | 0.022736 |
| $c_{TE}$ | 0.242 | 0.242 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.004788767 | 0.004788767 |
| $a_{\psi Si}^{(1)}$ | 0.024306207 | 0.024306207 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 81.81 | 81.81 |
| $c_{\psi Si}$ | 8.7 | 8.7 |
| $a_{\theta LT}^{(2)}$ | −0.008235936 | −0.008235936 |
| $a_{\theta LT}^{(1)}$ | −0.021048278 | −0.021048278 |
| $b_{\theta LT}^{(2)}$ | 65.16 | 65.16 |
| $c_{\theta LT}$ | −52.2 | −52.2 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.786852571 | −0.786852571 |
| $d_{TE\psi Si}$ | 0 | 0 |
| $d_{TE\theta LT}$ | −0.237034335 | −0.237034335 |
| $d_{\psi Si\theta LT}$ | 0 | 0 |
| e | −1.499248378 | −1.499248378; |

TABLE 2

Si(100)
First higher-order mode
$0.2 \leq T_{LT} \leq 3.5$
$0 \leq T_S < 2.0$

| | $0.05 \leq T_E < 0.25$ | $0.25 \leq T_E \leq 0.45$ |
|---|---|---|
| $a_{TLT}^{(2)}$ | 0 | 125.5342427 |
| $a_{TLT}^{(1)}$ | −13.43961051 | −7.643409732 |
| $b_{TLT}^{(2)}$ | 0 | 0.006076558 |
| $c_{TLT}$ | 0.329807692 | 0.321186441 |
| $a_{TS}^{(2)}$ | 0 | 0 |
| $a_{TS}^{(1)}$ | −11.80744788 | −10.05306878 |
| $b_{TS}^{(2)}$ | 0 | 0 |
| $c_{TS}$ | 0.158653846 | 0.153389831 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | −7.595099843 |
| $b_{TE}^{(4)}$ | 0 | 0 |
| $b_{TE}^{(3)}$ | 0 | 0 |

TABLE 2-continued

Si(100)
First higher-order mode
$0.2 \leq T_{LT} \leq 3.5$
$0 \leq T_S < 2.0$

| | $0.05 \leq T_E < 0.25$ | $0.25 \leq T_E \leq 0.45$ |
|---|---|---|
| $b_{TE}^{(2)}$ | 0 | 0 |
| $c_{TE}$ | 0 | 0.366101695 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.003335792 | 0 |
| $a_{\psi Si}^{(1)}$ | 0.039268266 | −0.013700762 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 191.7159763 | 0 |
| $c_{\psi Si}$ | 13.26923077 | 16.01694915 |
| $a_{\theta LT}^{(2)}$ | −0.007476194 | 0 |
| $a_{\theta LT}^{(1)}$ | −0.010867175 | −0.053997369 |
| $b_{\theta LT}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $d_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| e | −2.071831837 | −3.228508418; |

TABLE 3

Si(100)
First higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −15.6141248 | −15.6141248 |
| $b_{TLT}^{(2)}$ | 0 | 0 |
| $c_{TLT}$ | 0.163309353 | 0.163309353 |
| $a_{TS}^{(2)}$ | 0 | 0 |
| $a_{TS}^{(1)}$ | −22.02440893 | −22.02440893 |
| $b_{TS}^{(2)}$ | 0 | 0 |
| $c_{TS}$ | 0.325179856 | 0.325179856 |
| $a_{TE}^{(4)}$ | 0 | 0 |
| $a_{TE}^{(3)}$ | −248.4374004 | −248.4374004 |
| $a_{TE}^{(2)}$ | −36.57127964 | −36.57127964 |
| $a_{TE}^{(1)}$ | 13.88180854 | 13.88180854 |
| $b_{TE}^{(4)}$ | 0 | 0 |
| $b_{TE}^{(3)}$ | 0.000480119 | 0.000480119 |
| $b_{TE}^{(2)}$ | 0.020416128 | 0.020416128 |
| $c_{TE}$ | 0.240647482 | 0.240647482 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002456326 | 0.002456326 |
| $a_{\psi Si}^{(1)}$ | 0.048553126 | 0.048553126 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 279.6050929 | 279.6050929 |
| $c_{\psi Si}$ | 22.3381295 | 22.3381295 |
| $a_{\theta LT}^{(2)}$ | 0 | 0 |
| $a_{\theta LT}^{(1)}$ | 0.005427275 | 0.005427275 |
| $b_{\theta LT}^{(2)}$ | 0 | 0 |

TABLE 3-continued

Si(100)
First higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $c_{\theta LT}$ | −50.35971223 | −50.35971223 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679; |

TABLE 4

Si(100)
First higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |
| $a_{TE}^{(3)}$ | 0 | 0 |
| $a_{TE}^{(2)}$ | 110.8304316 | 0 |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | 0 |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $d_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513; |

TABLE 5

Si(100)
Second higher-order mode
$0 < T_{LT} < 0.2$
$0 \leq T_S < 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −5.687707928 | −5.687707928 |
| $b_{TLT}^{(2)}$ | 0 | 0 |
| $c_{TLT}$ | 0.139506173 | 0.139506173 |
| $a_{TS}^{(2)}$ | 0 | 0 |
| $a_{TS}^{(1)}$ | 5.653643283 | 5.653643283 |
| $b_{TS}^{(2)}$ | 0 | 0 |
| $c_{TS}$ | 0.148148148 | 0.148148148 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.004369706 | −1.004369706 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.255555556 | 0.255555556 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000197083 | −0.000197083 |
| $a_{\psi Si}^{(2)}$ | −0.003376583 | −0.003376583 |
| $a_{\psi Si}^{(1)}$ | 0.118081927 | 0.118081927 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −379.4708632 | −379.4708632 |
| $b_{\psi Si}^{(2)}$ | 278.0521262 | 278.0521262 |
| $c_{\psi Si}$ | 23.14814815 | 23.14814815 |
| $a_{\theta LT}^{(2)}$ | 0 | 0 |
| $a_{\theta LT}^{(1)}$ | 0.128631041 | 0.128631041 |
| $b_{\theta LT}^{(2)}$ | 0 | 0 |
| $c_{\theta LT}$ | −49.32098765 | −49.32098765 |
| $d_{TLTTS}$ | 0 | 0 |
| $d_{TLTTE}$ | 72.43278274 | 72.43278274 |
| $d_{TLT\psi Si}$ | 0.604747502 | 0.604747502 |
| $d_{TLT\theta LT}$ | −1.743618251 | −1.743618251 |
| $d_{TSTE}$ | 0 | 0 |
| $d_{TS\psi Si}$ | 0 | 0 |
| $d_{TS\theta LT}$ | 0.994157261 | 0.994157261 |
| $d_{TE\psi Si}$ | 0 | 0 |
| $d_{TE\theta LT}$ | 0.280889881 | 0.280889881 |
| $d_{\psi Si\theta LT}$ | 0.003095822 | 0.003095822 |
| e | −5.638096455 | −5.638096455; |

TABLE 6

Si(100)
Second higher-order mode
$0.2 \leq T_{LT} \leq 3.5$
$0 \leq T_S < 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | 7.809960834 | 4.249755245 |
| $b_{TLT}^{(2)}$ | 0 | 0 |
| $c_{TLT}$ | 0.30962963 | 0.302857143 |
| $a_{TS}^{(2)}$ | 0 | 0 |
| $a_{TS}^{(1)}$ | 0 | −0.800874586 |
| $b_{TS}^{(2)}$ | 0 | 0 |
| $c_{TS}$ | 0 | 0.150714286 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.563479635 | 9.07053135 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148518519 | 0.353571429 |
| $a_{\psi Si}^{(6)}$ | 0 | 0 |

TABLE 6-continued

Si(100)
Second higher-order mode
$0.2 \leq T_{LT} \leq 3.5$
$0 \leq T_S < 2.0$

| | $0.05 \leq T_E < 0.25$ | $0.25 \leq T_E \leq 0.45$ |
|---|---|---|
| $a_{\psi Si}^{(5)}$ | 0 | 0 |
| $a_{\psi Si}^{(4)}$ | 0 | 0 |
| $a_{\psi Si}^{(3)}$ | −0.000160979 | 0 |
| $a_{\psi Si}^{(2)}$ | −0.000757552 | 0.001332545 |
| $a_{\psi Si}^{(1)}$ | 0.095765615 | 0.003836714 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 384.7407407 | 0 |
| $b_{\psi Si}^{(2)}$ | 278.2222222 | 285.0956633 |
| $c_{\psi Si}$ | 21.33333333 | 20.89285714 |
| $a_{\theta LT}^{(2)}$ | 0 | 0 |
| $a_{\theta LT}^{(1)}$ | 0.043185248 | 0.033521037 |
| $b_{\theta LT}^{(2)}$ | 0 | 0 |
| $c_{\theta LT}$ | −50 | −50.92857143 |
| $d_{TLTTS}$ | 0 | 0 |
| $d_{TLTTE}$ | 0 | 0 |
| $d_{TLT\psi Si}$ | −0.383208698 | −0.220029295 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0.974573109 |
| $d_{TE\psi Si}$ | 0 | 0 |
| $d_{TE\theta LT}$ | 1.01389349 | −1.078939399 |
| $d_{\psi Si\theta LT}$ | 0 | 0.002899732 |
| e | −5.569590226 | −5.29442278; |

TABLE 7

Si(100)
Second higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | −1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |

TABLE 7-continued

Si(100)
Second higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408; |

TABLE 8

Si(100)
Second higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 0.35631068 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811; |

TABLE 9

Si(100)
Third higher-order mode
$0 < T_{LT} < 0.2$
$0 \leq T_S < 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −16.39135605 | −16.39135605 |
| $b_{TLT}^{(2)}$ | 0 | 0 |
| $c_{TLT}$ | 0.196774194 | 0.196774194 |
| $a_{TS}^{(2)}$ | 0 | 0 |
| $a_{TS}^{(1)}$ | −4.824831305 | −4.824831305 |
| $b_{TS}^{(2)}$ | 0 | 0 |
| $c_{TS}$ | 0.170967742 | 0.170967742 |
| $a_{TE}^{(4)}$ | 0 | 0 |
| $a_{TE}^{(3)}$ | 0 | 0 |
| $a_{TE}^{(2)}$ | −45.57608817 | −45.57608817 |
| $a_{TE}^{(1)}$ | −10.80005563 | −10.80005563 |
| $b_{TE}^{(4)}$ | 0 | 0 |
| $b_{TE}^{(3)}$ | 0 | 0 |
| $b_{TE}^{(2)}$ | 0.018296046 | 0.018296046 |
| $c_{TE}$ | 0.303225806 | 0.303225806 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000172048 | 0.000172048 |
| $a_{\psi Si}^{(2)}$ | −0.00384923 | −0.00384923 |
| $a_{\psi Si}^{(1)}$ | −0.009826773 | −0.009826773 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 143.0843208 | 143.0843208 |
| $b_{\psi Si}^{(2)}$ | 215.8688866 | 215.8688866 |
| $c_{\psi Si}$ | 22.25806452 | 22.25806452 |
| $a_{\theta LT}^{(2)}$ | 0 | 0 |
| $a_{\theta LT}^{(1)}$ | 0.066799879 | 0.066799879 |
| $b_{\theta LT}^{(2)}$ | 0 | 0 |
| $c_{\theta LT}$ | −50.16129032 | −50.16129032 |
| $d_{TLTTS}$ | 0 | 0 |
| $d_{TLTTE}$ | −112.847682 | −112.847682 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | −1.750763196 | −1.750763196 |
| $d_{TS\theta LT}$ | 0 | 0 |
| $d_{TE\psi Si}$ | 0 | 0 |
| $d_{TE\theta LT}$ | 0.466692151 | 0.466692151 |
| $d_{\psi Si\theta LT}$ | 0 | 0 |
| e | −2.904746788 | −2.904746788; |

TABLE 10

Si(100)
Third higher-order mode
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −8.135537689 | −8.135537689 |
| $b_{TLT}^{(2)}$ | 0 | 0 |
| $c_{TLT}$ | 0.311659193 | 0.311659193 |
| $a_{TS}^{(2)}$ | 0 | 0 |
| $a_{TS}^{(1)}$ | −20.38200282 | −20.38200282 |
| $b_{TS}^{(2)}$ | 0 | 0 |
| $c_{TS}$ | 0.149327354 | 0.149327354 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.460675692 | −3.460675692 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.267488789 | 0.267488789 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.003759233 | −0.003759233 |
| $a_{\psi Si}^{(1)}$ | 0.015931998 | 0.015931998 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 239.0395946 | 239.0395946 |
| $c_{\psi Si}$ | 18.90134529 | 18.90134529 |
| $a_{\theta LT}^{(2)}$ | 0 | 0 |
| $a_{\theta LT}^{(1)}$ | 0.017576249 | 0.017576249 |
| $b_{\theta LT}^{(2)}$ | 0 | 0 |
| $c_{\theta LT}$ | −49.9103139 | −49.9103139 |
| $d_{TLTTS}$ | −152.1817236 | −152.1817236 |
| $d_{TLTTE}$ | 0 | 0 |
| $d_{TLT\psi Si}$ | −0.359387178 | −0.359387178 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0.911415415 | 0.911415415 |
| $d_{TE\psi Si}$ | 0 | 0 |
| $d_{TE\theta LT}$ | 0.275815872 | 0.275815872 |
| $d_{\psi Si\theta LT}$ | 0 | 0 |
| e | −3.952626598 | −3.952626598; |

TABLE 11

Si(100)
Third higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |
| $c_{\theta LT}$ | −48.97435897 | −48.97435897 |
| $d_{TLTTS}$ | 0 | 0 |
| $d_{TLTTE}$ | 0 | 0 |

TABLE 11-continued

Si(100)
Third higher-order mode
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $d_{TLT\psi Si}$ | −0.816828716 | −0.816828716 |
| $d_{TLT\theta LT}$ | 0.865519967 | 0.865519967 |
| $d_{TSTE}$ | 0 | 0 |
| $d_{TS\psi Si}$ | −0.538336559 | −0.538338559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202; |

TABLE 12

Si(100)
Third higher-order mode
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| e | −4.940340284 | −4.940340284; |

TABLE 13

Si(110)
First higher-order mode
$0 < T_{LT} < 0.2$
$0 \leq T_S < 0.2$ $0.05 \leq T_E < 0.25$

| | $0 \leq \psi_{Si} < 45$ | $45 \leq \psi_{Si} \leq 90$ |
|---|---|---|
| $a_{TLT}^{(2)}$ | 0 | 0 |
| $a_{TLT}^{(1)}$ | −16.69742899 | −16.69742899 |
| $b_{TLT}^{(2)}$ | 0 | 0 |
| $c_{TLT}$ | 0.1675 | 0.1675 |
| $a_{TS}^{(2)}$ | 0 | 0 |
| $a_{TS}^{(1)}$ | 15.90196012 | 15.90196012 |
| $b_{TS}^{(2)}$ | 0 | 0 |
| $c_{TS}$ | 0.1525 | 0.1525 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000183963 | −0.000183963 |
| $a_{\psi Si}^{(2)}$ | −0.003236307 | −0.003236307 |
| $a_{\psi Si}^{(1)}$ | 0.071460688 | 0.071460688 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −5768.71875 | −5768.71875 |
| $b_{\psi Si}^{(2)}$ | 399.9375 | 399.9375 |
| $c_{\psi Si}$ | 65.25 | 65.25 |
| $a_{\theta LT}^{(2)}$ | 0 | 0 |
| $a_{\theta LT}^{(1)}$ | 0 | 0 |
| $b_{\theta LT}^{(2)}$ | 0 | 0 |
| $c_{\theta LT}$ | −90 | −90 |
| $d_{TLTTS}$ | 0 | 0 |
| $d_{TLTTE}$ | 0 | 0 |
| $d_{TLT\psi Si}$ | 1.873870705 | 1.873870705 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −0.957101918 | −0.957101918 |

$0.25 \leq T_E \leq 0.45$

| | $0 \leq \psi_{Si} < 45$ | $45 \leq \psi_{Si} \leq 90$ |
|---|---|---|
| $a_{TLT}^{(2)}$ | 0 | 0 |
| $a_{TLT}^{(1)}$ | −33.56520202 | 0 |
| $b_{TLT}^{(2)}$ | 0 | 0 |
| $c_{TLT}$ | 0.192857143 | 0 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | 26.3030303 | 0 |
| $a_{TE}^{(1)}$ | −6.181053391 | 0 |
| $b_{TE}^{(4)}$ | 0 | 0 |
| $b_{TE}^{(3)}$ | 0 | 0 |
| $b_{TE}^{(2)}$ | 0.006326531 | 0 |
| $c_{TE}$ | 0.378571429 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | −0.000177142 |
| $a_{\psi Si}^{(2)}$ | 0 | 0.002186084 |
| $a_{\psi Si}^{(1)}$ | 0.085067773 | 0.13561432 |
| $b_{\psi Si}^{(6)}$ | 0 | 0 |

TABLE 13-continued

Si(110)
First higher-order mode
$0 < T_{LT} < 0.2$
$0 \leq T_S < 0.2$

| | | |
|---|---|---|
| $b_{\psi Si}^{(5)}$ | 0 | 0 |
| $b_{\psi Si}^{(4)}$ | 0 | 0 |
| $b_{\psi Si}^{(3)}$ | 0 | 2642.857143 |
| $b_{\psi Si}^{(2)}$ | 0 | 500 |
| $c_{\psi Si}$ | 34.28571429 | 55 |
| $a_{\theta LT}^{(2)}$ | 0 | −0.005336622 |
| $a_{\theta LT}^{(1)}$ | 0.070255628 | 0.032718563 |
| $b_{\theta LT}^{(2)}$ | 0 | 65.75963719 |
| $c_{\theta LT}$ | −51.42857143 | −50.95238095 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.716151515 | 0 |
| $d_{\psi Si\theta LT}$ | −0.00729303 | 0.002110378 |
| e | −1.634922542 | −1.290881853; |

TABLE 14

Si(110)
First higher-order mode
$0.2 \leq T_{LT} \leq 3.5$
$0 \leq T_S < 0.2$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −23.96596978 | −4.695531045 |
| $b_{TLT}^{(2)}$ | 0 | 0 |
| $c_{TLT}$ | 0.34 | 0.3296875 |
| $a_{TS}^{(2)}$ | 0 | 0 |
| $a_{TS}^{(1)}$ | −23.18485905 | 0 |
| $b_{TS}^{(2)}$ | 0 | 0 |
| $c_{TS}$ | 0.175555556 | 0 |
| $a_{TE}^{(4)}$ | 0 | 0 |
| $a_{TE}^{(3)}$ | 0 | 0 |
| $a_{TE}^{(2)}$ | 0 | −43.48595551 |
| $a_{TE}^{(1)}$ | 0 | −2.467954545 |
| $b_{TE}^{(4)}$ | 0 | 0 |
| $b_{TE}^{(3)}$ | 0 | 0 |
| $b_{TE}^{(2)}$ | 0 | 0.006875 |
| $c_{TE}$ | 0 | 0.15 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.018474062 | 0 |
| $a_{\psi Si}^{(1)}$ | 0.059131688 | 0 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 81.55555556 | 0 |
| $c_{\psi Si}$ | 35.33333333 | 0 |
| $a_{\theta LT}^{(2)}$ | 0 | 0 |
| $a_{\theta LT}^{(1)}$ | 0.009475371 | 0 |
| $b_{\theta LT}^{(2)}$ | 0 | 0 |
| $c_{\theta LT}$ | −49.33333333 | −90 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0.617240199 | 0 |
| $d_{TSTE}$ | 0 | 0 |
| $d_{TS\psi Si}$ | 2.612107038 | 0 |
| $d_{TS\theta LT}$ | 2.129359248 | 0 |
| $d_{TE\psi Si}$ | 0 | 0 |

TABLE 14-continued

Si(110)
First higher-order mode
$0.2 \leq T_{LT} \leq 3.5$
$0 \leq T_S < 0.2$

| | | |
|---|---|---|
| $d_{TE\theta LT}$ | 0 | 0 |
| $d_{\psi Si\theta LT}$ | 0.871101002 | 0 |
| e | −2.851861362 | −2.210765625 |

| | $0.25 \leq T_E \leq 0.45$ | |
|---|---|---|
| | $0 \leq \psi_{Si} < 45$ | $0 \leq \psi_{Si} < 45$ |
| $a_{TLT}^{(2)}$ | 0 | 0 |
| $a_{TLT}^{(1)}$ | −7.344438725 | −7.344438725 |
| $b_{TLT}^{(2)}$ | 0 | 0 |
| $c_{TLT}$ | 0.338983051 | 0.338983051 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | −70.50554427 | −70.50554427 |
| $a_{TE}^{(1)}$ | −5.460437635 | −5.460437635 |
| $b_{TE}^{(4)}$ | 0 | 0 |
| $b_{TE}^{(3)}$ | 0 | 0 |
| $b_{TE}^{(2)}$ | 0.006716461 | 0.006716461 |
| $c_{TE}$ | 0.365254237 | 0.365254237 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000119479 | 0.000119479 |
| $a_{\psi Si}^{(2)}$ | 0.003987724 | 0.003987724 |
| $a_{\psi Si}^{(1)}$ | −0.047908658 | −0.047908658 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −2384.203107 | −2384.203107 |
| $b_{\psi Si}^{(2)}$ | 216.791152 | 216.791152 |
| $c_{\psi Si}$ | 30.76271186 | 30.76271186 |
| $a_{\theta LT}^{(2)}$ | 0 | 0 |
| $a_{\theta LT}^{(1)}$ | 0.026725166 | 0.026725166 |
| $b_{\theta LT}^{(2)}$ | 0 | 0 |
| $c_{\theta LT}$ | −49.83050847 | −49.83050847 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.573237288 | −2.573237288; |

TABLE 15

Si(110)
First higher-order mode
$0 < T_{LT} < 0.2$
$0.2 \leq T_S \leq 2.0$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −10.87353735 | −17.74612134 |
| $b_{TLT}^{(2)}$ | 0 | 0 |
| $c_{TLT}$ | 0.167045455 | 0.158227848 |
| $a_{TS}^{(2)}$ | 92.14417413 | 275.6432031 |
| $a_{TS}^{(1)}$ | −6.141913324 | −0.713377524 |
| $b_{TS}^{(2)}$ | 0.004213585 | 0.004749239 |
| $c_{TS}$ | 0.339772727 | 0.317721519 |
| $a_{TE}^{(4)}$ | 0 | 0 |

TABLE 15-continued

Si(110)
First higher-order mode
$0 < T_{LT} < 0.2$
$0.2 \leq T_S \leq 2.0$

| | | |
|---|---|---|
| $a_{TE}^{(3)}$ | 0 | 0 |
| $a_{TE}^{(2)}$ | −37.82699975 | 0 |
| $a_{TE}^{(1)}$ | 4.315324766 | 3.259148162 |
| $b_{TE}^{(4)}$ | 0 | 0 |
| $b_{TE}^{(3)}$ | 0 | 0 |
| $b_{TE}^{(2)}$ | 0.007147469 | 0 |
| $c_{TE}$ | 0.153409091 | 0.138607595 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000254041 | −0.000266841 |
| $a_{\psi Si}^{(2)}$ | 0.00704637 | 0.003350583 |
| $a_{\psi Si}^{(1)}$ | −0.123432463 | 0.05687546 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −1197.310014 | 2539.305207 |
| $b_{\psi Si}^{(2)}$ | 188.2457386 | 286.0358917 |
| $c_{\psi Si}$ | 28.125 | 63.60759494 |
| $a_{\theta LT}^{(2)}$ | 0 | 0 |
| $a_{\theta LT}^{(1)}$ | 0.046748629 | 0.00460971 |
| $b_{\theta LT}^{(2)}$ | 0 | 0 |
| $c_{\theta LT}$ | −51.59090909 | −50.75949367 |
| $d_{TLTTS}$ | 0 | 0 |
| $d_{TLTTE}$ | 0 | 105.3055279 |
| $d_{TLT\psi Si}$ | 0 | 0 |
| $d_{TLT\theta LT}$ | 0 | 0 |
| $d_{TSTE}$ | 58.63016883 | 0 |
| $d_{TS\psi Si}$ | 0.443510572 | 0.274149566 |
| $d_{TS\theta LT}$ | 0 | 0 |
| $d_{TE\psi Si}$ | 0.293912516 | −0.280924747 |
| $d_{TE\theta LT}$ | 0 | 0.457718571 |
| $d_{\psi Si\theta LT}$ | 0 | −0.005165328 |
| e | −1.722804167 | −2.484892701 |

$0.25 \leq T_E \leq 0.45$

| | $0 \leq \psi_{Si} < 45$ | $45 \leq \psi_{Si} \leq 90$ |
|---|---|---|
| $a_{TLT}^{(2)}$ | 0 | 0 |
| $a_{TLT}^{(1)}$ | −16.74814911 | −16.74814911 |
| $b_{TLT}^{(2)}$ | 0 | 0 |
| $c_{TLT}$ | 0.168032787 | 0.168032787 |
| $a_{TS}^{(2)}$ | 0 | 0 |
| $a_{TS}^{(1)}$ | −9.071522271 | −9.071522271 |
| $b_{TS}^{(2)}$ | 0 | 0 |
| $c_{TS}$ | 0.314754098 | 0.314754098 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −5.270739047 | −5.270739047 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.356557377 | 0.356557377 |
| $a_{\psi Si}^{(6)}$ | −3.73552E−09 | −3.73552E−09 |
| $a_{\psi Si}^{(5)}$ | −4.69013E−08 | −4.69013E−08 |
| $a_{\psi Si}^{(4)}$ | 1.07773E−05 | 1.07773E−05 |
| $a_{\psi Si}^{(3)}$ | 5.64997E−05 | 5.64997E−05 |
| $a_{\psi Si}^{(2)}$ | −0.007526984 | −0.007526984 |
| $a_{\psi Si}^{(1)}$ | −0.035719404 | −0.035719404 |
| $b_{\psi Si}^{(6)}$ | 1801696668 | 1801696668 |
| $b_{\psi Si}^{(5)}$ | 6726299.443 | 6726299.443 |
| $b_{\psi Si}^{(4)}$ | 1035415.498 | 1035415.498 |
| $b_{\psi Si}^{(3)}$ | 3573.665857 | 3573.665857 |
| $b_{\psi Si}^{(2)}$ | 720.1088417 | 720.1088417 |
| $c_{\psi Si}$ | 48.19672131 | 48.19672131 |
| $a_{\theta LT}^{(2)}$ | 0 | 0 |
| $a_{\theta LT}^{(1)}$ | 0 | 0 |
| $b_{\theta LT}^{(2)}$ | 0 | 0 |
| $c_{\theta LT}$ | −90 | −90 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |

TABLE 15-continued

Si(110)
First higher-order mode
$0 < T_{LT} < 0.2$
$0.2 \leq T_S \leq 2.0$

| | | |
|---|---|---|
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.976959016 | −2.976959016; |

TABLE 16

Si(110)
First higher-order mode
$0.2 \leq T_{LT} \leq 3.5$
$0.2 \leq T_S \leq 2.0$ $0.05 \leq T_E < 0.25$

| | $0 \leq \psi_{Si} < 45$ | $45 \leq \psi_{Si} \leq 90$ |
|---|---|---|
| $a_{TLT}^{(2)}$ | 0 | 0 |
| $a_{TLT}^{(1)}$ | −5.239160454 | −5.820942031 |
| $b_{TLT}^{(2)}$ | 0 | 0 |
| $c_{TLT}$ | 0.309375 | 0.302702703 |
| $a_{TS}^{(2)}$ | 24.40391167 | 40.38499201 |
| $a_{TS}^{(1)}$ | −2.128595361 | −6.73354721 |
| $b_{TS}^{(2)}$ | 0.006013184 | 0.005624543 |
| $c_{TS}$ | 0.3265625 | 0.275675676 |
| $a_{TE}^{(4)}$ | 0 | 0 |
| $a_{TE}^{(3)}$ | 0 | 0 |
| $a_{TE}^{(2)}$ | 0 | −51.46488975 |
| $a_{TE}^{(1)}$ | −1.921891837 | −0.509929613 |
| $b_{TE}^{(4)}$ | 0 | 0 |
| $b_{TE}^{(3)}$ | 0 | 0 |
| $b_{TE}^{(2)}$ | 0 | 0.006479182 |
| $c_{TE}$ | 0.153125 | 0.147297297 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | −0.000165117 |
| $a_{\psi Si}^{(2)}$ | 0.000936051 | 0.00475603 |
| $a_{\psi Si}^{(1)}$ | −0.02141106 | 0.040196571 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 2115.829763 |
| $b_{\psi Si}^{(2)}$ | 246.9177246 | 196.5668371 |
| $c_{\psi Si}$ | 24.140625 | 57.97297297 |
| $a_{\theta LT}^{(2)}$ | 0 | 0 |
| $a_{\theta LT}^{(1)}$ | 0.023743346 | 0.023741003 |
| $b_{\theta LT}^{(2)}$ | 0 | 0 |
| $c_{\theta LT}$ | −50.078125 | −48.51351351 |
| $d_{TLTTS}$ | 0 | 0 |
| $d_{TLTTE}$ | −35.16960363 | −48.00382984 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.234382842 | 0 |
| $d_{\psi Si\theta LT}$ | 0 | −0.00130658 |
| e | −2.175330984 | −2.239116787 |

$0.25 \leq T_E \leq 0.45$

| | $0 \leq \psi_{Si} < 45$ | $45 \leq \psi_{Si} \leq 90$ |
|---|---|---|
| $a_{TLT}^{(2)}$ | 0 | 39.48011293 |
| $a_{TLT}^{(1)}$ | −4.867344296 | −2.496300587 |
| $b_{TLT}^{(2)}$ | 0 | 0.00654321 |
| $c_{TLT}$ | 0.286363636 | 0.288888889 |
| $a_{TS}^{(2)}$ | 0 | 40.45660337 |

TABLE 16-continued

Si(110)
First higher-order mode
$0.2 \leq T_{LT} \leq 3.5$
$0.2 \leq T_S \leq 2.0$

| | | |
|---|---|---|
| $a_{TS}^{(1)}$ | −3.626479228 | −6.290401812 |
| $b_{TS}^{(2)}$ | 0 | 0.005617234 |
| $c_{TS}$ | 0.31 | 0.272222222 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.508039016 | −0.870147512 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.341818182 | 0.351388889 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | −9.55404E−05 |
| $a_{\psi Si}^{(2)}$ | 0 | 0.002198207 |
| $a_{\psi Si}^{(1)}$ | −0.017752634 | 0.036260775 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 1531.394676 |
| $b_{\psi Si}^{(2)}$ | 0 | 199.8263889 |
| $c_{\psi Si}$ | 21.13636364 | 60.41666667 |
| $a_{\theta LT}^{(2)}$ | 0 | −0.003220943 |
| $a_{\theta LT}^{(1)}$ | 0.038368027 | 0.005042496 |
| $b_{\theta LT}^{(2)}$ | 0 | 72.22222222 |
| $c_{\theta LT}$ | −50.81818182 | −50 |
| $d_{TLTTS}$ | 0 | −43.45862557 |
| $d_{TLTTE}$ | 23.6423037 | 52.46703277 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | −0.273892853 |
| $d_{\psi Si\theta LT}$ | −0.001221935 | 0 |
| e | −2.271294054 | −2.496300587; |

TABLE 17

Si(110)
Second higher-order mode
$0 < T_{LT} < 0.2$
$0 \leq T_S < 0.2$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −7.587457615 | −7.587457615 |
| $b_{TLT}^{(2)}$ | 0 | 0 |
| $c_{TLT}$ | 0.174380165 | 0.174380165 |
| $a_{TS}^{(2)}$ | 0 | 0 |
| $a_{TS}^{(1)}$ | −3.979714537 | −3.979714537 |
| $b_{TS}^{(2)}$ | 0 | 0 |
| $c_{TS}$ | 0.150413223 | 0.150413223 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −0.865040993 | −0.865040993 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.245867769 | 0.245867769 |
| $a_{\psi Si}^{(6)}$ | 0 | 0 |
| $a_{\psi Si}^{(5)}$ | 0 | 0 |
| $a_{\psi Si}^{(4)}$ | 5.87537E−07 | 5.87537E−07 |
| $a_{\psi Si}^{(3)}$ | −8.59015E−07 | −8.59015E−07 |
| $a_{\psi Si}^{(2)}$ | −0.001948222 | −0.001948222 |
| $a_{\psi Si}^{(1)}$ | −0.027558032 | −0.027558032 |

TABLE 17-continued

Si(110)
Second higher-order mode
$0 < T_{LT} < 0.2$
$0 \leq T_S < 0.2$

| | | |
|---|---|---|
| $b_{\psi Si}^{(6)}$ | 0 | 0 |
| $b_{\psi Si}^{(5)}$ | 0 | 0 |
| $b_{\psi Si}^{(4)}$ | 1129197.497 | 1129197.497 |
| $b_{\psi Si}^{(3)}$ | −1524.372996 | −1524.372996 |
| $b_{\psi Si}^{(2)}$ | 776.3813947 | 776.3813947 |
| $c_{\psi Si}$ | 41.52892562 | 41.52892562 |
| $a_{\theta LT}^{(2)}$ | 0 | 0 |
| $a_{\theta LT}^{(1)}$ | 0.018744549 | 0.018744549 |
| $b_{\theta LT}^{(2)}$ | 0 | 0 |
| $c_{\theta LT}$ | −49.25619835 | −49.25619835 |
| $d_{TLTTS}$ | 140.6234074 | 140.6234074 |
| $d_{TLTTE}$ | −25.20654793 | −25.20654793 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −1.789519626 | −1.789519626 |

| | $0.25 \leq T_E \leq 0.45$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −7.587457615 | −7.587457615 |
| $b_{TLT}^{(2)}$ | 0 | 0 |
| $c_{TLT}$ | 0.174380165 | 0.174380165 |
| $a_{TS}^{(2)}$ | 0 | 0 |
| $a_{TS}^{(1)}$ | −3.979714537 | −3.979714537 |
| $b_{TS}^{(2)}$ | 0 | 0 |
| $c_{TS}$ | 0.150413223 | 0.150413223 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −0.865040993 | −0.865040993 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.245867769 | 0.245867769 |
| $a_{\psi Si}^{(6)}$ | 0 | 0 |
| $a_{\psi Si}^{(5)}$ | 0 | 0 |
| $a_{\psi Si}^{(4)}$ | 5.87537E−07 | 5.87537E−07 |
| $a_{\psi Si}^{(3)}$ | −8.59015E−07 | −8.59015E−07 |
| $a_{\psi Si}^{(2)}$ | −0.001948222 | −0.001948222 |
| $a_{\psi Si}^{(1)}$ | −0.027558032 | −0.027558032 |
| $b_{\psi Si}^{(6)}$ | 0 | 0 |
| $b_{\psi Si}^{(5)}$ | 0 | 0 |
| $b_{\psi Si}^{(4)}$ | 1129197.497 | 1129197.497 |
| $b_{\psi Si}^{(3)}$ | −1524.372996 | −1524.372996 |
| $b_{\psi Si}^{(2)}$ | 776.3813947 | 776.3813947 |
| $c_{\psi Si}$ | 41.52892562 | 41.52892562 |
| $a_{\theta LT}^{(2)}$ | 0 | 0 |
| $a_{\theta LT}^{(1)}$ | 0.018744549 | 0.018744549 |
| $b_{\theta LT}^{(2)}$ | 0 | 0 |
| $c_{\theta LT}$ | −49.25619835 | −49.25619835 |
| $d_{TLTTS}$ | 140.6234074 | 140.6234074 |
| $d_{TLTTE}$ | −25.20654793 | −25.20654793 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −1.789519626 | −1.789519626; |

TABLE 18

Si(110)
Second higher-order mode
$0.2 \leq T_{LT} \leq 3.5$
$0 \leq T_S < 0.2$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −3.912934705 | −3.912934705 |
| $b_{TLT}^{(2)}$ | 0 | 0 |
| $c_{TLT}$ | 0.306451613 | 0.306451613 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 1.912614784 | 1.91264784 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148924731 | 0.148924731 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.0004718 | −0.0004718 |
| $a_{\psi Si}^{(1)}$ | 0.003265633 | 0.003265633 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 847.4765869 | 847.4765869 |
| $c_{\psi Si}$ | 35.32258065 | 36.32258065 |
| $a_{\theta LT}^{(2)}$ | 0.005014741 | 0.005014741 |
| $a_{\theta LT}^{(1)}$ | 0.023115164 | 0.023115164 |
| $b_{\theta LT}^{(2)}$ | 67.0626662 | 67.0626662 |
| $c_{\theta LT}$ | −49.62365591 | −49.62365591 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.563162206 | 0.563162206 |
| $d_{\psi Si\theta LT}$ | 0 | 0 |
| e | −2.002512986 | −2.002512986 |
| | $0.25 \leq T_E \leq 0.45$ | |
| | $0 \leq \psi_{Si} < 45$ | $45 \leq \psi_{Si} \leq 90$ |
| $a_{TLT}^{(2)}$ | 39.68139696 | 39.68139696 |
| $a_{TLT}^{(1)}$ | −3.801935963 | −3.801935963 |
| $b_{TLT}^{(2)}$ | 0.00692398 | 0.00692398 |
| $c_{TLT}$ | 0.297857143 | 0.297857143 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −6.089810932 | −6.089810932 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.347857143 | 0.347857143 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 8.78847E−06 | 8.78847E−06 |
| $a_{\psi Si}^{(2)}$ | −0.000160567 | −0.000160567 |
| $a_{\psi Si}^{(1)}$ | −0.023574651 | −0.023574651 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 2351.597668 | 2351.597668 |
| $b_{\psi Si}^{(2)}$ | 880.2091837 | 880.2091837 |
| $c_{\psi Si}$ | 43.07142857 | 43.07142857 |
| $a_{\theta LT}^{(2)}$ | 0 | 0 |
| $a_{\theta LT}^{(1)}$ | 0.030121011 | 0.030121011 |
| $b_{\theta LT}^{(2)}$ | 0 | 0 |
| $c_{\theta LT}$ | −51.28571429 | −51.28571429 |
| $d_{TLTTS}$ | 0 | 0 |
| $d_{TLTTE}$ | 0 | 0 |
| $d_{TLT\psi Si}$ | 0.125572529 | 0.125572529 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | −0.417002414 | −0.417002414 |
| $d_{\psi Si\theta LT}$ | 0 | 0 |
| e | −2.550158637 | −2.550158637; |

TABLE 19

Si(110)
Second higher-order mode
$0 < T_{LT} < 0.2$
$0.2 \leq T_S \leq 2.0$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | 2.992014692 | 2.992014692 |
| $b_{TLT}^{(2)}$ | 0 | 0 |
| $c_{TLT}$ | 0.156390977 | 0.156390977 |
| $a_{TS}^{(2)}$ | 0 | 0 |
| $a_{TS}^{(1)}$ | −9.089925228 | −9.089925228 |
| $b_{TS}^{(2)}$ | 0 | 0 |
| $c_{TS}$ | 0.305263158 | 0.305263158 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 5.773590917 | 5.773590917 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.166541353 | 0.166541353 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.000377109 | −0.000377109 |
| $a_{\psi Si}^{(1)}$ | −0.013702515 | −0.013702515 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 792.2381141 | 792.2381141 |
| $c_{\psi Si}$ | 41.39097744 | 41.39097744 |
| $a_{\theta LT}^{(2)}$ | 0 | 0 |
| $a_{\theta LT}^{(1)}$ | 0.015804666 | 0.015804666 |
| $b_{\theta LT}^{(2)}$ | 0 | 0 |
| $c_{\theta LT}$ | −49.32330827 | −49.32330827 |
| $d_{TLTTS}$ | 0 | 0 |
| $d_{TLTTE}$ | 80.90186655 | 80.90186655 |
| $d_{TLT\psi Si}$ | 0 | 0 |
| $d_{TLT\theta LT}$ | 0 | 0 |
| $d_{TSTE}$ | 29.68261053 | 29.68261053 |
| $d_{TS\psi Si}$ | 0.136750854 | 0.136750854 |
| $d_{TS\theta LT}$ | 0 | 0 |
| $d_{TE\psi Si}$ | −0.146211814 | −0.146211814 |

TABLE 19-continued

Si(110)
Second higher-order mode
$0 < T_{LT} < 0.2$
$0.2 \leq T_S \leq 2.0$

| | 0.25 ≤ $T_E$ ≤ 0.45 | |
|---|---|---|
| | $0 \leq \psi_{Si} < 45$ | $45 \leq \psi_{Si} \leq 90$ |
| $d_{TE\theta LT}$ | 0.41229257 | 0.41229257 |
| $d_{\psi Si\theta LT}$ | 0 | 0 |
| e | −2.596813807 | −2.596813807 |

| | 0.25 ≤ $T_E$ ≤ 0.45 | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −1.461725087 | −1.461725087 |
| $b_{TLT}^{(2)}$ | 0 | 0 |
| $c_{TLT}$ | 0.155345912 | 0.155345912 |
| $a_{TS}^{(2)}$ | 0 | 0 |
| $a_{TS}^{(1)}$ | −1.247751383 | −1.247751383 |
| $b_{TS}^{(2)}$ | 0 | 0 |
| $c_{TS}$ | 0.327672956 | 0.327672956 |
| $a_{TE}^{(4)}$ | 0 | 0 |
| $a_{TE}^{(3)}$ | 0 | 0 |
| $a_{TE}^{(2)}$ | −130.6388144 | −130.6388144 |
| $a_{TE}^{(1)}$ | −0.010504162 | −0.010504162 |
| $b_{TE}^{(4)}$ | 0 | 0 |
| $b_{TE}^{(3)}$ | 0 | 0 |
| $b_{TE}^{(2)}$ | 0.006662711 | 0.006662711 |
| $c_{TE}$ | 0.341823899 | 0.341823899 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 1.03604E−05 | 1.03604E−05 |
| $a_{\psi Si}^{(2)}$ | −0.000138558 | −0.000138558 |
| $a_{\psi Si}^{(1)}$ | −0.028102653 | −0.028102653 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 3096.349671 | 3096.349671 |
| $b_{\psi Si}^{(2)}$ | 957.6361695 | 957.6361695 |
| $c_{\psi Si}$ | 43.20754717 | 43.20754717 |
| $a_{\theta LT}^{(2)}$ | 0 | 0 |
| $a_{\theta LT}^{(1)}$ | 0.028892246 | 0.028892246 |
| $b_{\theta LT}^{(2)}$ | 0 | 0 |
| $c_{\theta LT}$ | −49.62264151 | −49.62264151 |
| $d_{TLTTS}$ | −44.5976835 | −44.5976835 |
| $d_{TLTTE}$ | −150.2428298 | −150.2428298 |
| $d_{TLT\psi Si}$ | 0.225109644 | 0.225109644 |
| $d_{TLT\theta LT}$ | 0 | 0 |
| $d_{TSTE}$ | 47.35851038 | 47.35851038 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.049341112 | −2.049341112; |

TABLE 20

Si(110)
Second higher-order mode
$0.2 \leq T_{LT} \leq 3.5$
$0.2 \leq T_S \leq 2.0$

| | 0.05 ≤ $T_E$ < 0.25 | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −2.80791074 | −2.80791074 |
| $b_{TLT}^{(2)}$ | 0 | 0 |
| $c_{TLT}$ | 0.3069869 | 0.3069869 |
| $a_{TS}^{(2)}$ | 0 | 0 |
| $a_{TS}^{(1)}$ | −5.618098986 | −5.618098986 |
| $b_{TS}^{(2)}$ | 0 | 0 |
| $c_{TS}$ | 0.286462882 | 0.286462882 |
| $a_{TE}^{(4)}$ | 0 | 0 |

TABLE 20-continued

Si(110)
Second higher-order mode
$0.2 \leq T_{LT} \leq 3.5$
$0.2 \leq T_S \leq 2.0$

| | $0 \leq \psi_{Si} < 45$ | $45 \leq \psi_{Si} \leq 90$ |
|---|---|---|
| $a_{TE}^{(3)}$ | 0 | 0 |
| $a_{TE}^{(2)}$ | 0 | 0 |
| $a_{TE}^{(1)}$ | 8.962154821 | 8.962154821 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.167467249 | 0.167467249 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.003677309 | 0.003677309 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 40.93886463 | 40.93886463 |
| $a_{\theta LT}^{(2)}$ | 0.00527863 | 0.00527863 |
| $a_{\theta LT}^{(1)}$ | 0.008431458 | 0.008431458 |
| $b_{\theta LT}^{(2)}$ | 66.00179249 | 66.00179249 |
| $c_{\theta LT}$ | −50.61135371 | −50.61135371 |
| $d_{TLTTS}$ | 63.6265441 | 63.6265441 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 57.20229582 | 57.20229582 |
| $d_{TS\psi Si}$ | 0 | 0 |
| $d_{TS\theta LT}$ | 0 | 0 |
| $d_{TE\psi Si}$ | −0.098212695 | −0.098212695 |
| $d_{TE\theta LT}$ | 0.32576925 | 0.32576925 |
| $d_{\psi Si\theta LT}$ | 0 | 0 |
| e | −2.431352404 | −2.431352404 |

| | 0.25 ≤ $T_E$ ≤ 0.45 | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | 0 | 0 |
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | −73.23839461 | −73.23839461 |
| $a_{TE}^{(1)}$ | −5.710295136 | −5.710295136 |
| $b_{TE}^{(4)}$ | 0 | 0 |
| $b_{TE}^{(3)}$ | 0 | 0 |
| $b_{TE}^{(2)}$ | 0.007310763 | 0.007310763 |
| $c_{TE}$ | 0.330930233 | 0.330930233 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0 | 0 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 0 | 0 |
| $a_{\theta LT}^{(2)}$ | 0 | 0 |
| $a_{\theta LT}^{(1)}$ | 0 | 0 |
| $b_{\theta LT}^{(2)}$ | 0 | 0 |
| $c_{\theta LT}$ | −90 | −90 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |

TABLE 20-continued

Si(110)
Second higher-order mode
$0.2 \leq T_{LT} \leq 3.5$
$0.2 \leq T_S \leq 2.0$

| | | |
|---|---|---|
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.39032093 | −2.39032093; |

TABLE 21

Si(110)
Third higher-order mode
$0 < T_{LT} < 0.2$
$0 \leq T_S < 0.2$

| | $0.05 \leq T_E < 0.25$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −11.04825287 | −11.04825287 |
| $b_{TLT}^{(2)}$ | 0 | 0 |
| $c_{TLT}$ | 0.164705882 | 0.164705882 |
| $a_{TS}^{(2)}$ | 0 | 0 |
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | −12.86806521 | −12.86806521 |
| $a_{TE}^{(1)}$ | 39.88235294 | 39.88235294 |
| $b_{TE}^{(4)}$ | 0 | 0 |
| $b_{TE}^{(3)}$ | 0 | 0 |
| $b_{TE}^{(2)}$ | 0.019258131 | 0.019258131 |
| $c_{TE}$ | 0.286470588 | 0.286470588 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.000762445 | −0.000762445 |
| $a_{\psi Si}^{(1)}$ | −0.031584918 | −0.031584918 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 749.7716263 | 749.7716263 |
| $c_{\psi Si}$ | 52.58823529 | 52.58823529 |
| $a_{\theta LT}^{(2)}$ | −0.004115091 | −0.004115091 |
| $a_{\theta LT}^{(1)}$ | 0.023260981 | 0.023260981 |
| $b_{\theta LT}^{(2)}$ | 81.16262976 | 81.16262976 |
| $c_{\theta LT}$ | −50.11764706 | −50.11764706 |
| $d_{TLTTS}$ | 0 | 0 |
| $d_{TLTTE}$ | −32.35244505 | −32.35244505 |
| $d_{TLT\psi Si}$ | 0.348515389 | 0.348515389 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.000823202 | 0.000823202 |
| e | −1.678155024 | −1.678155024 |

| | $0.25 \leq T_E \leq 0.45$ | |
|---|---|---|
| | $0 \leq \psi_{Si} < 45$ | $45 \leq \psi_{Si} \leq 90$ |
| $a_{TLT}^{(2)}$ | 0 | 0 |
| $a_{TLT}^{(1)}$ | −11.04825287 | −11.04825287 |
| $b_{TLT}^{(2)}$ | 0 | 0 |
| $c_{TLT}$ | 0.164705882 | 0.164705882 |
| $a_{TS}^{(2)}$ | 0 | 0 |

TABLE 21-continued

Si(110)
Third higher-order mode
$0 < T_{LT} < 0.2$
$0 \leq T_S < 0.2$

| | | |
|---|---|---|
| $a_{TS}^{(1)}$ | 0 | 0 |
| $b_{TS}^{(2)}$ | 0 | 0 |
| $c_{TS}$ | 0 | 0 |
| $a_{TE}^{(4)}$ | 0 | 0 |
| $a_{TE}^{(3)}$ | 0 | 0 |
| $a_{TE}^{(2)}$ | −12.86806521 | −12.86806521 |
| $a_{TE}^{(1)}$ | 39.88235294 | 39.88235294 |
| $b_{TE}^{(4)}$ | 0 | 0 |
| $b_{TE}^{(3)}$ | 0 | 0 |
| $b_{TE}^{(2)}$ | 0.019258131 | 0.019258131 |
| $c_{TE}$ | 0.286470588 | 0.286470588 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.000762445 | −0.000762445 |
| $a_{\psi Si}^{(1)}$ | −0.031584918 | −0.031584918 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 749.7716263 | 749.7716263 |
| $c_{\psi Si}$ | 52.58823529 | 52.58823529 |
| $a_{\theta LT}^{(2)}$ | −0.004115091 | −0.004115091 |
| $a_{\theta LT}^{(1)}$ | 0.023260981 | 0.023260981 |
| $b_{\theta LT}^{(2)}$ | 81.16262976 | 81.16262976 |
| $c_{\theta LT}$ | −50.11764706 | −50.11764706 |
| $d_{TLTTS}$ | 0 | 0 |
| $d_{TLTTE}$ | −32.35244505 | −32.35244505 |
| $d_{TLT\psi Si}$ | 0.348515389 | 0.348515389 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.000823202 | 0.000823202 |
| e | −1.678155024 | −1.678155024; |

TABLE 22

Si(110)
Third higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |

TABLE 22-continued

Si(110)
Third higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $d_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |
| $d_{TS\theta LT}$ | 0 | 0 | 0 | 0 |
| $d_{TE\psi Si}$ | 0.081014811 | 0.081014811 | −0.194432704 | −0.194432704 |
| $d_{TE\theta LT}$ | 0 | 0 | 0 | 0 |
| $d_{\psi Si\theta LT}$ | 0 | 0 | 0.000875955 | 0.000875955 |
| e | −2.543790382 | −2.543790382 | −2.964933907 | −2.964933907; |

TABLE 23

Si(110)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | −54.97015257 | −54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |

TABLE 23-continued

Si(110)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015; |

TABLE 24

Si(110)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.140898252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.413434 | −1267.413434 | 1811.750092 | 0 |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $d_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| e | −2.390757235 | −2.390757235 | −2.548464154 | −2.523994879; |

TABLE 25

Si(111)
First higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.833915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $d_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |
| $d_{TE\psi Si}$ | −0.613440559 | 0 | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.553295028 | −1.074792989 | −1.290770348 | −1.165057152; |

TABLE 26

Si(111)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | −24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |

TABLE 26-continued

Si(111)
First higher-order mode
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.021125116 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1636802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 0 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $d_{TLT\theta LT}$ | −0.785540829 | −0.785540829 | 0 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468; |

TABLE 27

Si(111)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | 5.38083251 | −11.91949736 |
| $b_{TS}^{(2)}$ | 0.00446166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33125 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 27-continued

Si(111)
First higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | −161.2345526 | 0 |
| $d_{TLT\psi Si}$ | −0.827435588 | 0 | 0 | 1.107475984 |
| $d_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084; |

TABLE 28

Si(111)
First higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |
| $a_{\theta LT}^{(1)}$ | −0.017420386 | −0.012240534 | 0 | 0 |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |

TABLE 28-continued

Si(111)
First higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132; |

TABLE 29

Si(111)
Second higher-order mode
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | −10.04988717 | 5.027045348 | −5.686378626 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | −0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 125.0280404 | 0 |
| $c_{\psi Si}$ | 9.683544304 | 50 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.451355926 | 0 |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691; |

TABLE 30

Si(111)
Second higher-order mode
$0.2 \leq T_{LT} \leq 3.5$
$0 \leq T_S < 0.2$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 45.51074293 | −94.44342524 | 0 |
| $a_{TLT}^{(1)}$ | 0.788515454 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 9.791468713 | 0.170587985 | −0.71523762 | −10.72534968 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |
| $d_{TE\psi Si}$ | 0 | 0.20688896 | 0 | 0 |
| $d_{TE\theta LT}$ | 0.774150432 | 0.439880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612; |

TABLE 31

Si(111)
Second higher-order mode
$0 < T_{LT} < 0.2$
$0.2 \leq T_S \leq 2.0$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |

TABLE 31-continued

Si(111)
Second higher-order mode
$0 < T_{LT} < 0.2$
$0.2 \leq T_S \leq 2.0$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 0 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.41666667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| e | −2.770026639 | −2.638591885 | −1.980941925 | −2.412296494; |

TABLE 32

Si(111)
Second higher-order mode
$0.2 \leq T_{LT} \leq 3.5$
$0.2 \leq T_S \leq 2.0$

|  | $0.05 \leq T_E < 0.25$ | | $0.25 \leq T_E \leq 0.45$ | |
|---|---|---|---|---|
|  | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 86.18383552 | 0 |
| $a_{TE}^{(1)}$ | 3.853394073 | 8.768511808 | −1.867550529 | −15.68616064 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |

TABLE 32-continued

Si(111)
Second higher-order mode
$0.2 \le T_{LT} \le 3.5$
$0.2 \le T_S \le 2.0$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |
| $b_{\theta LT}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | 0 |
| $d_{TLT\theta LT}$ | 0 | 0 | 0 | −0.608943868 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | 0 |
| $d_{\psi Si\theta LT}$ | 0 | 0 | 0 | 0 |
| e | −2.401219798 | −3.18651044 | −3.93030224 | −4.143483981; |

TABLE 33

Si(111)
Third higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |
| $b_{TLT}^{(2)}$ | 0 | 0 | 0 | 0 |
| $c_{TLT}$ | 0.160869565 | 0.160869565 | 0.160869665 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |

TABLE 33-continued

Si(111)
Third higher-order mode
$0 < T_{LT} < 0.2$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| e | −0.277577227 | −0.277577227 | −0.277577227 | −0.277577227; |

TABLE 34

Si(111)
Third higher-order mode
$0.2 \le T_{LT} \le 3.5$
$0 \le T_S < 0.2$

| | $0.05 \le T_E < 0.25$ | | $0.25 \le T_E \le 0.45$ | |
|---|---|---|---|---|
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | −215.3850281 | −215.3850281 | −215.3850281 | −215.3850281 |
| $a_{TE}^{(3)}$ | 54.12265846 | 54.12265846 | 54.12265846 | 54.12265846 |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 45.80413521 | 45.80413521 | 45.80413521 | 45.80413521 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| e | −0.446604617 | −0.446604617 | −0.446604617 | −0.446604617; |

TABLE 35

Si(111)
Third higher-order mode
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.024454063 | 0.024454063 | 0.024454063 | 0.024454063 |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |

TABLE 36

Si(111)
Third higher-order mode
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |
| $b_{\theta LT}^{(2)}$ | 0 | 0 | 0 | 0 |
| $c_{\theta LT}$ | −48.52941176 | −48.52941176 | −48.52941176 | −48.52941176 |
| $d_{TLTTS}$ | −0.04933649 | −0.04933649 | −0.04933649 | −0.04933649 |
| $d_{TLTTE}$ | −0.021023839 | −0.021023839 | −0.021023839 | −0.021023839 |
| $d_{TLT\psi Si}$ | 0 | 0 | 0 | 0 |
| $d_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485. |

2. The acoustic wave device according to claim 1, wherein $I_h$ for each of the first and second higher-order modes is more than about −2.4.

3. The acoustic wave device according to claim 1, wherein $I_h$ for each of the first and third higher-order modes is more than about −2.4.

4. The acoustic wave device according to claim 1, wherein $I_h$ for each of the second and third higher-order modes is more than about −2.4.

5. The acoustic wave device according to claim 1, wherein $I_h$ for each of the first, second, and third higher-order modes is more than about −2.4.

6. The acoustic wave device according to claim 1, wherein the piezoelectric body has a thickness of about 3.5λ or less.

7. The acoustic wave device according to claim 6, wherein the piezoelectric body has a thickness of about 2.5λ or less.

8. The acoustic wave device according to claim 6, wherein the piezoelectric body has a thickness of about 1.5λ or less.

9. The acoustic wave device according to claim 6, wherein the piezoelectric body has a thickness of about 0.5λ or less.

10. The acoustic wave device according to claim 1, wherein the acoustic wave device is an acoustic wave resonator.

11. An acoustic wave filter, comprising:
a plurality of resonators; wherein
at least one of the plurality of resonators is defined by the acoustic wave device according to claim 1.

12. The acoustic wave filter according to claim 11, wherein $I_h$ for each of the first and second higher-order modes is more than about −2.4.

13. The acoustic wave filter according to claim 11, wherein $I_h$ for each of the first and third higher-order modes is more than about −2.4.

14. The acoustic wave filter according to claim 11, wherein $I_h$ for each of the second and third higher-order modes is more than about −2.4.

15. The acoustic wave filter according to claim 11, wherein $I_h$ for each of the first, second, and third higher-order modes is more than about −2.4.

16. The acoustic wave filter according to claim 11, wherein the piezoelectric body has a thickness of about 3.5λ or less.

17. A multiplexer, comprising:
N acoustic wave filters, where N is 2 or more, having different pass bands; wherein
one terminal of each of the N acoustic wave filters is commonly connected on an antenna terminal side;
at least one acoustic wave filter among the N acoustic wave filters excluding an acoustic wave filter having a highest-frequency pass band includes a plurality of acoustic wave resonators; and
at least one acoustic wave resonator among the plurality of acoustic wave resonators is defined by the acoustic wave device according to claim 1.

18. The multiplexer according to claim 17, wherein the multiplexer is a composite filter device for carrier aggregation.

19. A high-frequency front-end circuit, comprising:
an acoustic wave filter including the acoustic wave device according to claim 1; and
a power amplifier connected to the acoustic wave filter.

20. A communication apparatus, comprising:
a high-frequency front-end circuit including an acoustic wave filter that includes the acoustic wave device according to claim 1, and a power amplifier connected to the acoustic wave filter; and
an RF signal processing circuit.

* * * * *